United States Patent [19]
Wong et al.

[11] Patent Number: 5,537,631
[45] Date of Patent: Jul. 16, 1996

[54] MEMORY MANAGEMENT TECHNIQUE FOR DEFECTIVE MEMORY

[75] Inventors: John J. Wong, Atherton; Rick Culver, San Jose, both of Calif.

[73] Assignee: Current Logic Systems, Inc., San Jose, Calif.

[21] Appl. No.: 215,278

[22] Filed: Mar. 21, 1994

[51] Int. Cl.$^6$ ................................................. G11C 29/00
[52] U.S. Cl. ........................ 395/182.05; 395/183.18; 365/201
[58] Field of Search ....................... 395/180, 181, 395/182.03, 182.04, 183.01, 183.18, 182.05, 182.06; 371/36, 21.1, 21.2

[56] References Cited

U.S. PATENT DOCUMENTS

| | | | |
|---|---|---|---|
| 4,479,214 | 10/1984 | Ryan | 365/200 |
| 5,077,737 | 12/1991 | Leger et al. | 321/21.6 |
| 5,299,202 | 3/1994 | Vaillancourt | 371/21.6 |
| 5,355,345 | 10/1994 | Dickinson et al. | 365/230.01 |
| 5,406,565 | 4/1995 | MacDonald | 371/8.1 |
| 5,430,734 | 7/1995 | Gilson | 395/800 |

*Primary Examiner*—Hoa T. Nguyen
*Assistant Examiner*—Albert Decady
*Attorney, Agent, or Firm*—Majestic, Parsons, Siebert & Hsue

[57] ABSTRACT

A memory management technique is provided for managing the storage and retrieval of data within an ARAM memory array such that both fault tolerant data and fault non-tolerant data can be stored within the ARAM array without such data becoming corrupted due to the faulty bits within the ARAM memory. The memory management technique of the present invention also includes a method for creating a novel facsimile header format which makes it less likely for the header information to be corrupted due to faulty memory cells within the ARAM memory array.

27 Claims, 56 Drawing Sheets step 1a: Write diagonal of 1's in first 1M of ARAM Lo Bank (all 8 bit positions)

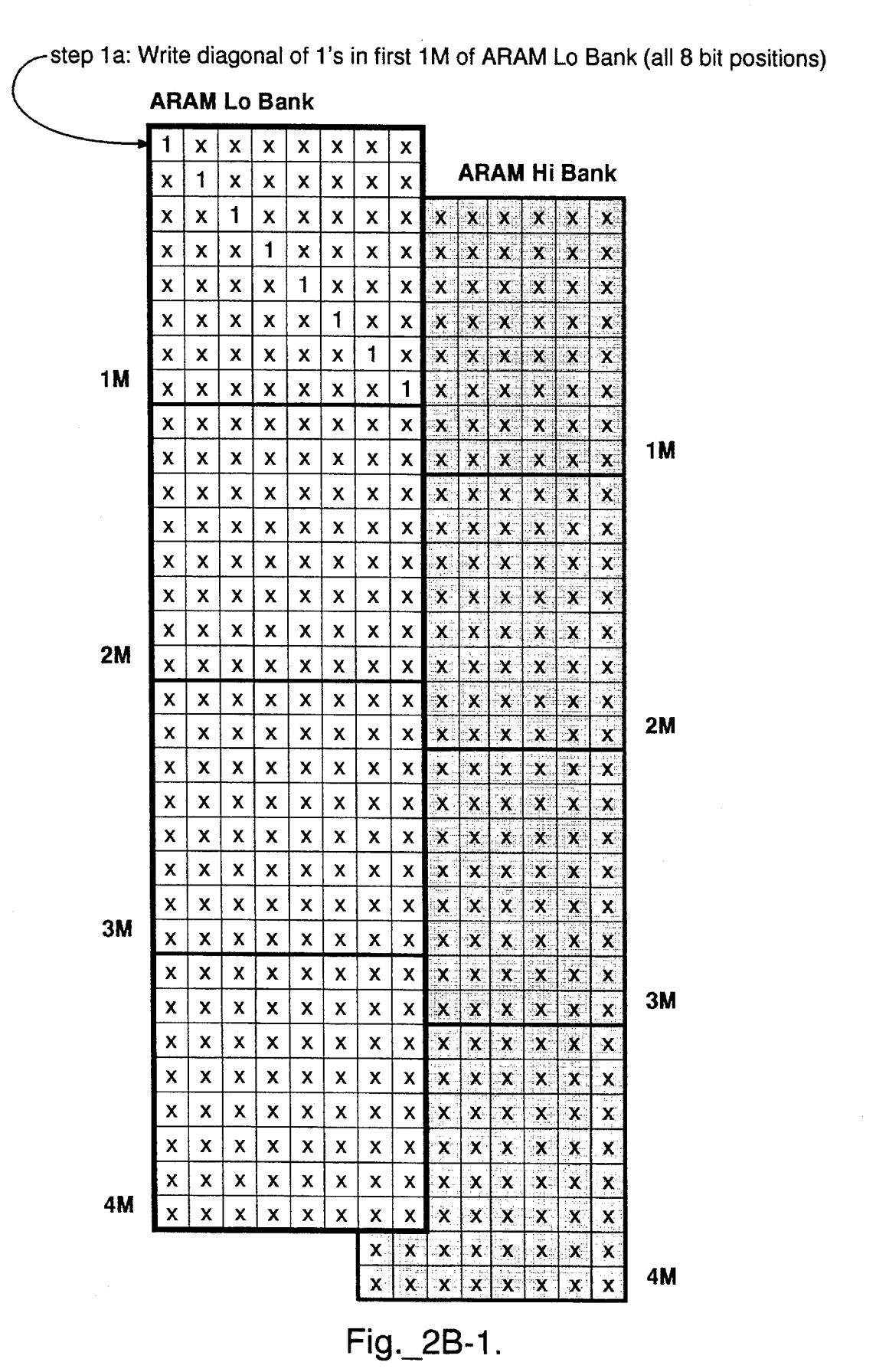

Fig. _2B-1.

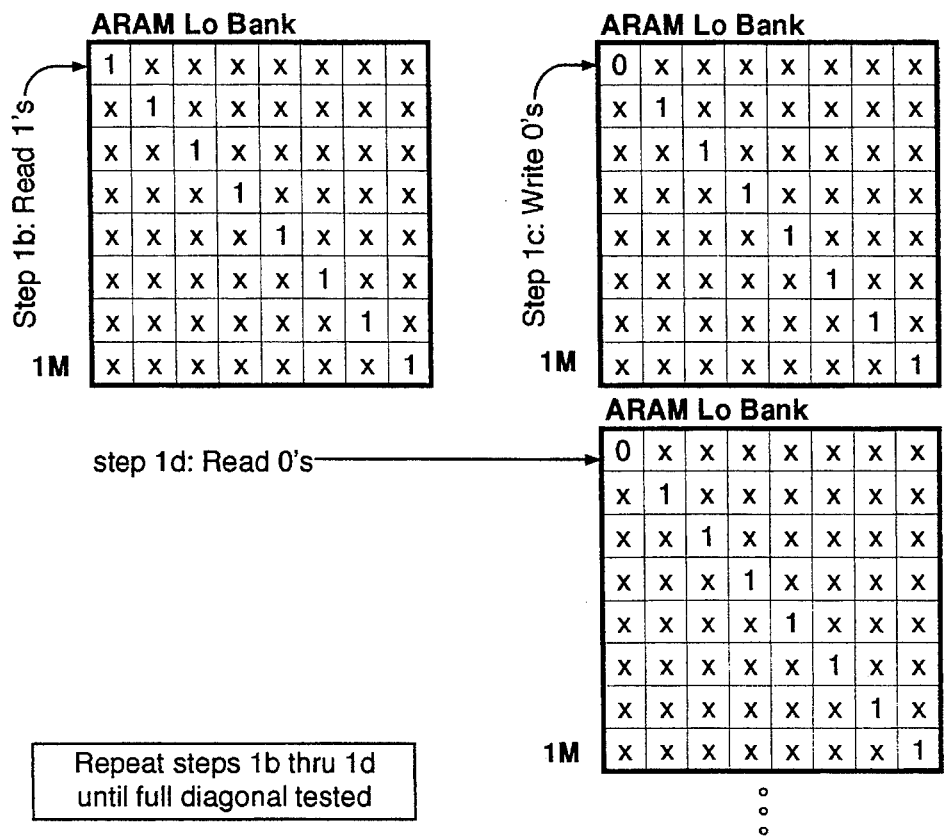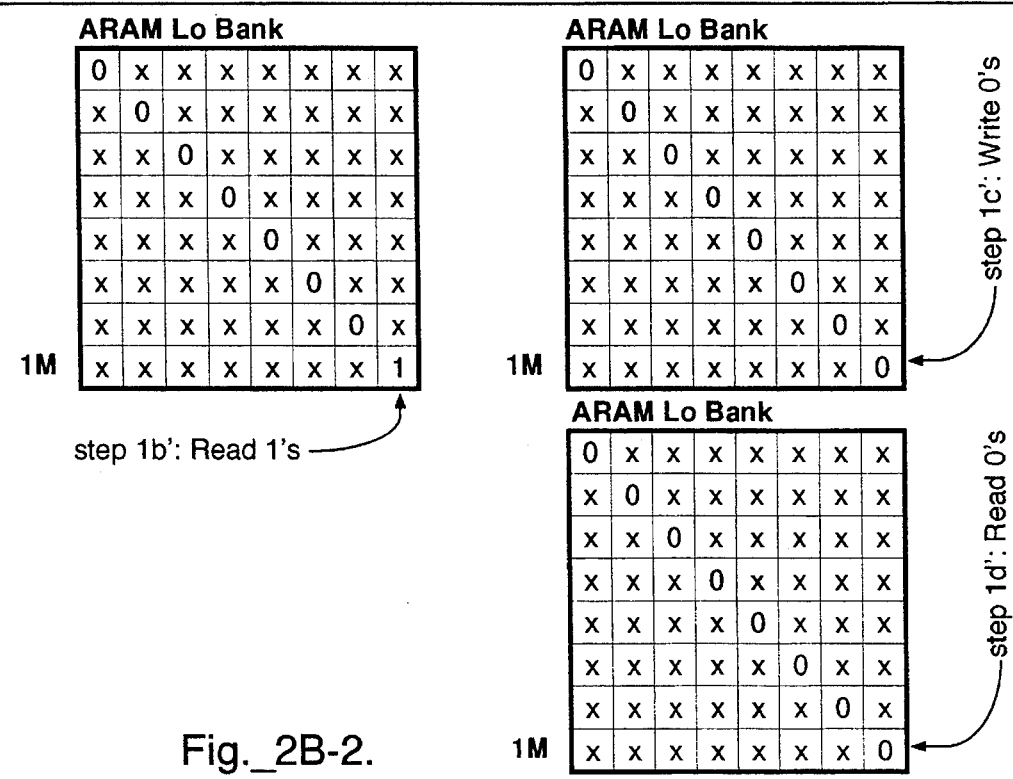
Fig._2B-2.

step 2a: Write diagonal of 0's in first 1M of ARAM Hi Bank (only to lower 4 bit positions)

step 4a: Write diagonal of 0's to 4M of ARAM Lo Bank (lower 4 bits only)

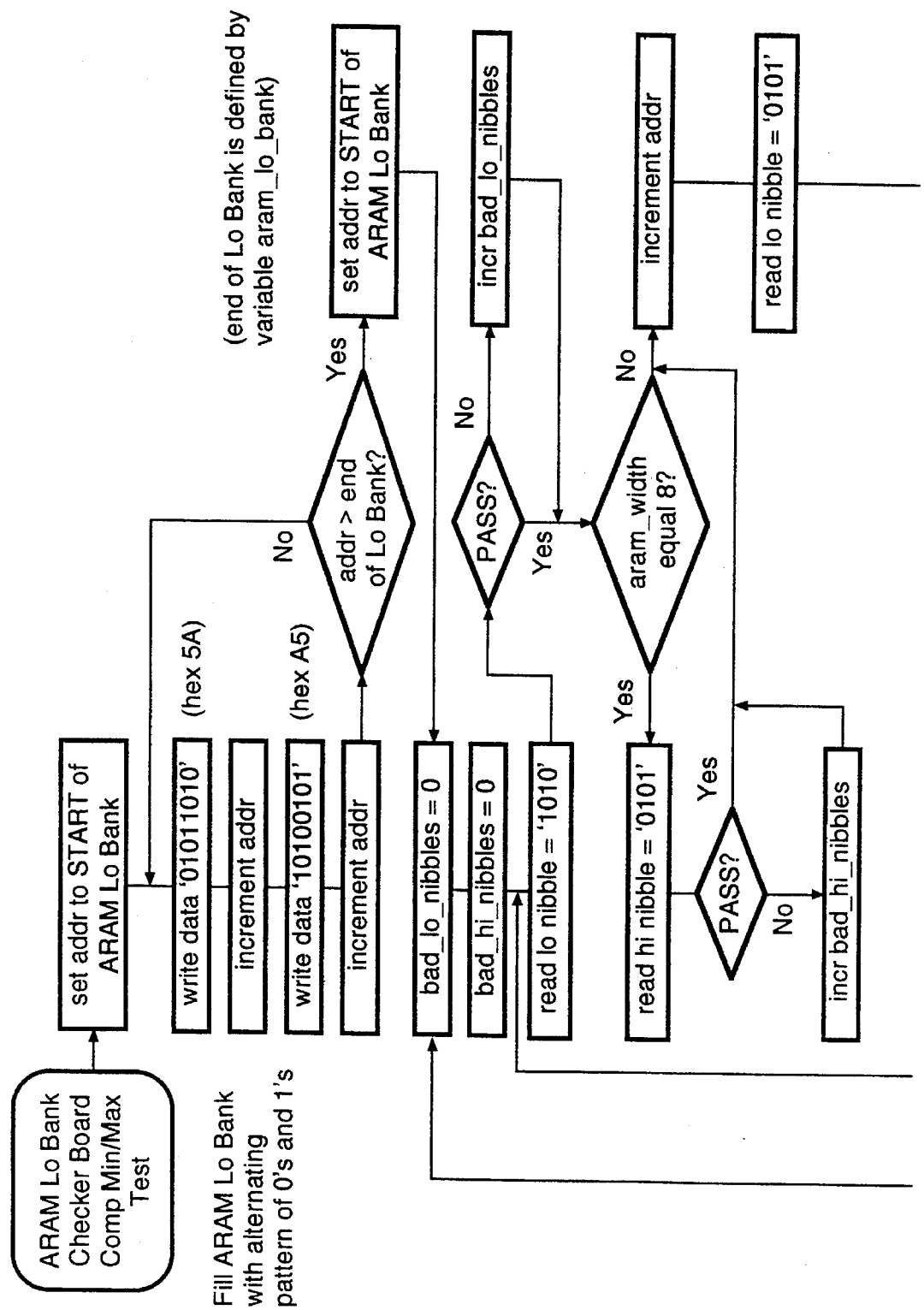
Fig. _7A-1.

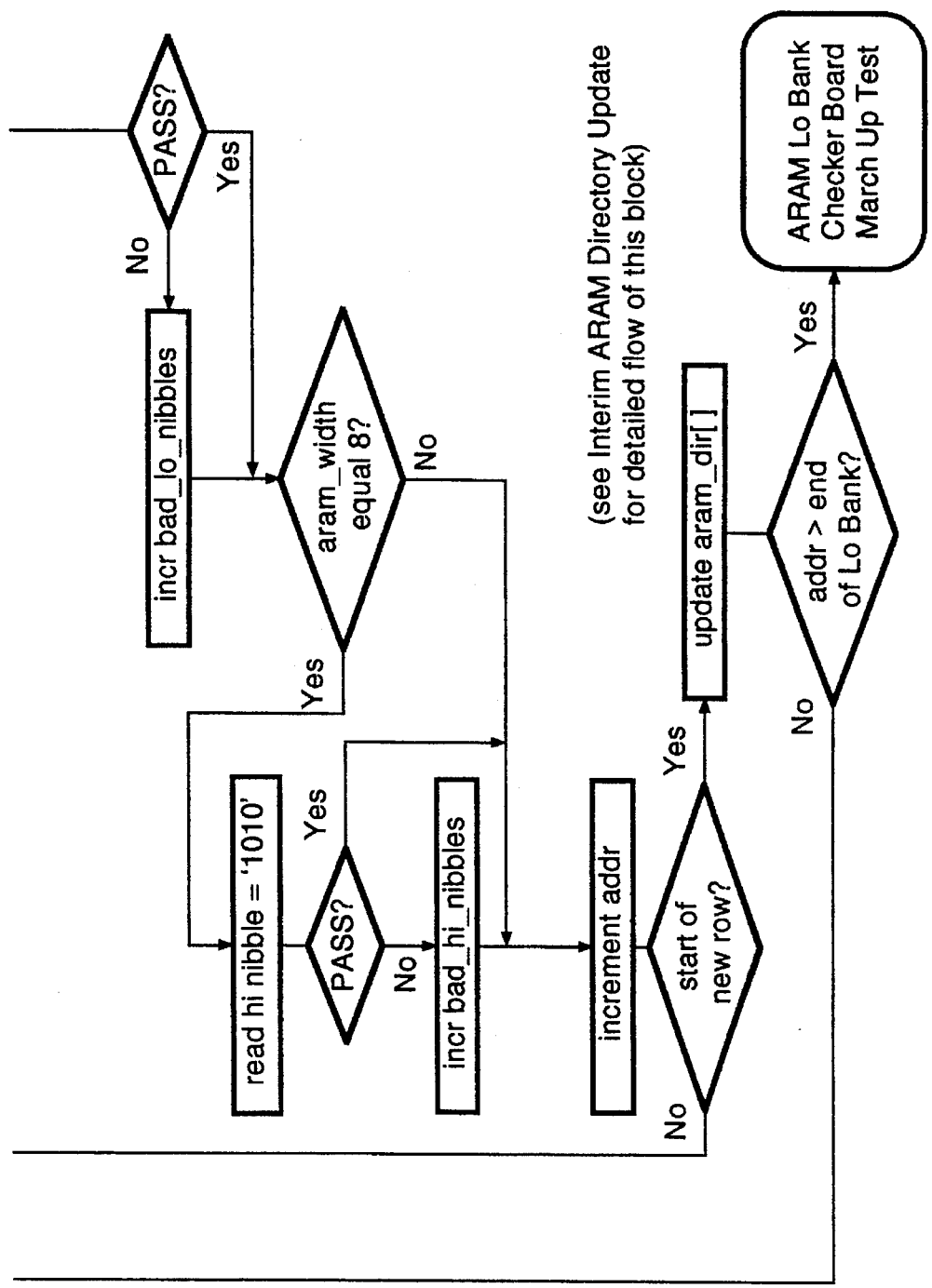
Fig. _7A-2.

step 6a: Write checker board complement

Fig. 7B-1.

step 7a: Write checker board pattern to ARAM Lo Bank

ARAM Lo Bank

| | | | | | | | |
|---|---|---|---|---|---|---|---|
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |

1M (at row 8), 2M (at row 16), 3M (at row 24), 4M (at row 32)

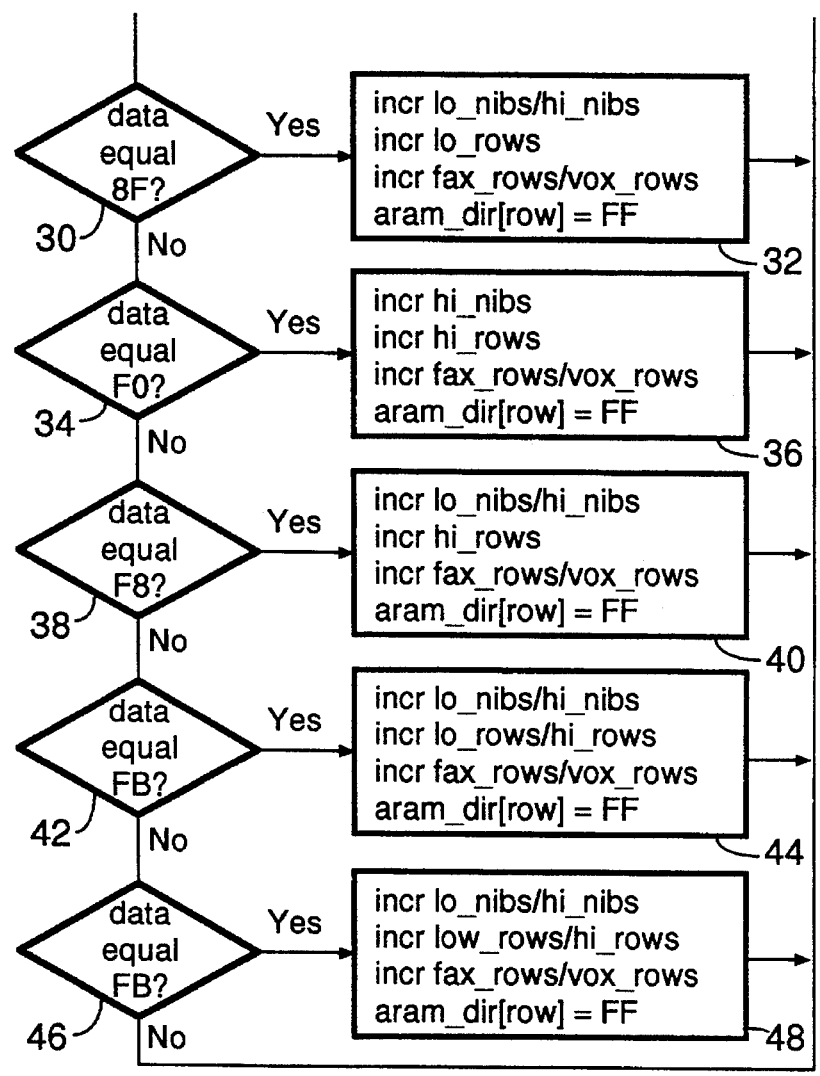

Legend:
aram_dir[ ] = 8192x8 array used to map ARAM faults
row = aram_dir[ ] index
data = aram_dir[ row ] contents
lo_nibs = fax rows failing due to Lo ARAM
hi_nibs = fax rows failing due to Hi ARAM
fax_rows = total rows unusable for fax
lo_rows = unusable rows due to Lo ARAM
hi_rows = unusable rows due to Hi ARAM
vox_rows = total rows unusable for voice or fax Note:
Data Values are in Hexadecimal Format

Fig. 18-2.

aram_dir[ ] (an array 8192 x 8)

ROW / STATUS

| Row | Status |
|---|---|
| 0 | 00 |
| 1 | 00 |
| 2 | 00 |
| 3 | 00 |
| 4 | 00 |
| 5 | 00 |
| 6 | 00 |
| 7 | 00 |
| 8 | 00 |
| 9 | 00 |
| 10 | 00 |
| 11 | 00 |
| 12 | 00 |
| 13 | 00 |
| ... | ... |
| 8168 | 00 |
| 8169 | 00 |
| 8170 | 00 |
| 8171 | 00 |
| 8172 | 00 |
| 8173 | 00 |
| 8174 | 00 |
| 8175 | 00 |
| 8176 | 00 |
| 8177 | 00 |
| 8178 | 00 |
| 8179 | 00 |
| 8190 | 00 |
| 8191 | 00 |

Fig. 19A.

Sample aram_dir[ ] useage

ROW / STATUS

| Row | Status | Description |
|---|---|---|
| 0 | FF | defective row - do not use |
| 1 | 81 | voice only row used by voice message #1 |
| 2 | 81 | voice only row used by voice message #1 |
| 3 | 01 | perfect row used by voice message #1 |
| 4 | 02 | perfect row used by voice message #2 |
| 5 | 02 | perfect row used by voice message #2 |
| 6 | 02 | perfect row used by voice message #2 |
| 7 | 80 | unused voice only row |
| 8 | FF | defective row - do not use |
| 9 | 42 | perfect row used by fax message #2 |
| 10 | 42 | perfect row used by fax message #2 |
| 11 | 80 | unused voice only row |
| 12 | 42 | perfect row used by fax message #2 |
| 13 | 00 | unused perfect row |
| ... | ... | ... |
| 8191 | 00 | unused perfect row |

Fig. 19C.

Status
Word  Description
00   unused perfect row
80   unused voice only row (bit-7 high)
FF   defective row - do not use
01   perfect row occupied by voice message #1 (bits 5-0 define message #)
81   voice only row occupied by voice message #1
3F   perfect row occupied by voice message #63 (max voice message #)
BF   voice only row occupied by voice message #63
41   perfect row occupied by fax message #1 (bit-6 high implies fax message)
7F   perfect row occupied by fax message #127 (max fax message #)

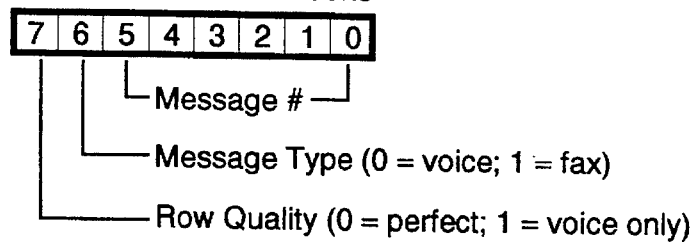

Fig. 19B.

next_row[ ] (an array 8192 x 8)

ROW / INCR

| 0 | 00 |
| 1 | 00 |
| 2 | 00 |
| 3 | 00 |
| 4 | 00 |
| 5 | 00 |
| 6 | 00 |
| 7 | 00 |
| 8 | 00 |
| 9 | 00 |
| 10 | 00 |
| 11 | 00 |
| 12 | 00 |
| 13 | 00 |
| ... | ... |
| 8168 | 00 |
| 8169 | 00 |
| 8170 | 00 |
| 8171 | 00 |
| 8172 | 00 |
| 8173 | 00 |
| 8174 | 00 |
| 8175 | 00 |
| 8176 | 00 |
| 8177 | 00 |
| 8178 | 00 |
| 8179 | 00 |
| 8190 | 00 |
| 8191 | 00 |

Fig. 20A.

INCR Bit Definitions

| 7 | 6 | 5 | 4 | 3 | 2 | 1 | 0 |

— Increment Value —
Increment type (0 = short; 1 = long)

Short increment: Add the increment value (defined by bits 6-0) to the current ARAM address pointer.

Long increment: Multiply the increment value (defined by bits 6-0) by 256 and add to the current ARAM address pointer. Read the next available byte (bits 7-0) from the next_row[ ] array and add its value to the current ARAM address pointer.

Fig. 20B.

Sample next_row[ ] useage

ROW / INCR

| 0 | 01 | add 1 to address pointer for next row |
| 1 | 01 | add 1 to address pointer for next row |
| 2 | 01 | add 1 to address pointer for next row |
| 3 | 03 | add 3 to address pointer for next row |
| 4 | 01 | add 1 to address pointer for next row |
| 5 | 01 | add 1 to address pointer for next row |
| 6 | 132 | add 1024 (256 x 4) to address pointer and (because bit-7 is set) | Long Increment Example |
| 7 | 16 | add 16 to address pointer for next row |
| 8 | 01 | add 1 to address pointer for next row |
| 9 | 00 | end of message or end of free memory |
| 10 | 00 | |
| 11 | 00 | |
| 12 | 00 | |
| 13 | 00 | |
| ... | ... | |
| 8191 | 00 | |

Fig. 20C.

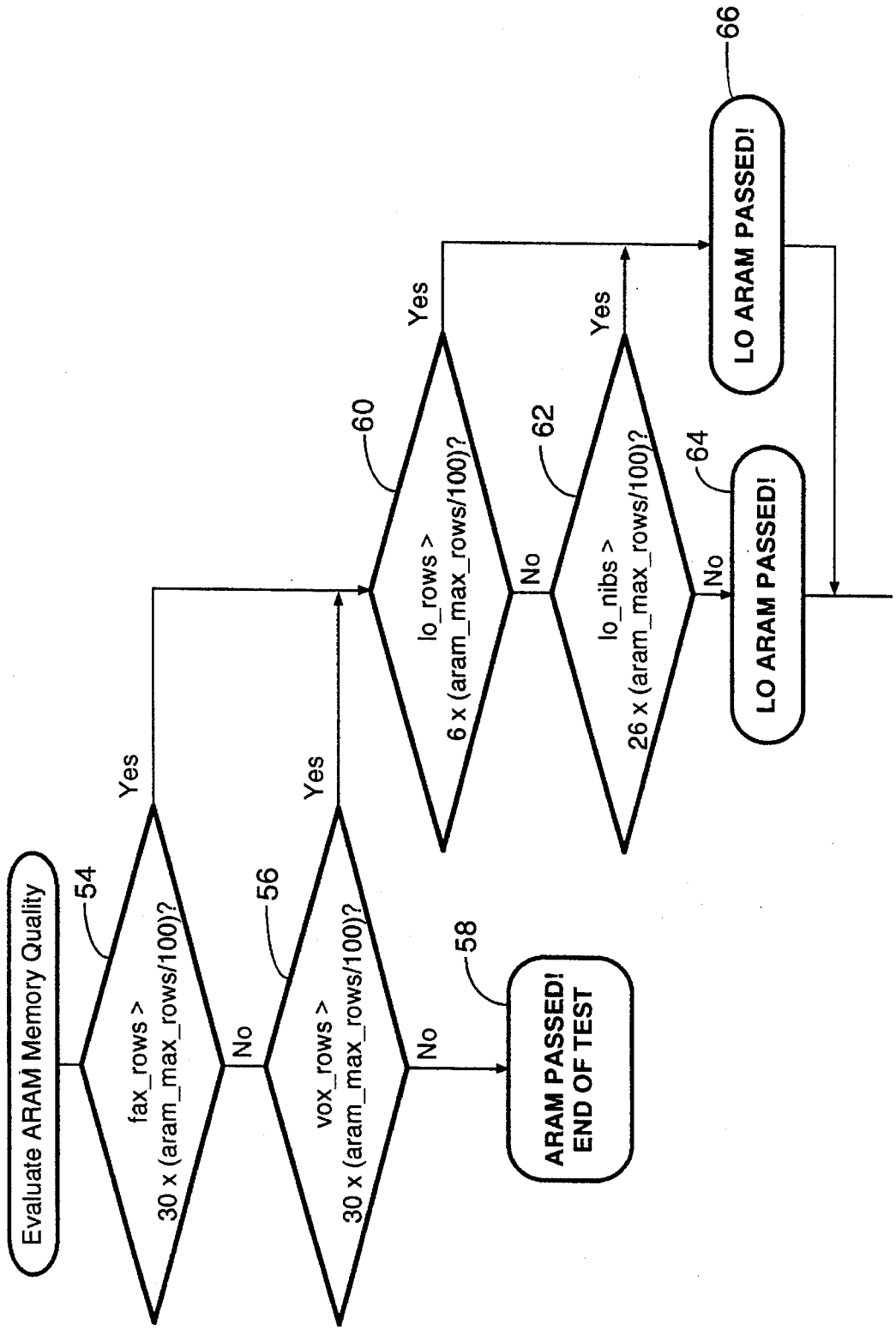
Fig._21-1.

5,537,631

MEMORY MANAGEMENT TECHNIQUE FOR DEFECTIVE MEMORY

BACKGROUND OF THE INVENTION

The present invention relates to computer memory arrays. More particularly, the present invention relates to a method for mapping non-functional locations of random access memory array chips, such as audio DRAM chips, so that the chips may thereafter be used within a computer memory storage subsystem for storing digitized voice messages and facsimile data.

Computer systems following conventional architectures include a central processing unit (CPU) and main memory array which is used to store the application's and operating system's control programs which are executed by the CPU. A bus structure enables the CPU and main memory array to receive and send data to peripheral equipment, such as input/output (I/O) devices and auxiliary data storage and retrieval devices such as disk drives.

One type conventional memory array commonly used is the dynamic random access memory or DRAM. DRAM technology has progressed to the point where single DRAM chips may provide as much as a megabit or four megabits, or more, of storage. For example, an array of eight one megabit chips provides a megabyte of data storage capacity while an array of 16 one megabit chips provides a megaword of data storage capacity. Larger capacity chips provide even greater storage capacities. In order to assure integrity of each bit position within a particular address location, several approaches have been followed. The simplest approach is a single additional parity bit position which checks the parity (odd or even) of the particular byte or word to be stored at the address and indicates an error if, as actually stored, the parity is different than anticipated.

Another approach is to provide an error correction scheme which requires as many as six extra bit positions for a 16 bit word. One example of such approach is provided by the Nagano, et al. U.S. Pat. No. 4,394,763. This patent describes a method for detecting two-bit errors with an error correction code (ECC) scheme and then swapping a spare bit storage cell in place of a suspected defective cell and rerunning the bus memory transfer cycle. If only a single error remains, the ECC corrects this error and the process continues. In other words, the Nagano, et al. approach is to provide dynamic bit swapping within an ECC scheme in order to replace bad bit cells with substitute good bit cells during operation of the memory array. The evident drawback of the Nagano, et al. approach is that the ECC scheme requires considerable overhead in order to provide a six bit error correction code value for each sixteen bit word.

Another technique suggested by the prior art in Beausoleil U.S. Pat. No. 3,644,902 is to provide a mechanism for physically reconfiguring the boards comprising a memory array, so that an arrangement of boards in which a data word has a two bit error is changed to a new arrangement wherein a single bit error remains. Then, conventional ECC techniques may be used to correct for the single bit error.

DRAM chips are typically specified as having certain electrical characteristics. For computer service, characteristics such as power consumption, access times (speed), refresh rate, and freedom from nonfunctional storage locations are considered to be critical. Unfortunately, the manufacturing process is not yet sufficiently reliable in the megabit capacity ranges to provide full yields of chips that meet or exceed specifications relating to these four characteristics. However, a significant number of chips are produced which meet a slightly relaxed or less stringent set of specifications.

Since these chips cannot be reliably used within computer main memory, they are available at significantly lower cost than chips which meet the more stringent specifications for use within main memory of a digital computer. Other applications having relaxed specifications have been proposed and found for these chips. Such applications typically utilize fault tolerant data, which is binary data such as, for example, digitized audio information which can tolerate a few faulty bits within the data without seriously corrupting the data as a whole. Since these partially defective memory chips are mostly used within digital audio voice recording systems, wherein single bit or several bit non-functionality will not perceptibly degrade reconstituted audio information, these chips have come to be known within the semiconductor industry as "AUDIO DRAM" or ARAM.

However, for obvious reasons, ARAM chips have not conventionally been used for storage of fault non-tolerant data, which is binary data such as, for example, computer program code or facsimile data which cannot tolerate any faulty bits within the data. A hitherto unsolved need has arisen for the practical utilization of Audio DRAM within computing systems in order to realize a low cost, high storage capacity solid state memory array.

It is therefore an objective of the present invention to provide a memory management technique for allowing ARAM chips to be utilized for storage of both fault tolerant binary data and fault non-tolerant binary data.

SUMMARY OF THE INVENTION

This and additional objectives are accomplished by the various aspects of the present invention wherein, briefly, according to a principle aspect, a technique is provided for managing the storage and retrieval of data within an ARAM memory array such that both fault tolerant data and fault non-tolerant data can be stored within the ARAM array without such data becoming corrupted due to the faulty bits within the ARAM memory.

In accordance with this principle aspect, a first aspect of the present invention is directed to a method for managing the storage of fault non-tolerant and fault tolerant data within a plurality of defective memory chips comprising the steps of mapping out and testing each of the plurality of memory chips for defective memory locations within each chip; and building a first memory mapping table for indicating whether each of the memory rows within the plurality of defective memory chips is suitable for storage of fault non-tolerant data, fault tolerant data, or neither fault non-tolerant nor fault tolerant data. Once the status of each row is known (perfect, imperfect, or unusable), the fault tolerant and fault non-tolerant data can then be written into the appropriate rows within the ARAM memory.

A second aspect of the present invention is directed to a method for managing the retrieval of fault non-tolerant and fault tolerant data within the plurality of defective memory chips within a computer system. The system includes a first memory mapping table for indicating memory locations within the plurality of defective memory chips which contain data that is desired to be retrieved. The method comprises the steps of building a second memory mapping table based upon data contained within the first mapping table for indicating appropriate row offset values required to step between successive memory row locations within the plurality of memory chips which contain the data that is desired to be retrieved; and using the data within the second mapping table to retrieve the desired fault non-tolerant or fault tolerant data contained within the plurality of defective memory chips.

A third aspect of the present invention is directed to a method for managing the storage of fault non-tolerant and fault tolerant data within a plurality of defective memory chips. The method comprises the steps of mapping out and testing each of the plurality of defective memory chips for defective memory locations within each chip; storing fault non-tolerant data in available memory row locations within the plurality of defective memory chips which are devoid of defective cells; and storing fault tolerant data in available memory row locations within the plurality of defective memory chips which either are devoid of defective memory cells or which do not contain more than an acceptable percentage of defective memory cells in each row.

In accordance with the aspects of the present invention described above, the memory management technique of the present invention is able to utilize low cost ARAM chips for storing and retrieving fault non-tolerant data such as facsimile data, and fault tolerant data such as digitized voice data. Because the technique of the present invention is primarily implemented through firmware, using only a minimum amount of hardware, the technique of the present invention can easily be incorporated into a variety of computer systems, thereby allowing such computer systems to utilize less costly ARAM chips rather than the more expensive DRAM chips. This cost savings results in a lower overall production cost of such computer systems.

The technique of the present invention is particularly well suited for use in computer systems which store and retrieve both facsimile and voice data. Although only perfect ARAM memory rows are used for storing facsimile data, there is a remote chance that some rows may have marginal bits which are actually faulty, but which were not found during the initial testing and fault mapping steps conducted according to the memory management technique of the present invention. Accordingly, a fourth aspect of the present invention is directed to a method for managing the storage and retrieval of facsimile header data sets within a plurality of defective memory chips. The method comprises the steps of duplicating a facsimile header data set at least once to thereby form a plurality of substantially similar facsimile header data sets, and storing each of the substantially similar header data sets into the plurality of memory chips to thereby increase the likelihood that at least one of the substantially similar stored facsimile header data sets will not be corrupted due to defective memory cell locations.

In addition, a fifth aspect of the present invention is directed to a method for using at least one of the substantially similar facsimile header data sets to process a corresponding set of facsimile data. The method comprises the steps of retrieving each of the substantially similar facsimile header data sets from the plurality of defective memory chips, and comparing each of the facsimile header data sets to one another in order to locate a match between at least two of the facsimile header data sets. If a match between at least two of the substantially facsimile header data sets has been located, one of the matched sets will be used for processing of the corresponding set of facsimile data. However, if a match between at least two of the header data sets has not been located, the processing of the corresponding set of facsimile data will be terminated.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIGS. 4A and 4B illustrate a method of the present invention for determining the size of a hi bank of the ARAM memory array.

FIGS. 5A and 5B illustrate a method of the present invention for determining, the size of a lo bank of the ARAM memory array.

FIGS. 6A, 6B, 7A, 7B, 8A, 8B, 9A, 9B, 10A, 10B, 11A, AND 11B illustrate the various methods used for testing the ARAM lo bank memory arrays in order to determine the location of defective memory cells within each chip of the ARAM lo bank.

FIGS. 19A–19C provide a more detailed description of the ARAM_DIRECTORY table created by the method of FIG. 18.

FIGS. 20A–20C provide a more detailed description of the ARAM next row directory table which is created each time data is written into or read from the ARAM memory array.

DETAILED DESCRIPTION OF THE PREFERRED EMBODIMENT

Figure 1A:
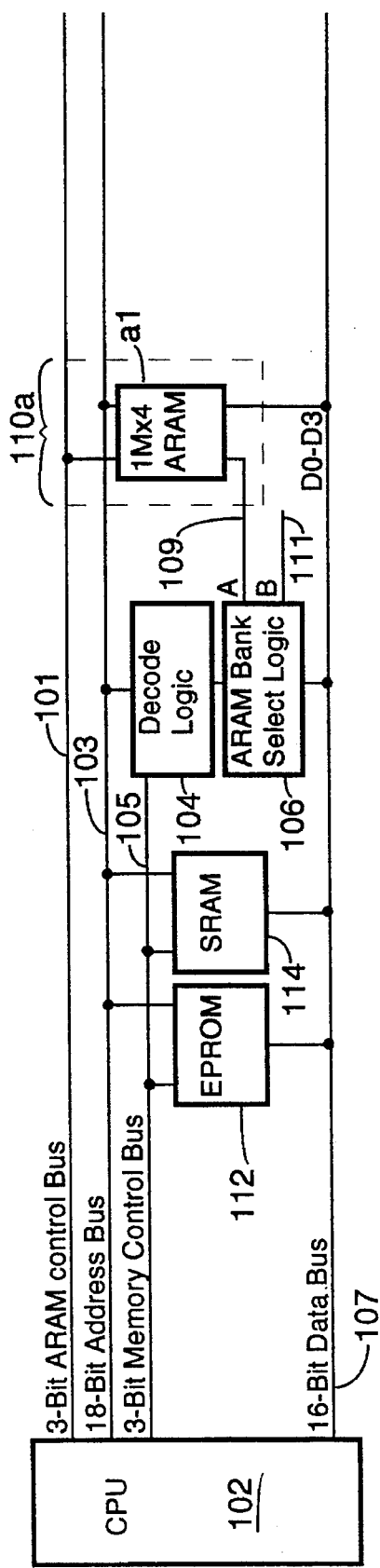
FIGS. 1A–1F illustrate alternate embodiments of the ARAM configuration block of the present invention.

The present invention provides a technique for managing the storage and retrieval of data within ARAM memory array such that both fault tolerant data and fault non-tolerant data can be stored within the array without the data becoming corrupted due to faulty memory cell locations within the ARAM memory. The technique of the present invention provides the ability to utilize low cost ARAM chips as a memory storage system within a computer system for the storage and retrieval of data in a variety of applications.

The technique of the present invention is particularly well suited for use in computer systems or answering machines which store and retrieve facsimile and voice data. In such systems, stored facsimile data is considered to be fault non-tolerant since it cannot tolerate any bad bits and requires special care to prevent usage of any known defective memory locations when storing such data. Stored voice data, on the other hand, is considered to be fault tolerant since a limited number of defective bits in most cases will not harm the recorded voice quality. Thus, in accordance with the memory management technique of the present invention, the facsimile data can be stored and retrieved from memory location within the ARAM chips which contain no defective memory cells, and voice data can be stored and retrieved from memory locations within the ARAM chips which either contain no defective memory cells, or which contain the acceptable percentage of defective memory cells. Examples of such telephone/facsimile answering machines are the VOMAX 1000 and the VOMAX 2000 stand alone voice and fax massaging units manufactured by Macronix, Inc. of San Jose, Calif.

The VOMAX units use audio quality dynamic RAM (ARAM) for both voice and facsimile storage. By definition, ARAM memory can have defective bits which in most cases will not harm recorded voice quality, but can harm stored facsimile data. Accordingly, the present invention provides a unique memory management scheme to test and map ARAM memory defects to prevent the usage of defective memory cell locations when storing fault non-tolerant data.

FIGS. 1A–1F illustrate several embodiments of a voice/fax answering machine having different memory capacities. Each computer system comprises a CPU 102, an EPROM 112, an SRAM 114, and a plurality of buses for communicating with the ARAM memory array (110*a*, 110*b*, 110*c*, 110*d*, 110*e*, or 110*f*). These buses include an ARAM control bus 101, an address bus 103, a memory control bus 105, and a data bus 107. Each system also includes a logic decoding circuit 104 for providing chip select signals, and may additionally include an ARAM bank select logic block 106 for providing memory bank select signals when at least two banks of memory are used within the computer system.

EPROM 112 is used to store the firmware or fixed machine instructions for all operational aspects of the computer system. These instructions are decoded and executed by the CPU 102. The size of the EPROM should preferably be sufficient to store all the operating instructions of the computer system. For example, a 128K×16 EPROM may be used. In addition, other types of non-volatile storage means may be used instead of the EPROM, so long as they provide quick access of data similar to that of the EPROM. Some examples of other storage means are EEPROMs, mask programmable ROMs, or RAM which is used in combination with some type of non-volatile storage means.

SRAM 114 houses all the tables and address pointers of the computer system including an ARAM_DIRECTORY TABLE, a NEXT_ROW TABLE, and an address pointer register, each of which is discussed in greater detail below. The size of the SRAM should preferably be large enough to accommodate the maximum size of each table, which is dependent on the size of the ARAM memory array. For example, for an ARAM array of 8M×8, an SRAM of 32K×16 may be used. Additionally, other memory storage devices may be used in place of the SRAM so long as they provide for quick access of data similar to that of the SRAM. For example, DRAM may be used, so long as the computer system provides means for continually refreshing the data within the DRAM.

Figure 1B:
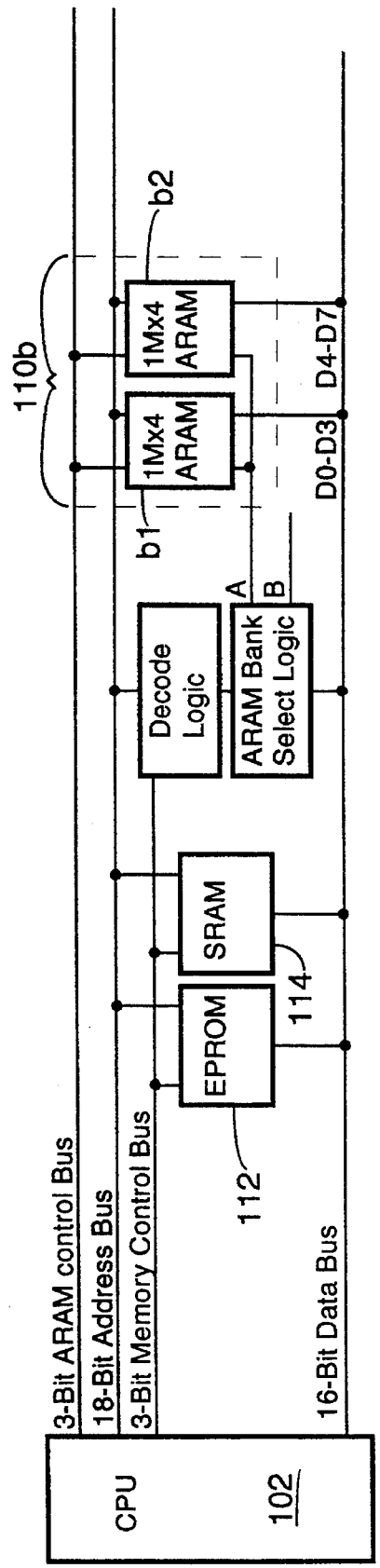
Figure 1C:
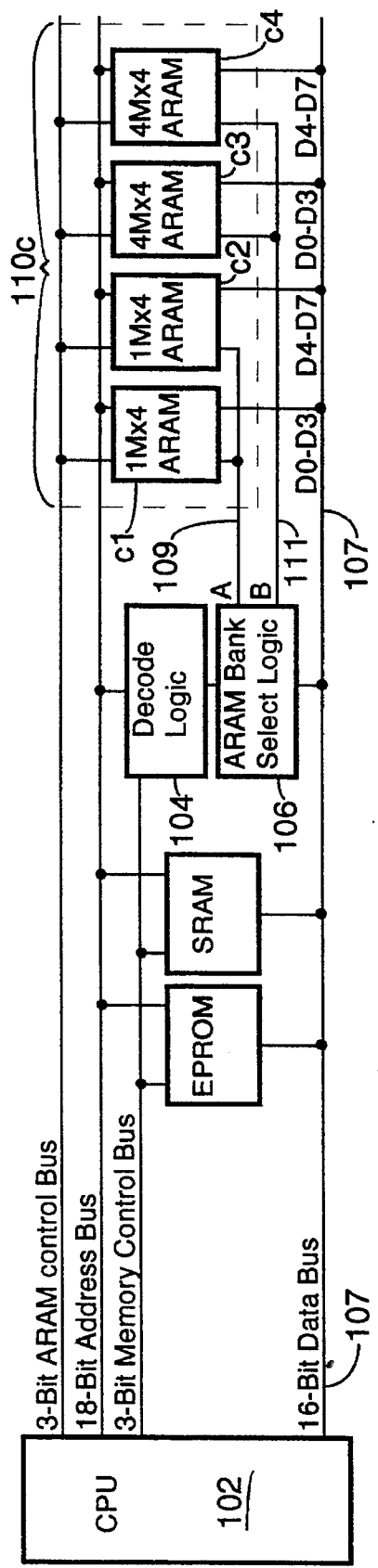
Figure 1D:
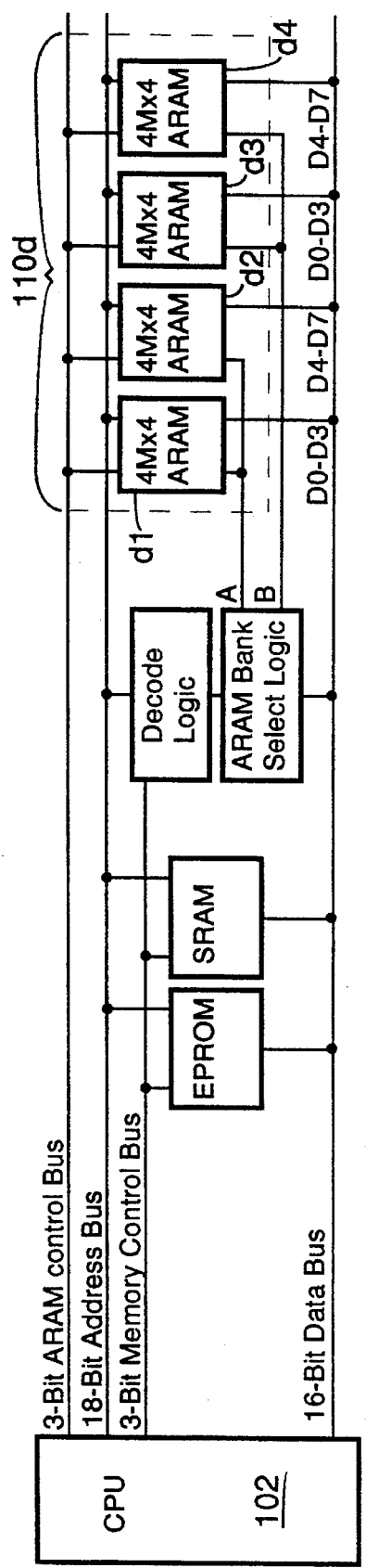
Figure 1E:
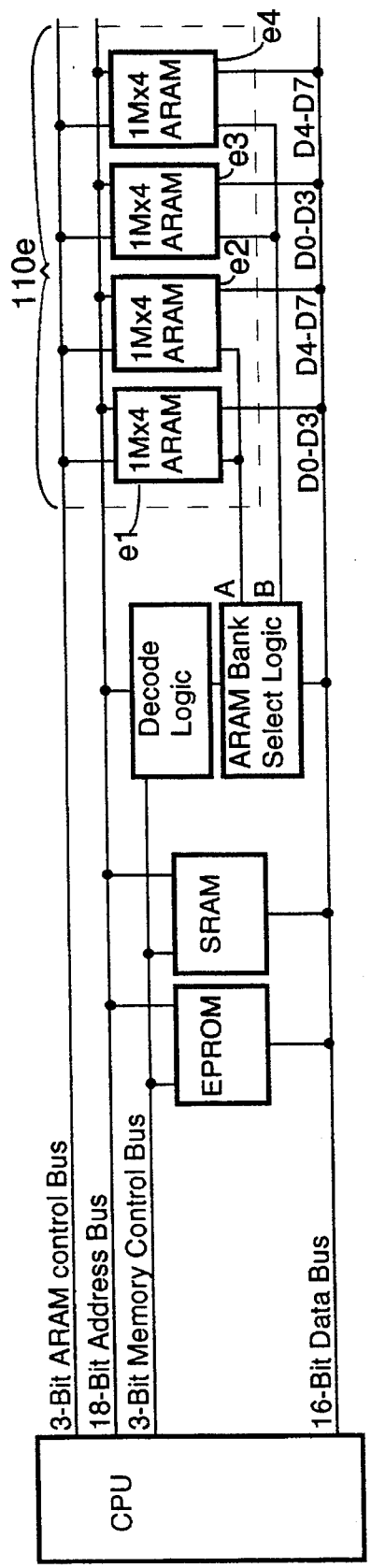
Figure 1F:
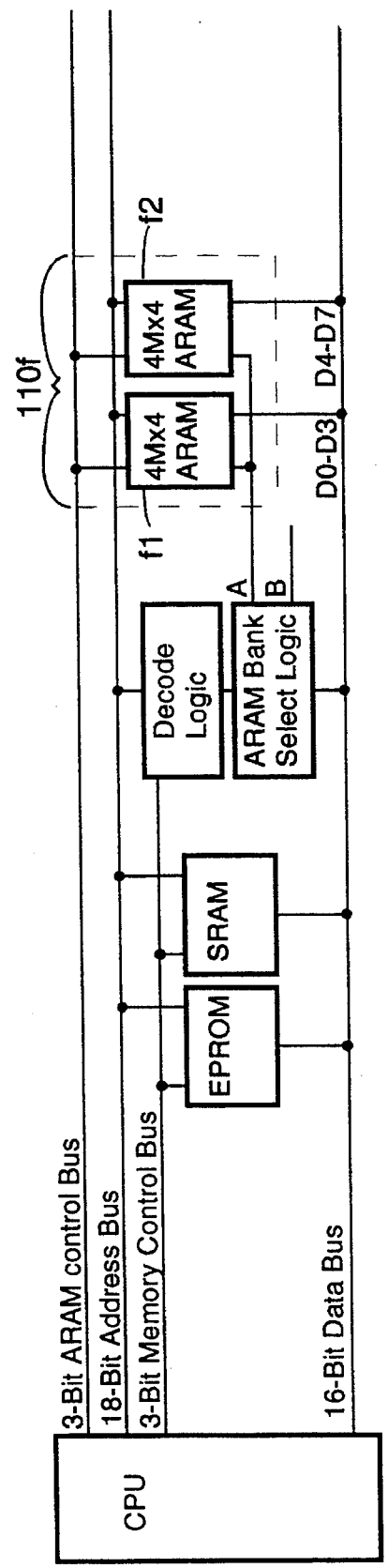

As shown in FIGS. 1A–1F, the size of the ARAM memory array may vary depending upon the type and number of ARAM chips used. For example, FIG. 1A shows a memory array 110*a* having a 512 kilobyte capacity. FIG. 1B illustrates an ARAM memory array 110*b* having a 1 megabyte capacity. FIG. 1C shows an ARAM memory array 110*c* having a 5 megabyte capacity. FIG. 1D illustrates an ARAM memory array 110*d* having an 8 megabyte capacity. FIG. 1E illustrates an ARAM memory array 110*e* having a 2 megabyte capacity, and FIG. 1F illustrates an ARAM memory array 110*f* having a 4 megabyte capacity.

Note that FIGS. 1C–1E utilize both output signals 109 and 111 from the ARAM bank select logic block 106. This feature allows for bank switching between a hi bank of memory (for example, chips d1 and d2 of FIG. 1D) and a lo bank of memory (for example, chips d3 and d4 of FIG. 1D). The concept of bank switching is familiar to those skilled in the art.

The ARAM is used for storing recorded voice messages and fax messages. Each chip is organized into 1024 rows. Every ARAM row contains 1024 16-bit wide words. Only a portion of each 16-bit wide ARAM word contains valid information. The portion of the ARAM word that contains valid information is called the ARAM_WIDTH, also described as a partitionable unit. The ARAM_WIDTH varies depending upon the ARAM configuration used. The present invention supports configurations in which the ARAM_WIDTH is 4, 5, 6, 7, or 8 bits wide.

For example, ARAM a1 of FIG. 1A has a 1M×4 capacity, meaning that chip a1 is divided into 1024 rows with each row having 1024 unit partitions. Each unit partition is 4 bits wide.

In a second example, ARAM chips d1 and d2 of FIG. 1D each have a 4M×4 capacity, meaning that each chip is divided into 4096 rows of 1024 unit partitions each. Each unit partition is again 4 bits wide. However, as shown if FIG. 1D, the 2 ARAM chips d1 and d2 may be combined to form a memory array having a 4 megabyte capacity with each byte being 8 bits wide.

As shown in FIGS. 1A–1F, the computer system of a telephone/facsimile answering machine may have a variety of different memory sizes and configuration options. Accordingly, the memory management technique of the present invention is designed to automatically determine the memory size and configuration options of the computer system in which it is located. As used herein, the memory management technique of the present invention is referred to as the ARAM memory manager or simply memory manager.

In order to determine the memory size and configuration of the ARAM memory array, the memory manager uses six (6) variables to describe the current ARAM size and configuration. These variables are assigned values during initial power up and testing of the ARAM memory array, and are defined in Table I.

TABLE I

| Variable Name | Size |
| --- | --- |
| 1) ARAM_WIDTH | 4 or 8 (ARAM data width will either be 4 or 8 bits wide) |
| 2) ARAM_HI_BANK | 0, 1 or 4 (ARAM hi bank length in megabytes) |
| 3) ARAM_LO_BANK | 1, or 4 (ARAM lo bank length in megabytes) |
| 4) ARAM_LENGTH | 1, 2, 4, 5, or 8 (sum of aram_lo_bank and aram_hi_bank lengths) |
| 5) ARAM_INCR | 1 or 2 (computed be dividing 8 by the aram_width) |
| 6) ARAM_MAX_ROWS | 1024 rows per 1M of memory length (aram_length times 1024) |

Referring to Table I, the ARAM_WIDTH variable describes the width of each word or unit partition within the ARAM chip. The ARAM_HI_BANK variable describes the memory size in megabytes of a hi bank memory array of ARAM chips, and is assumed to have three possible values: 0, 1, or 4 megabytes. The ARAM_LO_BANK variable describes the size in megabytes of the lo bank memory array of ARAM chips, and is assumed to have two possible values: 1, or 4 megabytes. The ARAM_LENGTH variable describes the size in megabytes of the entire ARAM memory array including the hi bank and the lo bank and is assumed to have 5 possible values: 0, 1, 2, 4, 5, or 8 megabytes. The ARAM_INCR variable describes the step size to get from the beginning of a first word within an ARAM to the beginning of a next word within the ARAM. Where the ARAM_WIDTH is 4 bits wide, ARAM_INCR will be set to two. Where the ARAM_WIDTH is 8 bits wide, ARAM_INCR will be set to one. Finally, the ARAM_MAX_ROWS variable describes the number of rows contained within the entire memory array, and is determined by multiplying the ARAM_LENGTH value by the value 1024. Additionally, it should be noted that the present invention may be modified to support other and/or additional possible values which are not presently assumed.

While assigning values to the above described variables during initial power up and testing of the ARAM memory array, the memory manager performs up to 18 individual steps or tests for determining the memory configuration as well as for determining the location of faulty memory cell locations within each of the ARAM rows. These steps are summarized in Table II below, and are described in greater detail in the flow diagrams and pictorial illustrations of the drawings.

TABLE II

1) Find ARAM Data Width (assigns values to ARAM_WIDTH and ARAM_INCR)
2) Test for ARAM hi bank (ARAM_HI_BANK = 4 if found, 0 if not found)
3) Find ARAM hi bank Length (ARAM_HI_BANK = 0, 1 or 4)
4) Find ARAM lo bank Length (ARAM_LO_BANK = 1 or 4; set ARAM_LENGTH & ARAM_MAX_ROWS)
5) Test ARAM lo bank with Checker Board Min/Max Pattern
6) Test ARAM lo bank with Checker Board Complement Min/Max Pattern
7) Test ARAM lo bank with Checker Board March Up Pattern
8) Test ARAM lo bank with Checker Board Complement March Down Pattern
9) Test ARAM lo bank with Solid 1's Min/Max Pattern
10) Test ARAM lo bank with Solid 0's Min/Max Pattern
11) Test ARAM hi bank with Checker Board Min/Max Pattern
12) Test ARAM hi bank with Checker Board Complement Pattern

TABLE II-continued

13) Test ARAM hi bank with Checker Board March Up Pattern
14) Test ARAM hi bank with Checker Board March Down Pattern
15) Test ARAM hi bank with Solid 1's Min/Max Pattern
16) Test ARAM hi bank with Solid 0's Min/Max Pattern
17) Build ARAM_DIRECTORY Table (based on size and test results found above)
18) Evaluate ARAM Memory Quality Steps 1–4 of Table II generally describe the various tests used to determine the values which are to be assigned to the variables of Table I. Steps 5–10 generally describe the tests used for mapping out defective memory locations in the lo bank of the ARAM memory array, and steps 11–16 generally describe the various tests used for mapping out defective memory locations in the hi bank of the ARAM memory array.

Figure 2A:
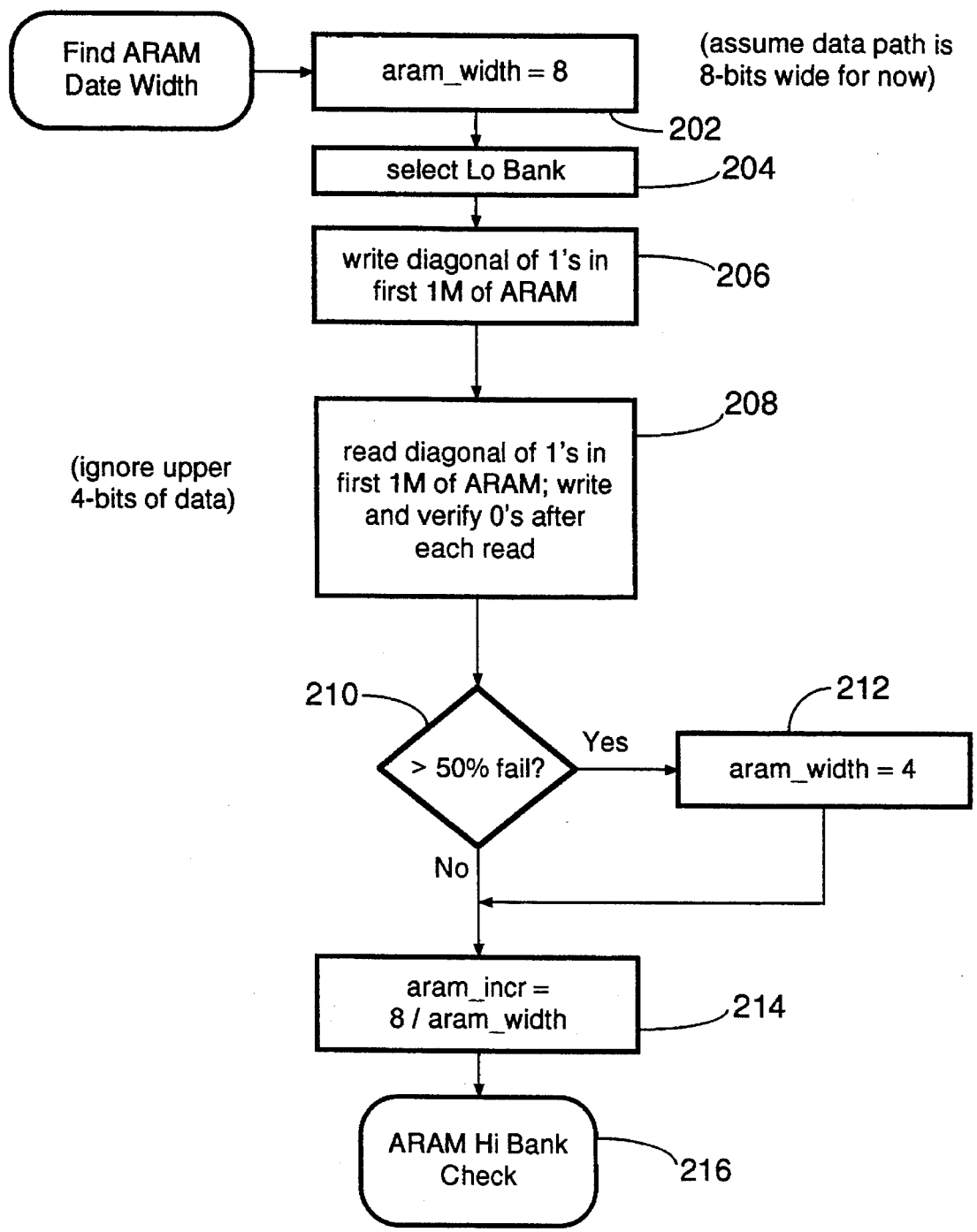
FIGS. 2A and 2B illustrate a method of the present invention for determining the data width of a partition unit within the ARAM arrays of FIGS. 1A–1F.

As shown in Table II, the first step performed by the memory manager is to determine the values of the ARAM_WIDTH and ARAM_INCR variables (step 1). The method of step 1 is illustrated in greater detail in FIGS. 2A and 2B. At the beginning of step 1, the ARAM_WIDTH is assumed to be 8 bits wide. A diagonal of 1's is then written into the first 1M of the ARAM lo bank memory array. One-by-one, each of the diagonal of 1's is then read by the memory manager in order to be verified. After the PASS/FAIL status of the verification has been determined, the 1 is then replaced by writing a zero to that memory location. The memory manager then attempts to verify that a zero can be read from that memory location. During this testing process, the memory manager keeps track of the number of times in which a verification of a 1 or a zero was successful and also keeps track of the number of times in which the verification was unsuccessful. If greater than 50% of the verifications were unsuccessful, it is assumed that the ARAM_WIDTH is equal to 4 rather than 8. After the ARAM_WIDTH has been determined, ARAM_INCR is set equal to the value 8/ARAM_WIDTH.

Figure 3A:
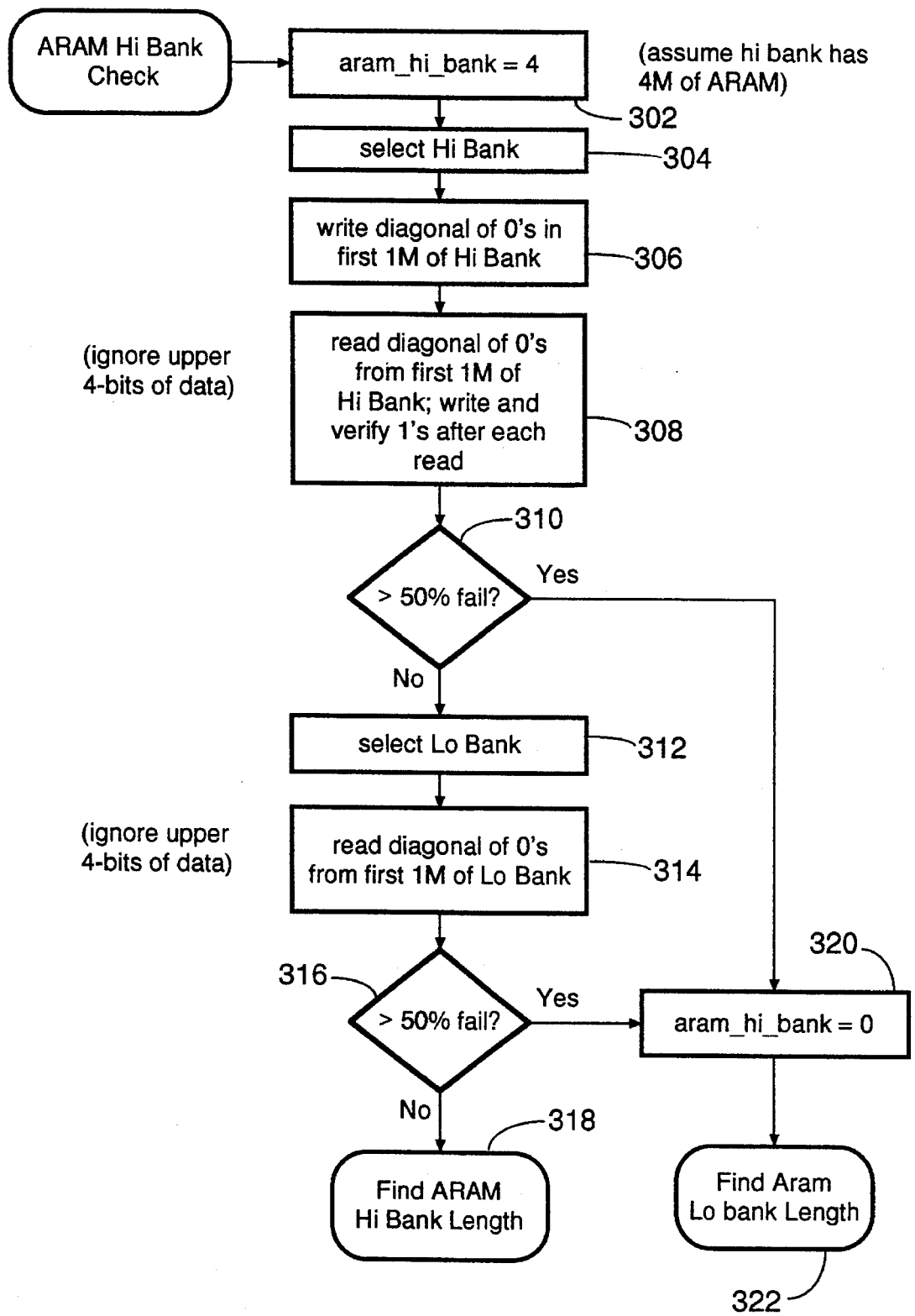
FIGS. 3A and 3B illustrate a method of the present invention for determining the presence of a hi bank of memory within the ARAM configuration of FIGS. 1A–1F.
Figure 3B:
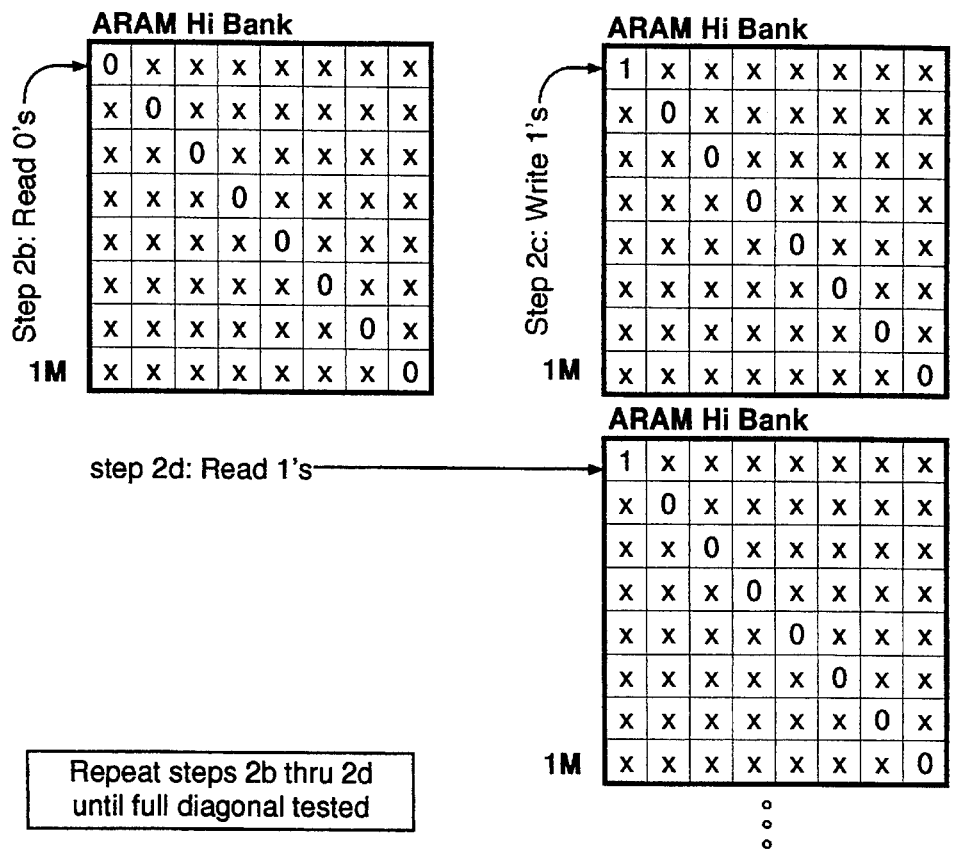
Figure 2:
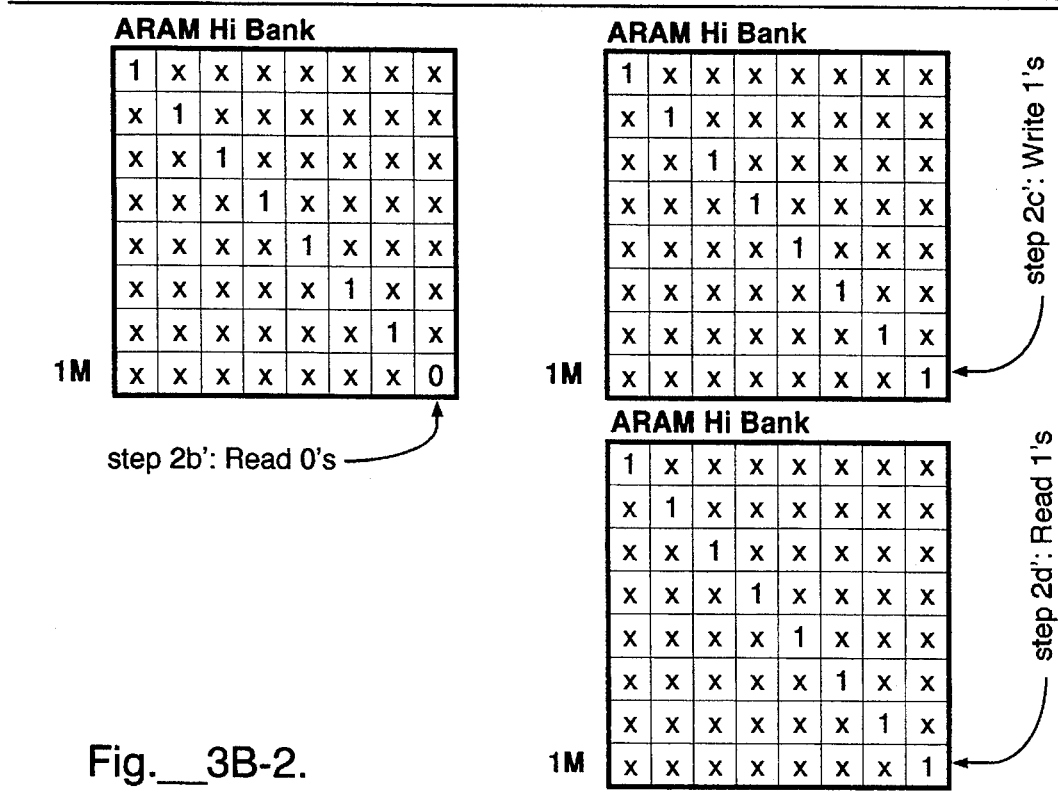

Step 2 of the memory manager is to test for the presence of a hi bank of ARAM memory (if any). This step is described in greater detail in FIGS. 3A and 3B of the drawings. Initially, it is assumed that a hi bank of memory is present, and that its size is 4 megabytes. As shown in FIGS. 3A and 3B, the test for the presence of an ARAM hi bank is accomplished in a manner similar to the testing of the ARAM_WIDTH (step 1). Basically, a diagonal of 0's is first written into the first 1 megabyte of the hi bank memory array. The memory manager then reads and attempts to verify each of the diagonal of 0's written into the first 1M of hi bank memory. After each zero has been verified (or has failed to be verified), the zero is replaced by writing a 1 into that memory location, whereupon the memory manager then attempts to verify the presence of the 1 at that location. During this writing and reading process, only the lower 4 bits of the data word need to be used since these bits are sufficient to indicate the presence of a hi bank of memory. In general, the number of bits to be tested in step 2 is equal to the minimum possible value for the ARAM_WIDTH.

After the PASS/FAIL status for each of the diagonal of 0's and the diagonal of 1's has been determined, overall failure rate for both the 0's and 1's is then assessed. If the failure rate is greater than 50%, it is assumed that no hi bank of memory exists. In other words, no additional memory modules or ARAM chips have been inserted into the memory expansion slots to provide for a hi bank memory. At this point, when it is determined that no ARAM hi bank exists, the ARAM hi bank value is set to zero, and subsequently, steps 11–16 are skipped since these steps relate to the mapping out of defective memory cell locations within the hi bank (when a hi bank is found to exist).

If, however, the overall failure rate for verifying the 0's and 1's is less than or equal to 50%, the testing process of step 2 continues. At this point, the lo bank of memory is selected, and the memory manager attempts to verify that a diagonal of 0's can be read from the first 1 megabyte of memory within the lo bank. The reason for this step is that there is a possibility that the memory manager was never actually reading from or writing to the hi bank memory, but rather believed it was writing to the hi bank memory when in fact it was writing to the lo bank. This can occur, for example in configurations where the hi bank select line and the lo bank select line are tied to the same bank of memory. Thus, if the memory manager has in fact been writing to and reading from the low bank during the first part of step 2 (steps 302–310), the first 1 megabyte of memory of the lo bank should now contain a diagonal of 1's as shown in 2d' of FIG. 3B. Therefore, if the memory manager fails to read 0's from at least 50% of the diagonal memory locations within the first megabyte of the low bank memory, it is assumed that the lo bank has been written to during the entire step 2 test, and that the hi bank of ARAM is nonexistent.

However, if the memory manager verifies that the diagonal memory locations of the first 1 megabyte of lo bank memory contains at least 50% 0's, then the memory manager assumes that a hi bank of ARAM does exist within the ARAM memory array. This assumption can be made based upon the fact at least 50% of the 0's and 1's written into the hi bank of ARAM memory were verified at steps 306–310. Therefore, at the end of step 310, the hi bank should contain a diagonal of all 1's as shown in step 2d' (FIG. 3B), and the lo bank should contain a diagonal of all 0's from the previous step, step 1 (step 1d' of FIG. 2B). Thus, given the fact that data written to the hi bank could be verified and that data within the lo bank remained unchanged from its state at the end of the previous step, the assumption is that a hi bank of ARAM memory is present.

If it has be determined that a hi bank of ARAM is present within the ARAM memory array, the next step, step 3, is to determine the size in megabytes of the hi bank of memory. Note that if it is determined that a hi bank is not present within the memory array, the ARAM_HI_BANK value is set to zero, and the memory manager proceeds to step 4.

Figure 4A:
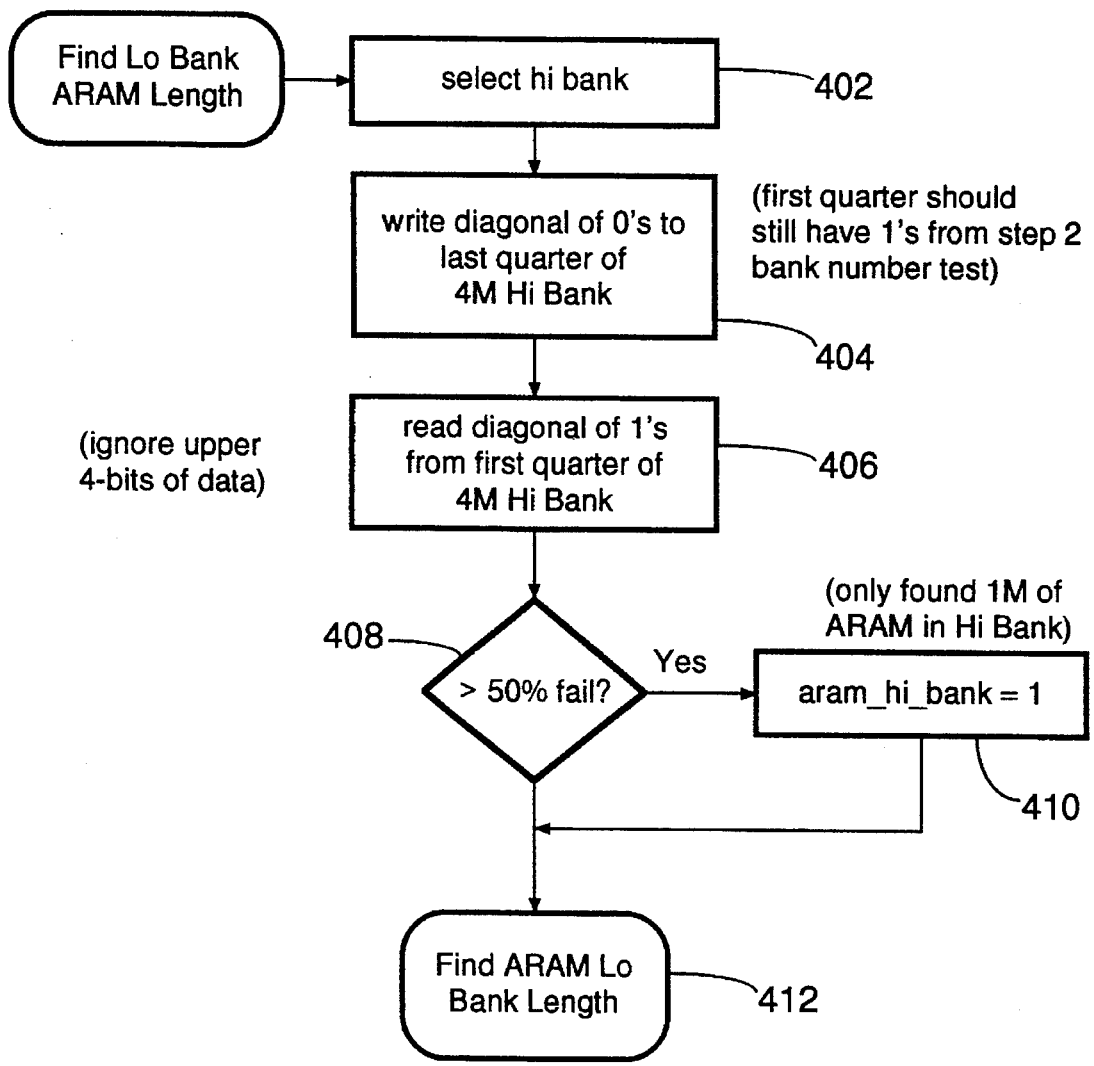
Figure 4B:
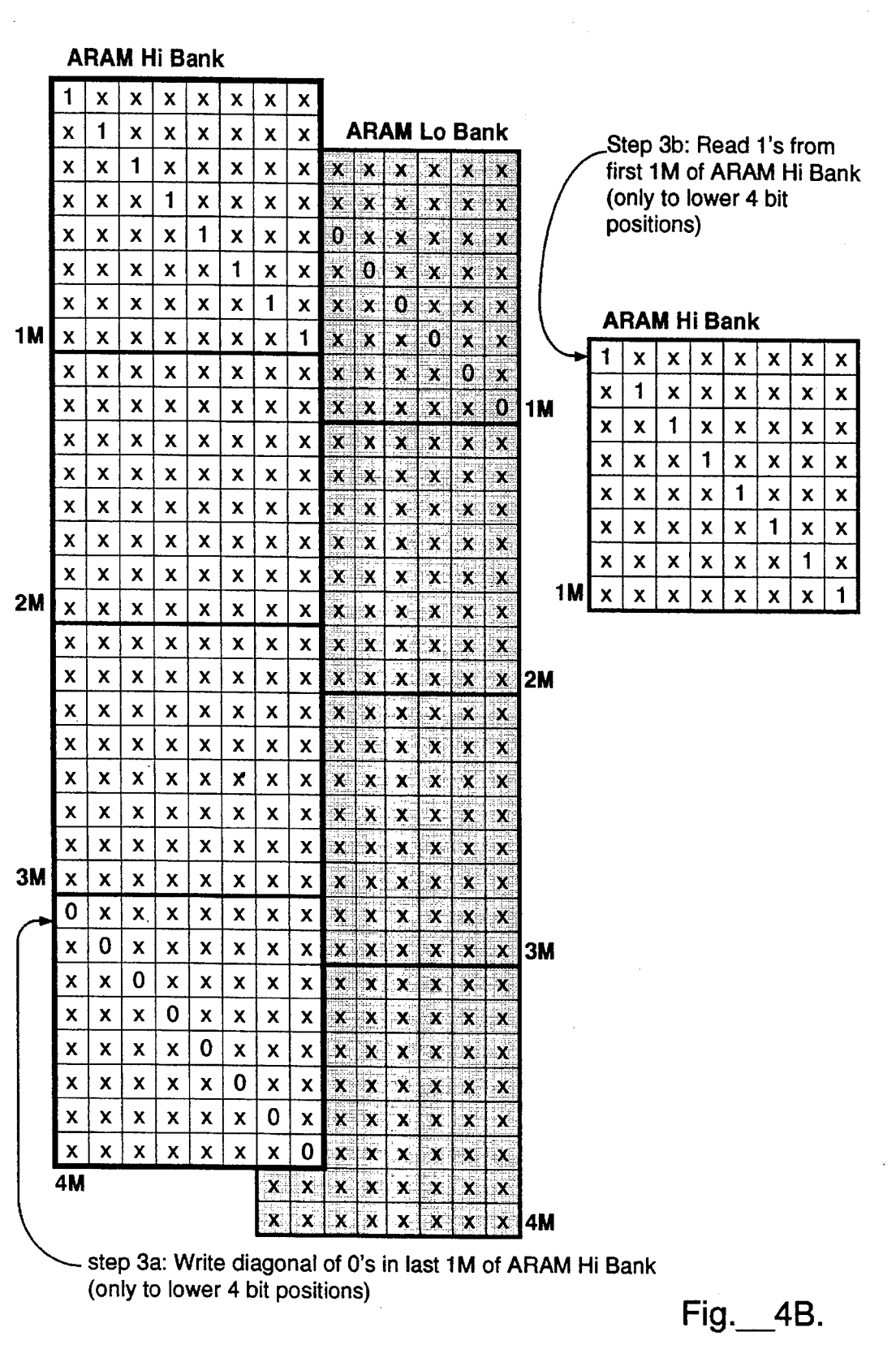

FIGS. 4A and 4B generally describe the procedure of step 3 wherein the memory size of the hi bank of memory is determined. For purposes of simplification, it is assumed that the size of the ARAM_HI_BANK can be either 0, 1, or 4 megabytes. Given this assumption, step 3 starts by assuming that the hi bank contains 4 megabytes of storage capacity. To test this, the memory manager writes a diagonal of 0's into the last quarter (i.e. the last 1 megabyte) of the 4 megabyte hi bank memory. Then, the memory manager reads the diagonal of memory locations from the first quarter of the hi bank memory. Recall that at the end of step 2, a diagonal of 1's was written into the first megabyte of hi bank memory. Therefore, if the size of the hi bank memory array is indeed 4 megabytes, the diagonal of 1's within the first quarter of the hi bank memory array should be able to be verified by the memory manager. If however, a diagonal of 0's is now located within the first 1 megabyte of the hi bank memory, it is assumed that the hi bank memory size is only 1 megabyte (since it cannot be either 4 or 0 megabytes), and the ARAM_HI_BANK value will be set accordingly.

Figure 5A:
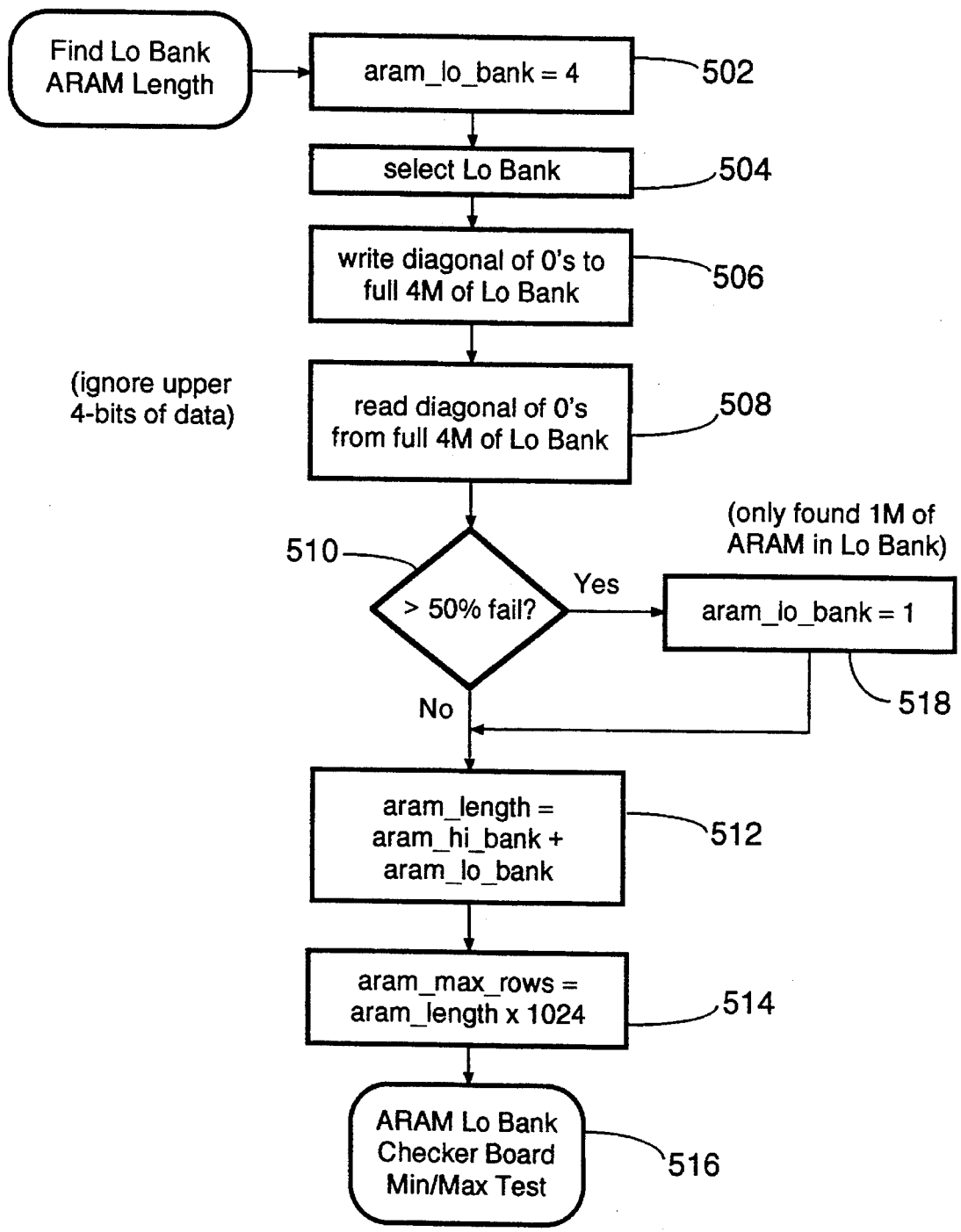
Figure 5B-2:
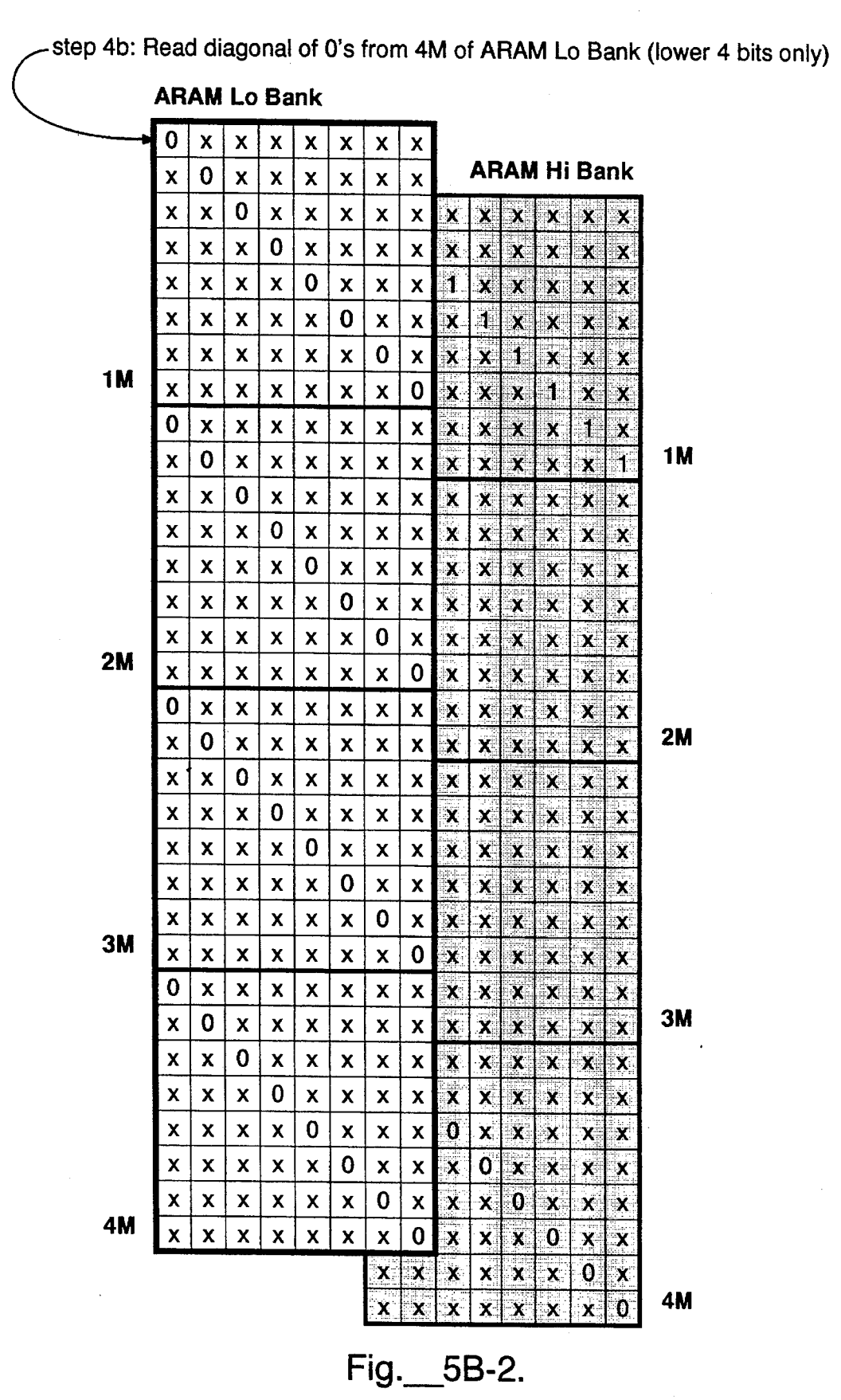
Figure 5B-1:
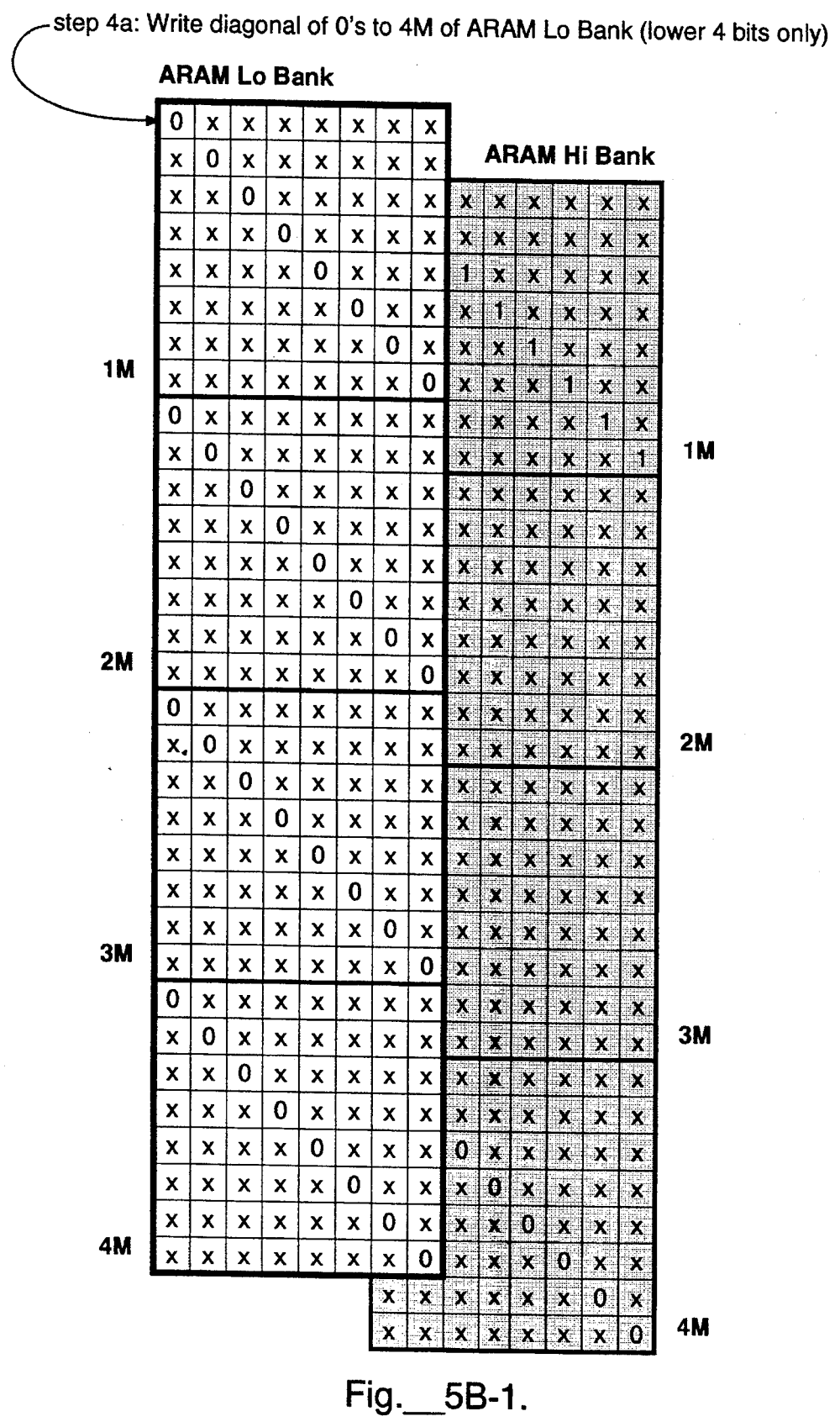

FIGS. 5A and 5B illustrate step 4 of the memory management testing process, wherein the size of the lo bank memory is determined. Initially, it is assumed that the size of the lo bank memory is 4 megabytes. At step 506 (FIG. 5A) the memory manager writes a diagonal of 0's to the full 4 megabytes of memory within the lo bank. This step is illustrated as step 4a in FIG. 5B. The memory manager then attempts to verify that a diagonal of 0's has been written into the full 4 megabytes of the lo bank memory. If the failure rate during this verification step (510) is greater than 50%, it is concluded that the size of the low bank memory is not 4 megabytes. Since it is assumed that the lo bank memory must contain either 1 or 4 megabytes of storage capacity, the memory manager determines, based upon a greater than 50% failure rate at step 510, that the size of the ARAM lo bank is 1 megabyte. However, if at least 50% of the 0's written into the full 4 megabytes of the lo bank memory can be verified, the memory manager will determine that the size of the ARAM lo bank memory is 4 megabytes.

It should be noted that where the size of the lo bank and/or the hi bank differs from the values assumed above, the present invention may be modified to include additional steps of writing data and verifying such data in order to determine the actual sizes of the hi bank and lo bank memories. Such additional steps are considered to be within the scope of the present invention, and one skilled in the art, in light of this description, would understand how to modify the present invention in order to incorporate such additional steps.

After the values of the ARAM_HI_BANK and ARAM_LO_BANK variables have been determined, the memory manager then calculates the ARAM_LENGTH value, and the ARAM_MAX_ROWS value at steps 512 and 514 respectively.

At the completion of step 4, each of the 6 variables described in Table I above have been calculated by the memory manager. At this point, the memory manager proceeds to map out the lo bank of the ARAM memory in order to determine the location of faulty memory cells within each of the rows of the ARAM lo bank memory.

Note that in steps 2–4, only the lower 4 bit positions for each unit partition within the ARAM were tested. This is due to the fact that steps 2–4 involve testing the presence of one or multiple ARAM chips, each of which is assumed to have a minimum ARAM_WIDTH of 4 bits. However, when mapping out for faulty memory cell locations within the ARAM memory, each of the bits within each unit partition must be tested for reliability.

Figures 1, 6A:
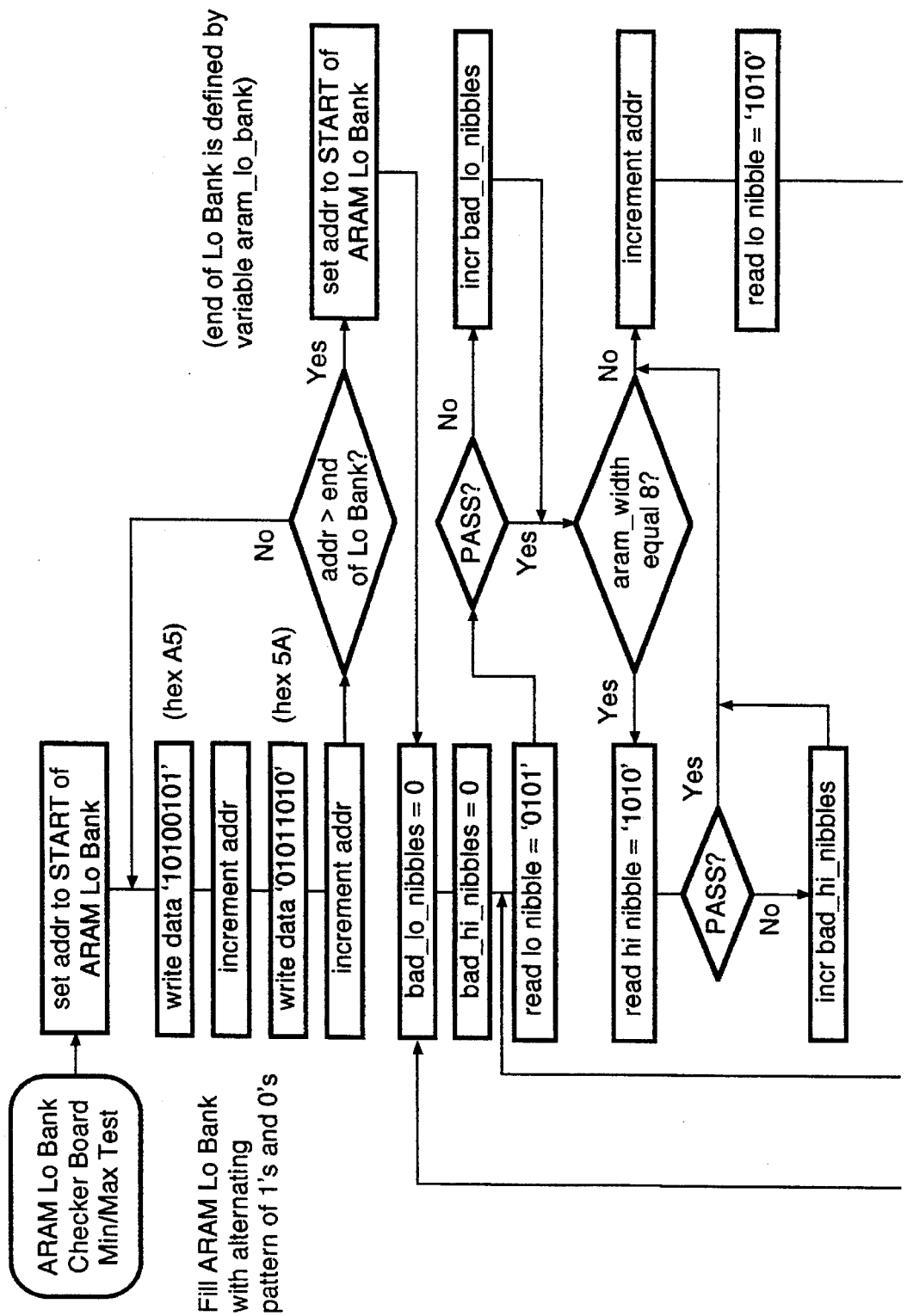
Figures 2, 6A:
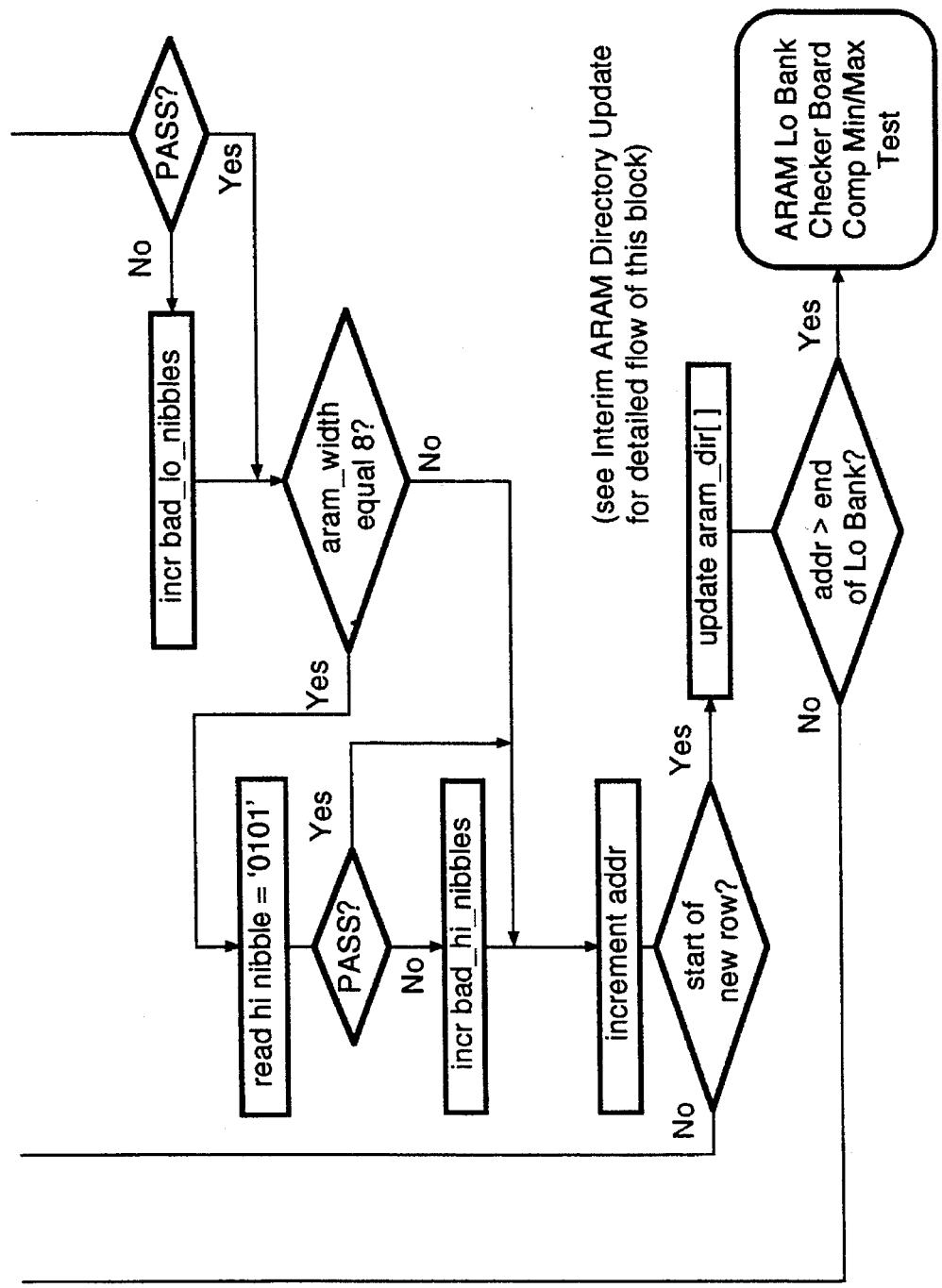
Figures 2, 6B:
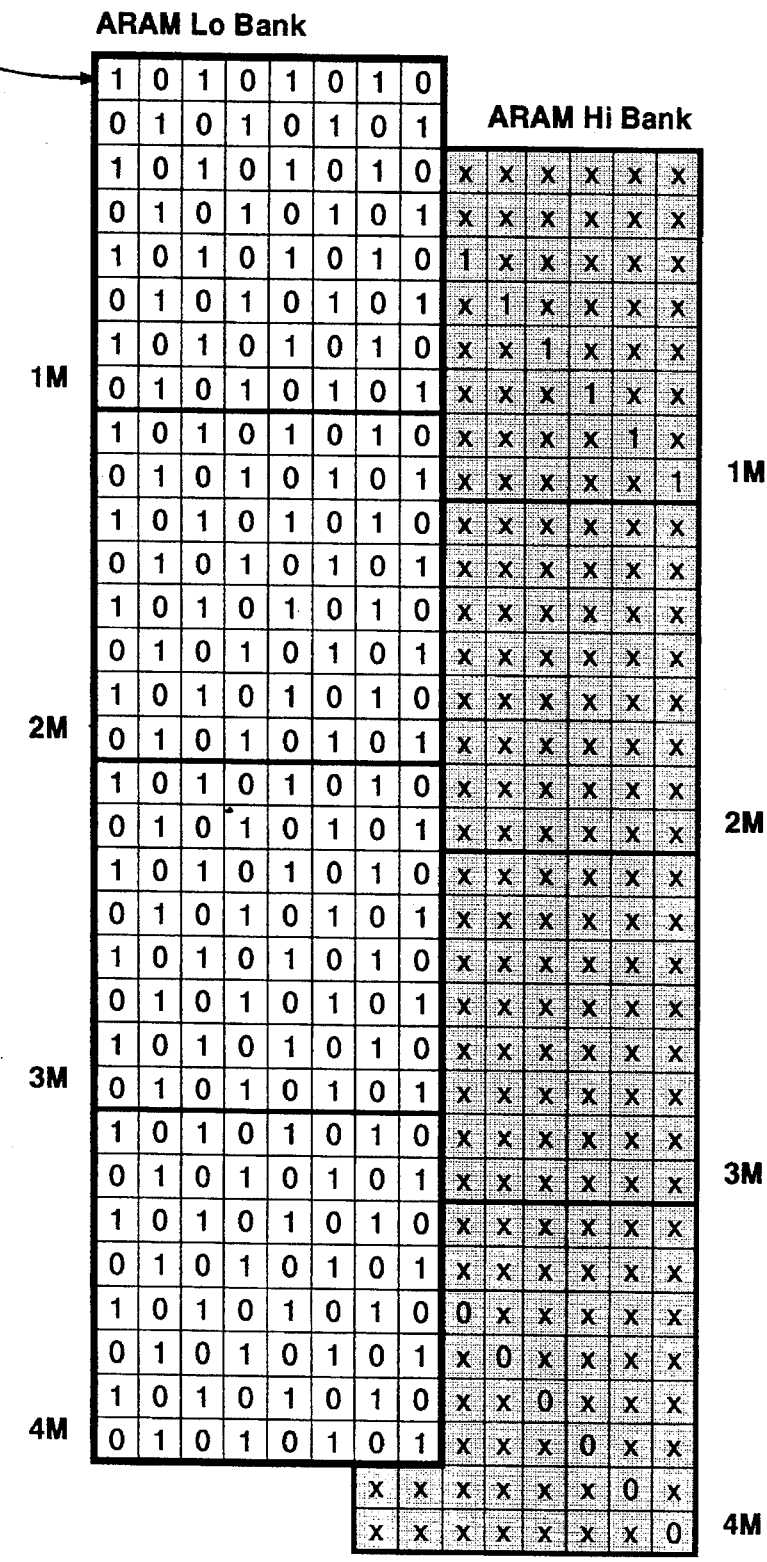

Step 5 generally describes the test of filling the ARAM lo bank memory with an alternating pattern of 1's and 0's. A logic flow diagram of step 5 is generally illustrated in FIG. 6A, and a pictorial representation of step 5 is generally represented in FIG. 6B. Referring to FIG. 6B, it can be seen that a checker board min/max pattern is written into the complete lo bank memory array. For purposes of illustration, the size of the ARAM lo bank array is assumed to be 4 megabytes.

After the checker board min/max pattern shown in step 5a (FIG. 6B) has been written into the ARAM lo bank memory, each 4 bit nibble within the ARAM lo bank memory is then checked to see whether the proper value can be read from that memory location. During steps 5–16 (Table II), each row within the respective lo bank or hi bank is tested sequentially and the results are recorded in a table labeled "ARAM_DIRECTORY" which can be referenced later when storing new voice or fax data in the ARAM. If a nibble within a particular row is found to be defective, that row is flagged in the ARAM_DIRECTORY as having some type of defect.

The ARAM_DIRECTORY is temporarily used during ARAM testing to store intermediate test results. These results are later replaced by final test results showing the ARAM fault map. The final test results can only be one of three possible conditions:

1) The row is perfect and is okay to use for voice and fax messages;
2) The row has some defects which is okay for voice messages only; or
3) The row has severe defects which preclude its use by voice or fax messages.

The intermediate test results of the ARAM _DIRECTORY table show failure information about both hi and lo nibbles of memory within a particular row. As used herein, a nibble is defined to be a 4-bit unit of data. For example, a single 1M×4 ARAM can hold 1 million 4-bit nibbles of data. Thus, in the example of FIG. 1B, two 1M×4 ARAM's are paired side by side to form a memory structure which can hold 1 million 8-bit bytes of data.

With the above architecture as shown in FIG. 1B, if a row of either pair of ARAM chips is defective, the row must be marked bad for both pair. The reason for this is that data read from the pair is taken as a unit of 8-bits (or 1 byte) of data and a single failing bit effects the entire byte. During production testing, it is important evaluate the memory quality of the ARAM memory array so as to identify and replace one or both ARAM's if the number of defects exceeds the acceptable test limits. For example, using the configuration of FIG. 1B the evaluation is performed by saving intermediate test results for each ARAM row pair and evaluating them both prior to building the final ARAM fault map. The test results for each ARAM pair are coded and stored in the ARAM_DIRECTORY row corresponding to the particular row of the memory array being tested.

Table III below shows the failure codes that may be generated while building the intermediate ARAM_DIRECTORY table, and also shows how these codes are used to build the final ARAM defect map. Note that the codes below are given in hexadecimal format.

TABLE III

| Intermediate Row Test Results: ARAM_DIRECTORY byte Description | | Final ARAM Row Defect Map: ARAM_DIRECTORY byte Description | |
|---|---|---|---|
| 00 | Hi/Lo nibble passed | 00 | OK for voice and fax |
| 08 | Hi nibble passed; Lo nibble has defects OK for voice | 80 | OK for voice only |
| 80 | Hi nibble has defects OK for voice Lo nibble passed | 80 | OK for voice only |
| 88 | Hi nibble has defects OK for voice; Lo nibble has defects OK for voice; Sum of Hi/Lo defects OK for voice | 80 | OK for voice only |
| 0F | Hi nibble passed; Lo nibble has gross defects | FF | Defective Row |
| BB | Hi/Lo nibbles have defects OK for voice; Sum of Hi/Lo defects nets gross defects | FF | Defective Row |
| BF | Hi nibble has defects OK for voice; Lo nibble has gross defects | FF | Defective Row |
| FB | Hi nibble has gross defects Lo nibble has defects OK for voice | FF | Defective Row |

TABLE III-continued

| Intermediate Row Test Results: ARAM_DIRECTORY byte Description | | Final ARAM Row Defect Map: ARAM_DIRECTORY byte Description | |
|---|---|---|---|
| FF | Hi nibble has gross defects; Lo nibble has gross defects | FF | Defective Row |

Referring back to FIG. 6A, after the ARAM lo bank memory has been mapped for faults using the checker board min/max pattern as shown in FIG. 6B, and the intermediate ARAM_DIRECTORY updated, the memory manager proceeds to step 6, which is the testing of the ARAM lo bank memory with a checker board compliment min/max pattern.

Figures 2, 7B:
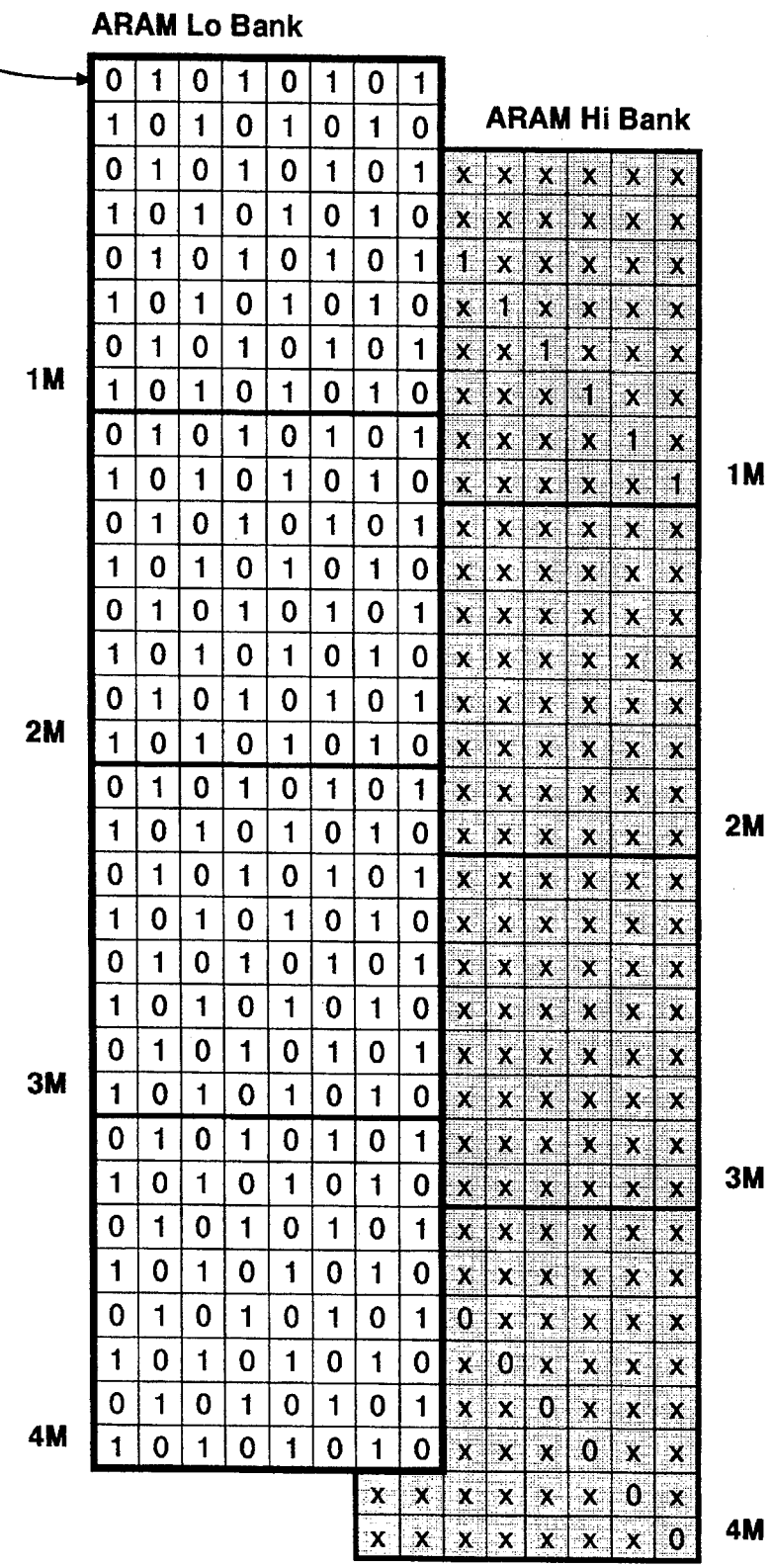

The method for step 6 is generally shown in FIG. 7A, and a pictorial illustration of step 6 is generally shown in FIG. 7B. As shown in FIG. 7B, the checker board compliment min/max pattern is complimentary to the pattern used in step 5 (FIG. 6B). In addition, the procedure for performing the test of step 6 is similar to that of step 5. After each row of the lo bank memory has been tested using the checker board compliment min/max pattern (shown in FIG. 7B), the interim ARAM$_{13}$ DIRECTORY updated with the test results from step 6, and the memory manager proceeds to step 7, which is the testing of the ARAM lo bank memory with a checker board march up pattern.

Figures 1, 8A:
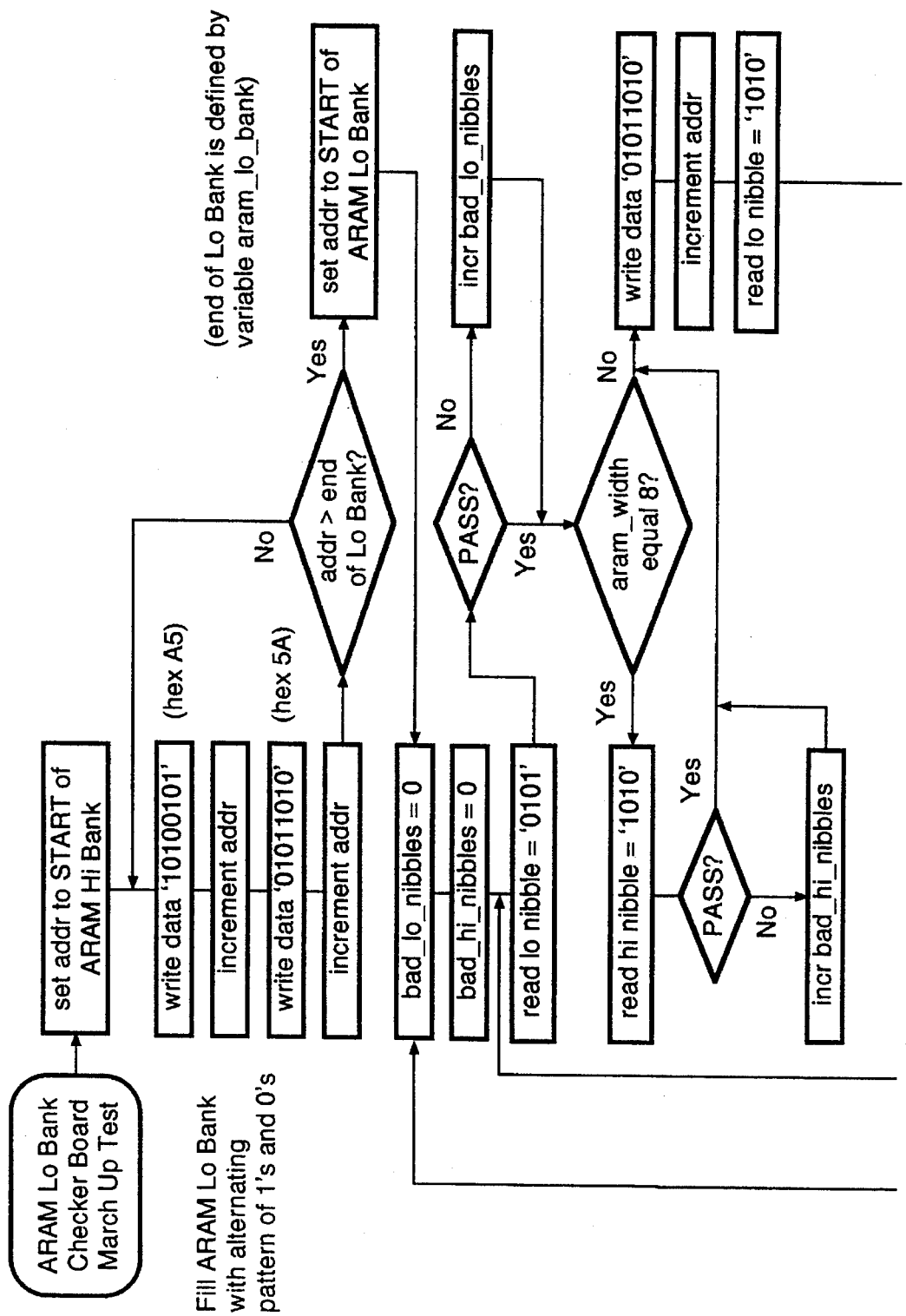
Figures 2, 8A:
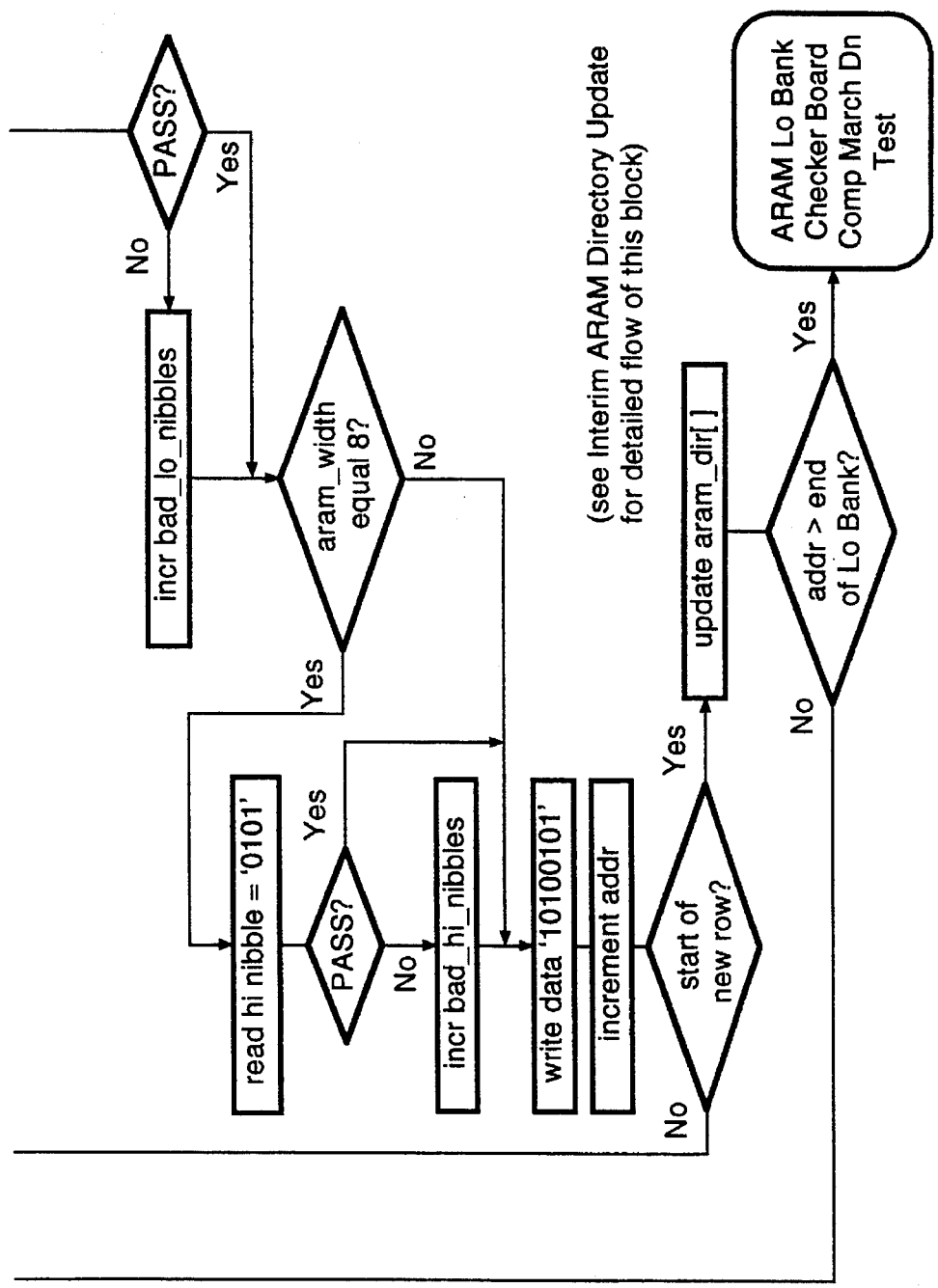
Figures 2, 8B:
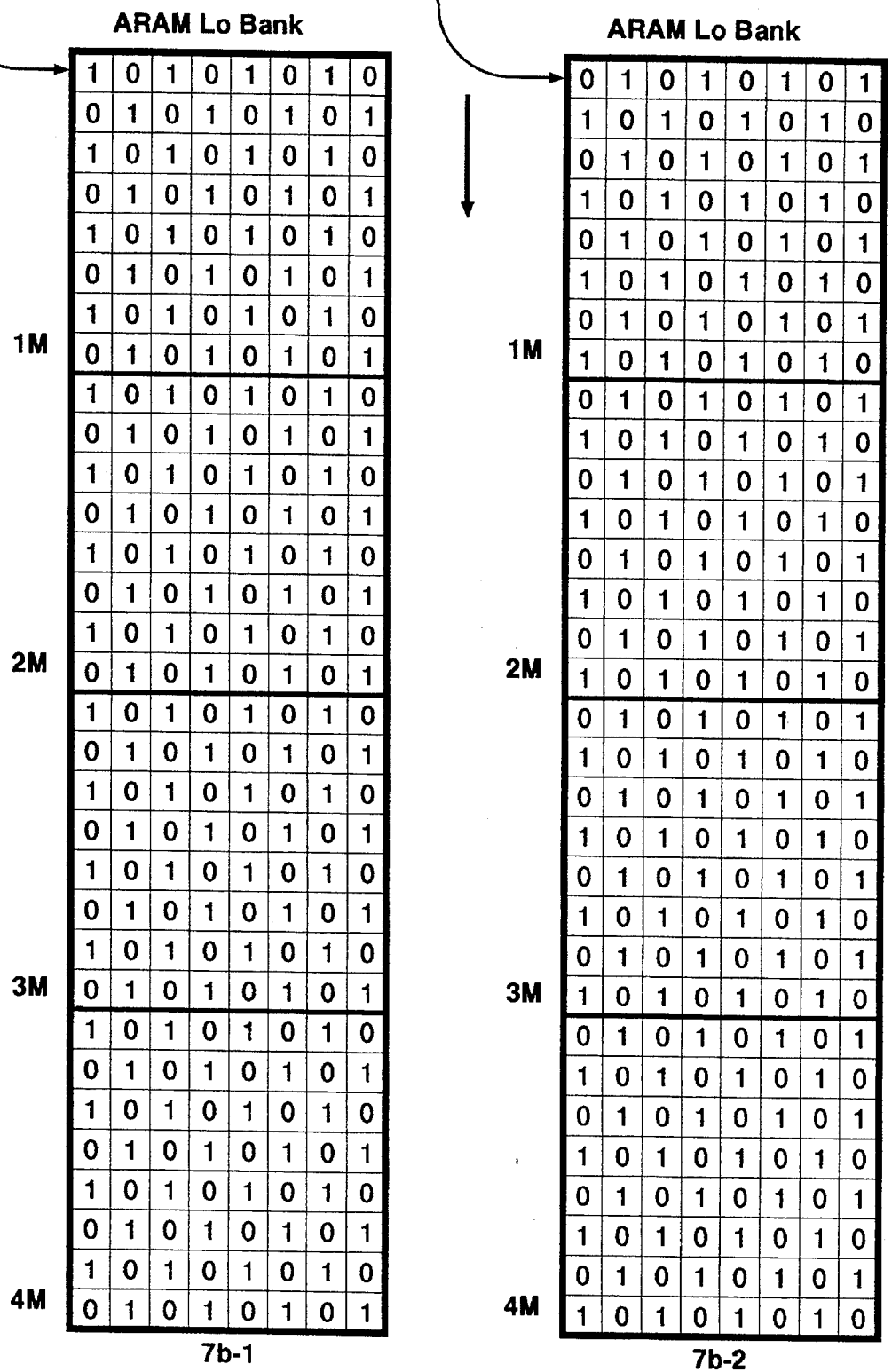

The method for step 7 is generally shown in FIG. 8A, and a pictorial illustration of step 7 is generally shown in FIG. 8B. The test comprises the steps of writing a checker board pattern into the ARAM lo bank memory as shown in step 7a of FIG. 8B. At step 7b_1, the checker board pattern is read from the ARAM lo bank, verified, and then the compliment of the pattern is written back into that same row, as shown in step 7b_2.

The process shown in step 7b_1 and 7b_2 are continued row-by-row until each of the rows within the ARAM lo bank are tested. The interim ARAM_DIRECTORY is then updated with the test results from step 7, and the memory manager then proceeds to step 8.

Figures 1, 9A:
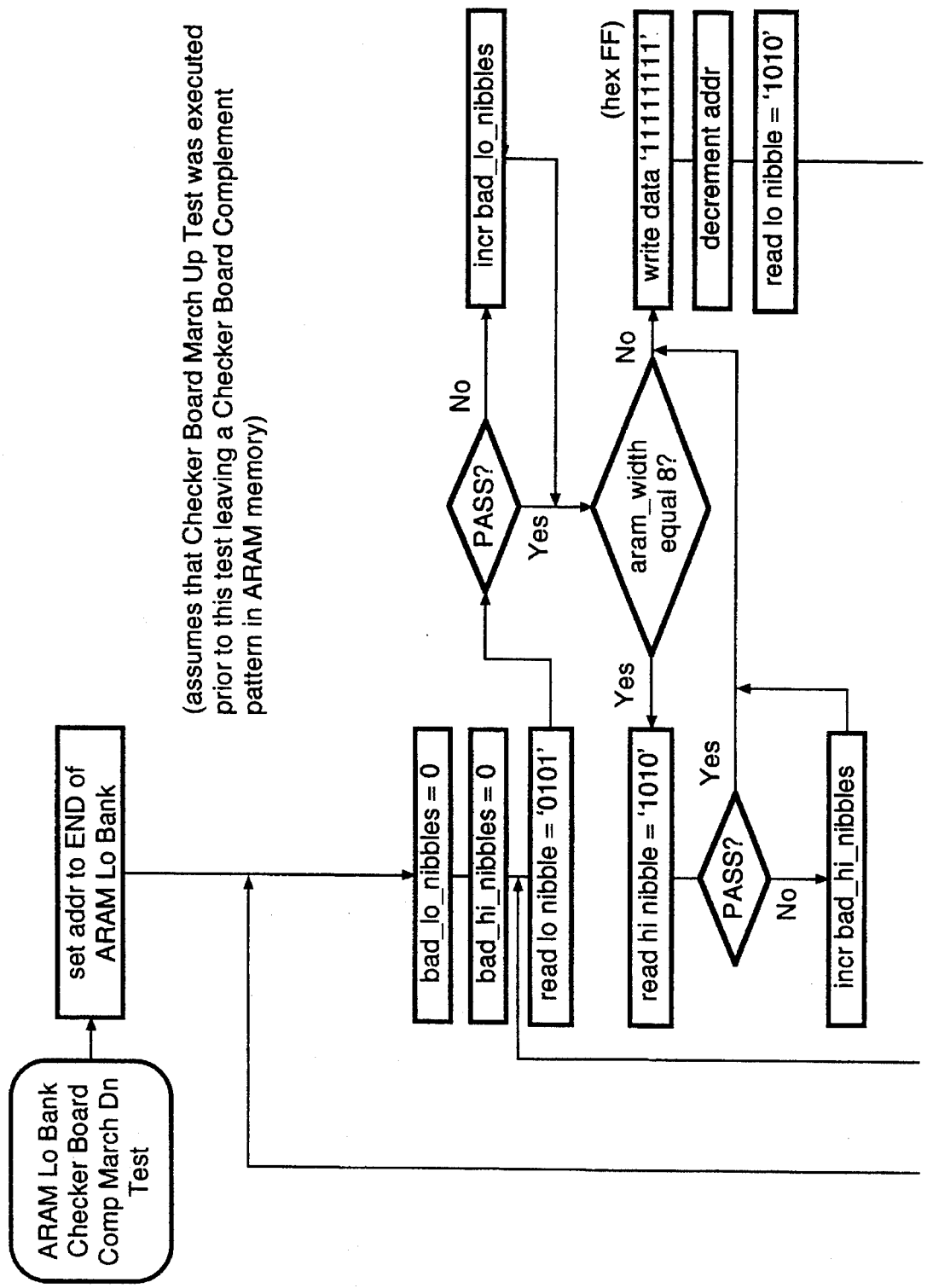
Figures 2, 9A:
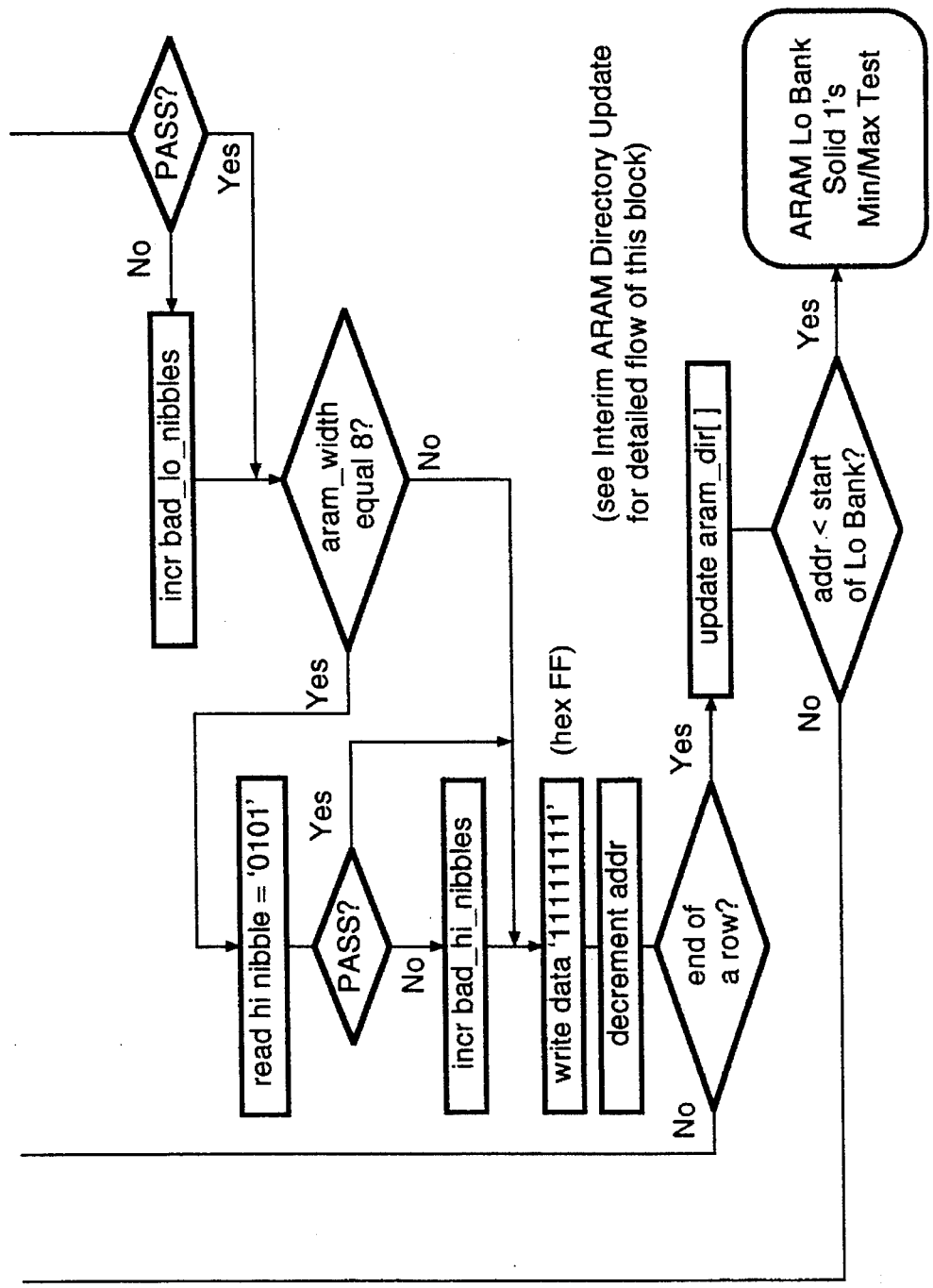
Figures 2, 9B:
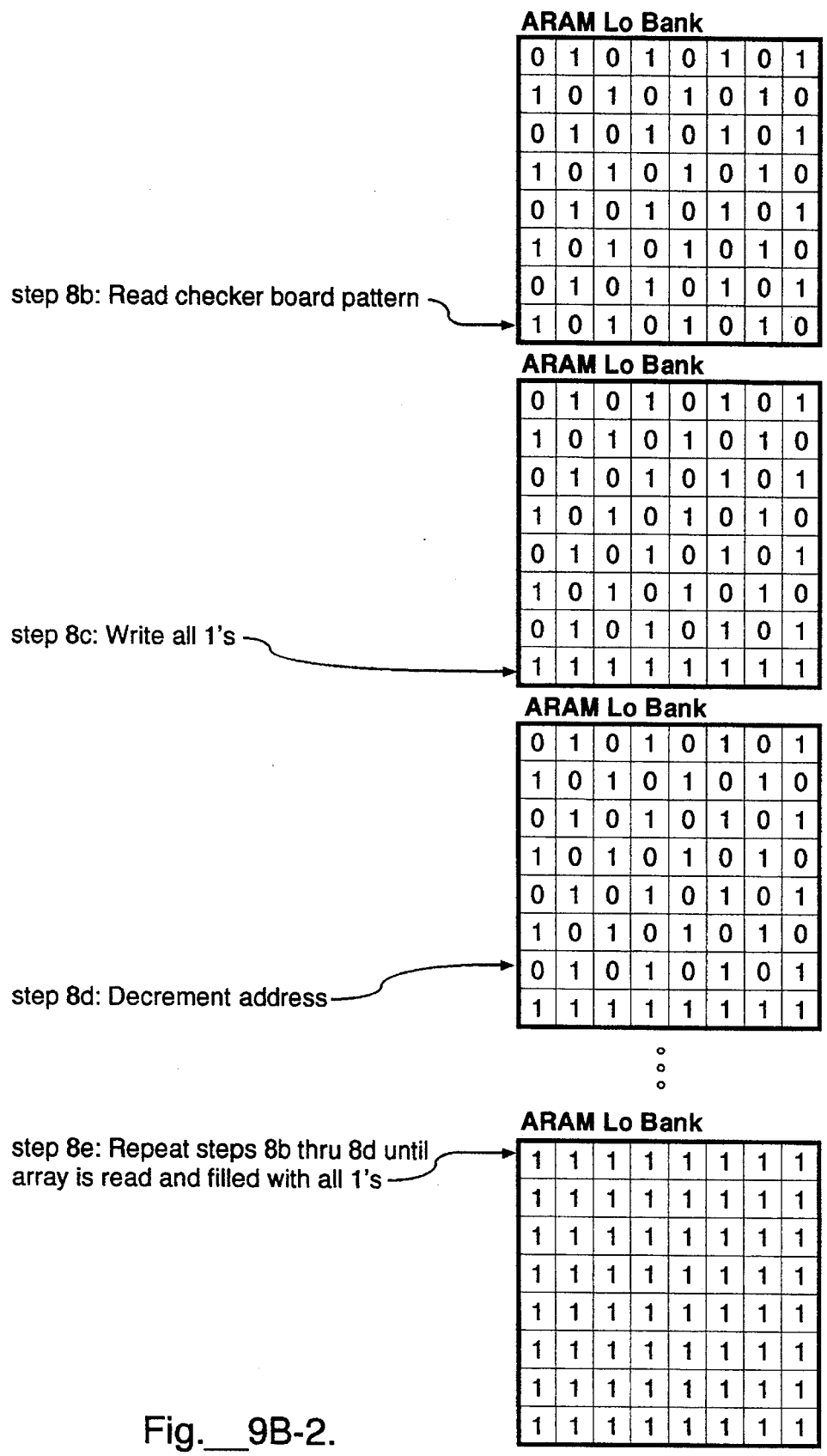

Step 8 tests the ARAM lo bank memory with a checker board march up pattern. The procedure of step 8 is generally shown in FIG. 9A, and a pictorial illustration of the procedure of step 8 is shown in FIG. 9B. This time, rather than starting at the beginning row of the ARAM lo bank, the memory manager starts at the last row of the ARAM lo bank, as shown in step 8a (FIG. 9B). At step 8b, the checker board pattern left over from step 7b_2 is read and verified. After each row has been read and the data checked for accuracy, the data in that row is replaced with all 1's. The memory manager then decrements the row address counter in order to test the next row. This is shown in step 8d. Steps of 8b–8d are repeated until the entire lo bank array is read and filled with all 1's, as shown in step 8e. At this point the interim ARAM_DIRECTORY is updated with the test results, and the memory manager proceeds to step 9.

Figure 10A:
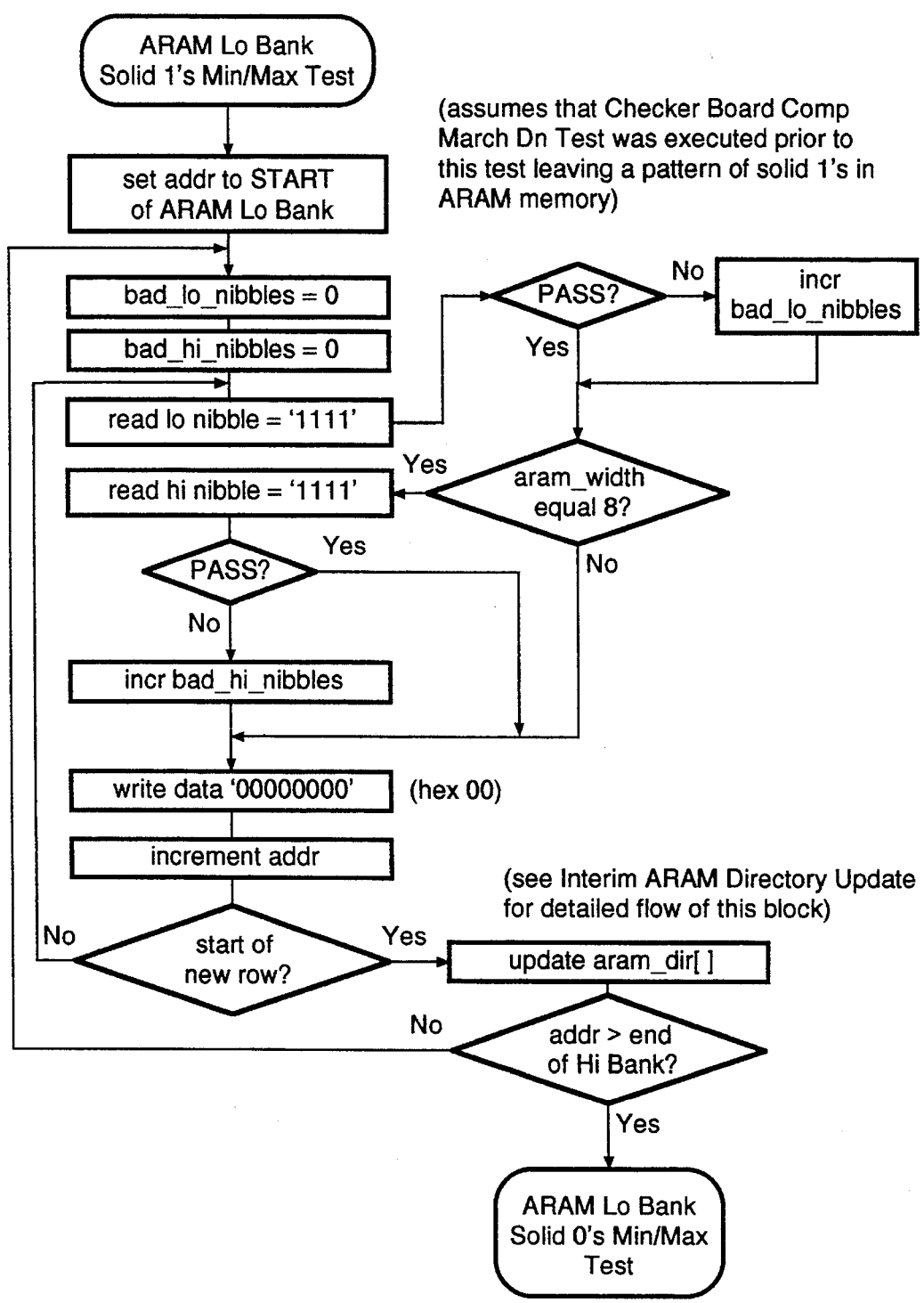
Figure 10B:
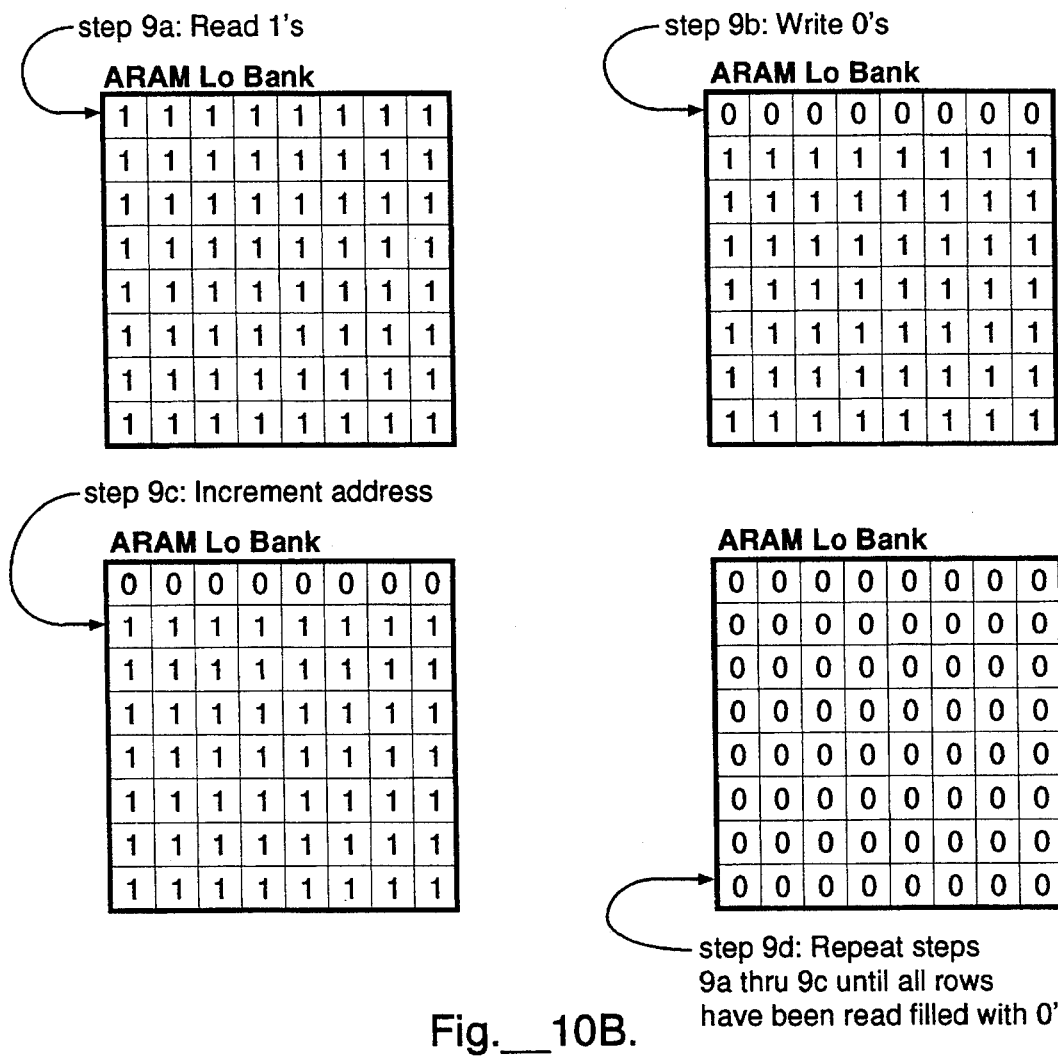

Step 9 tests the ARAM lo bank memory with a solid 1's min/max pattern. The procedure of step 9 is generally illustrated in FIG. 10A, and a pictorial illustration of step 9 is generally illustrated in FIG. 10B. As shown in FIG. 10B, the test of step 9 first proceeds by verifying that all 1's have been written into each of the rows (step 9a). Recall that the 1's are left over from the end of step 8. At step 9b, as each row is checked, the 1's within that row are replaced with 0's. At step 9c, the row address is incremented to select the next consecutive row to be tested. Steps 9a through 9c are repeated until all rows have been checked for 1's and thereafter filled with 0's, as shown in step 9d. At the end of step 9, the interim ARAM_DIRECTORY is again updated with the test results, and the memory manager proceeds to step 10.

Figure 11A:
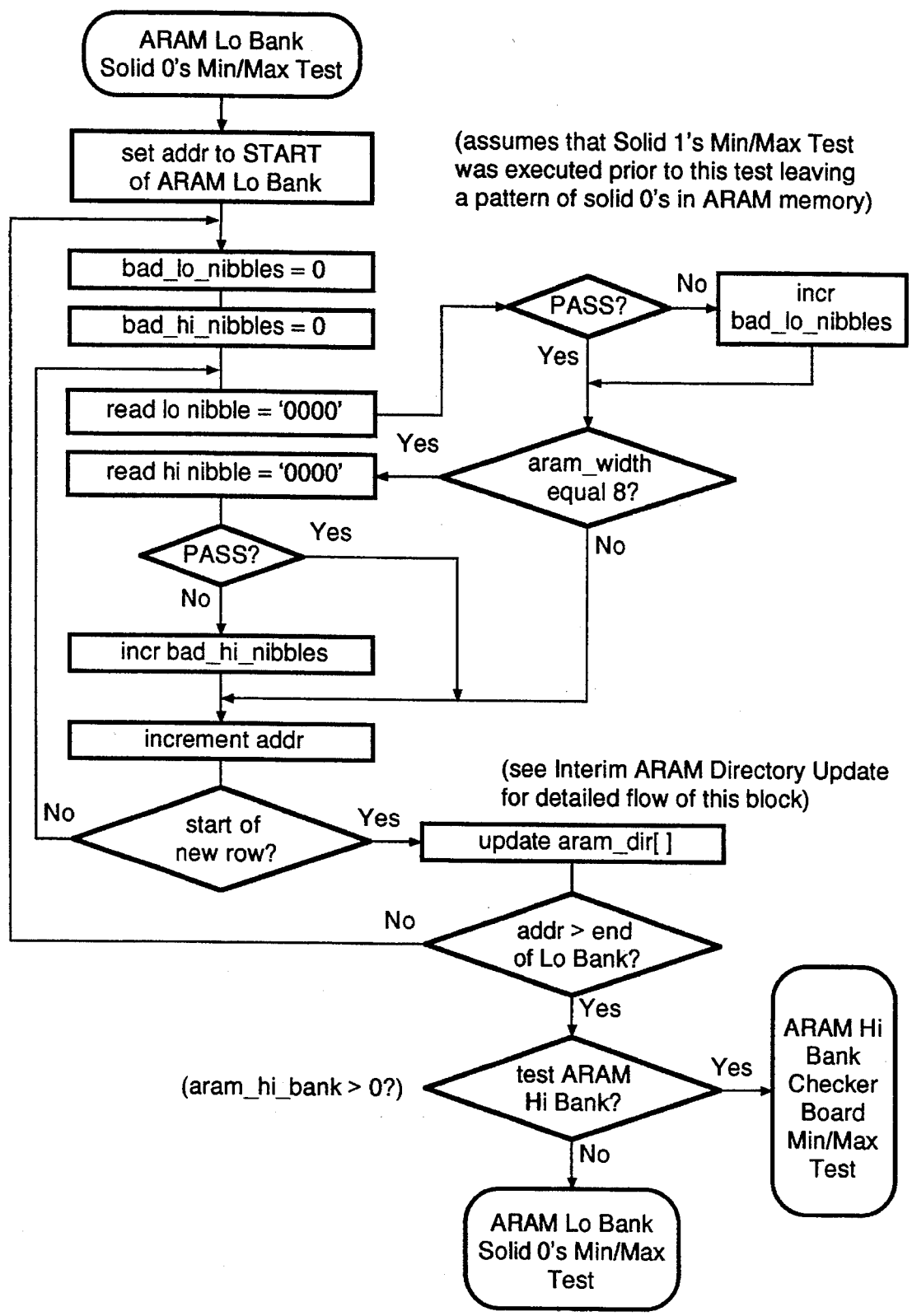
Figure 11B:
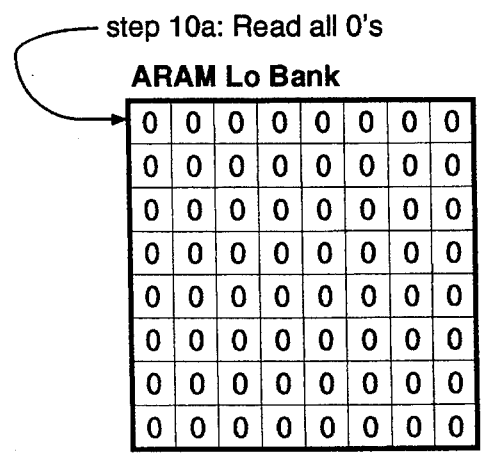
Figures 1, 12:
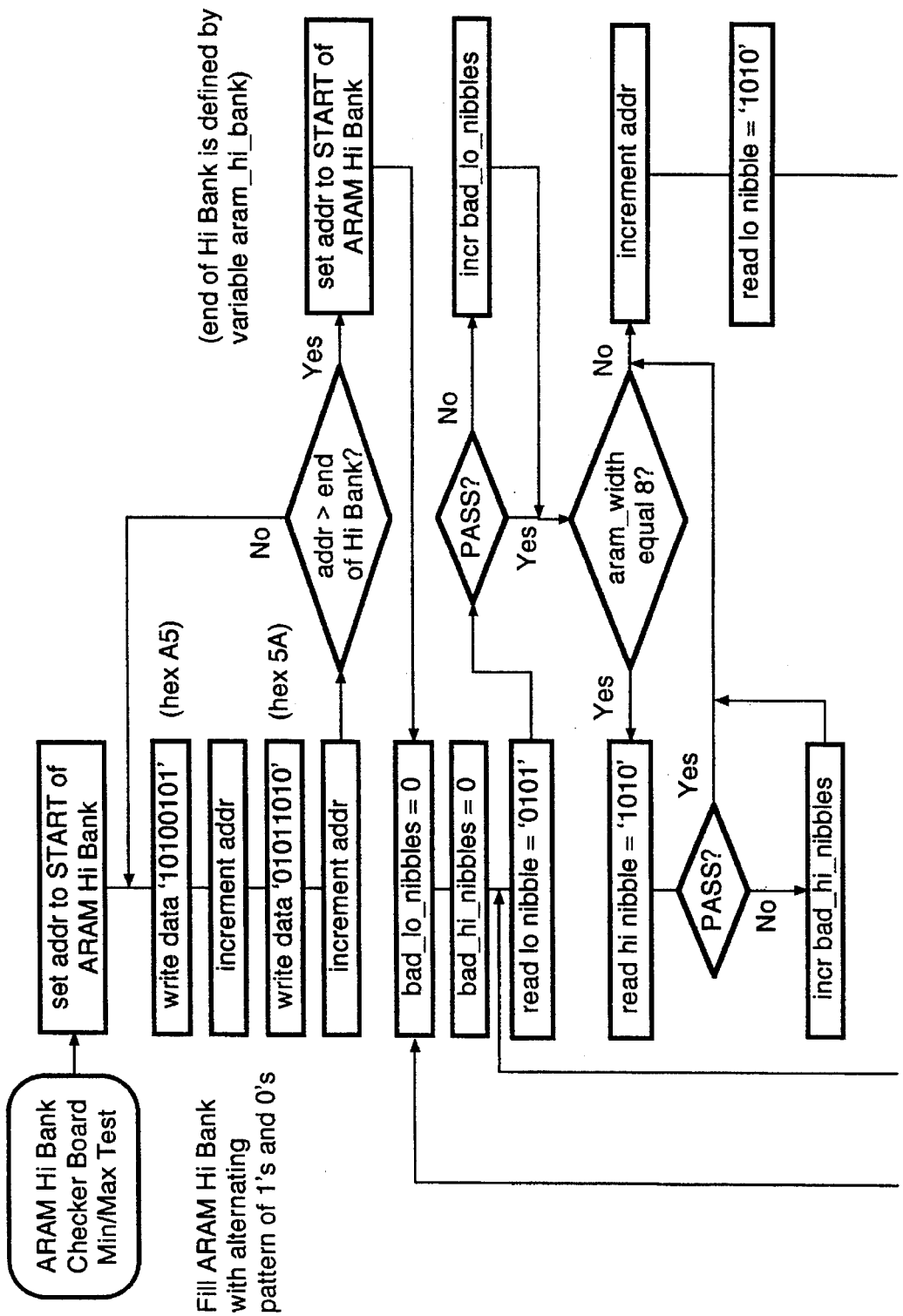
FIGS. 12–17 illustrate the various methods used for testing the ARAM hi bank memory arrays in order to determine the location of defective memory cells within each chip of the ARAM hi bank.
Figures 2, 12:
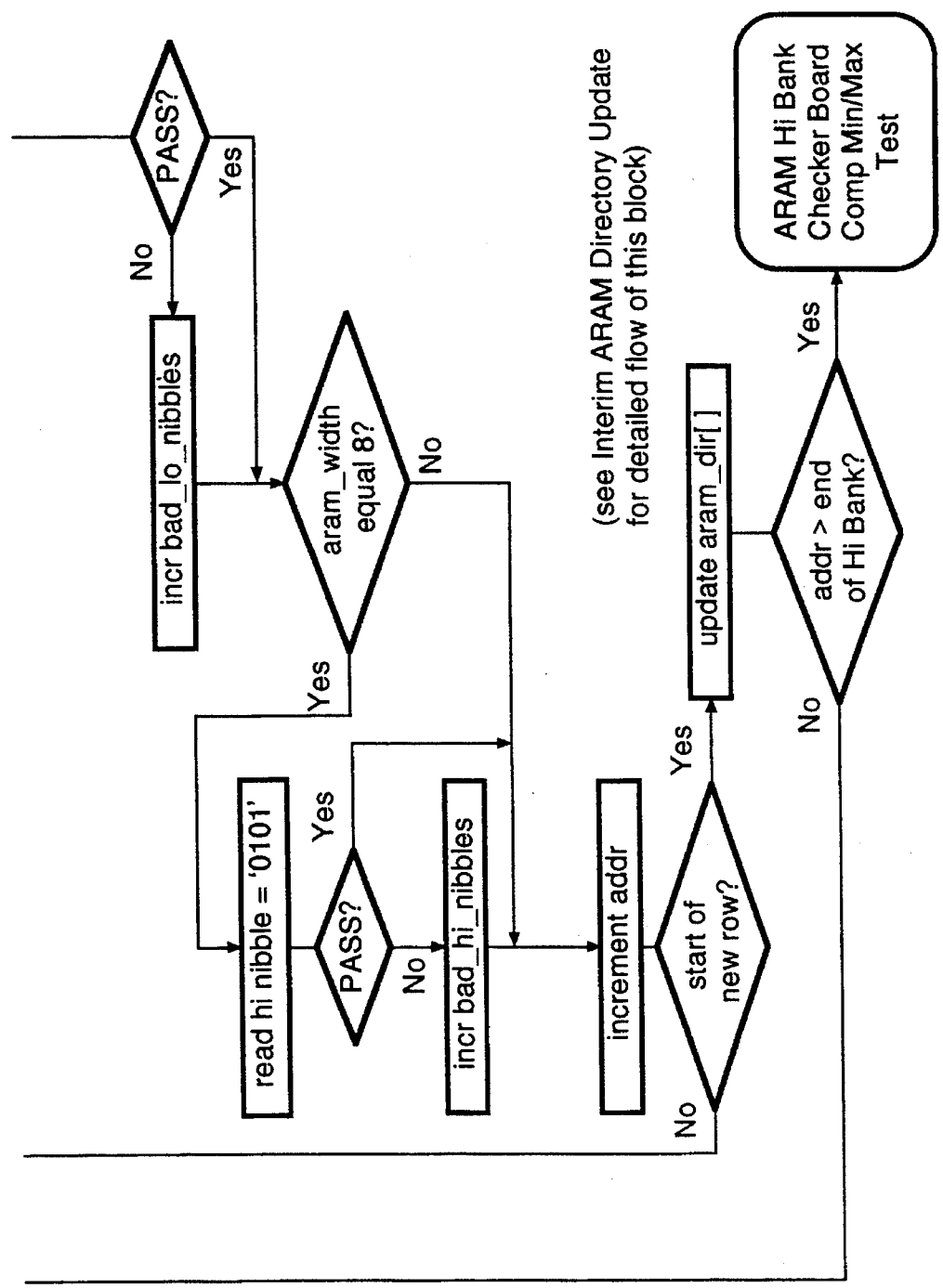
Figures 1, 13:
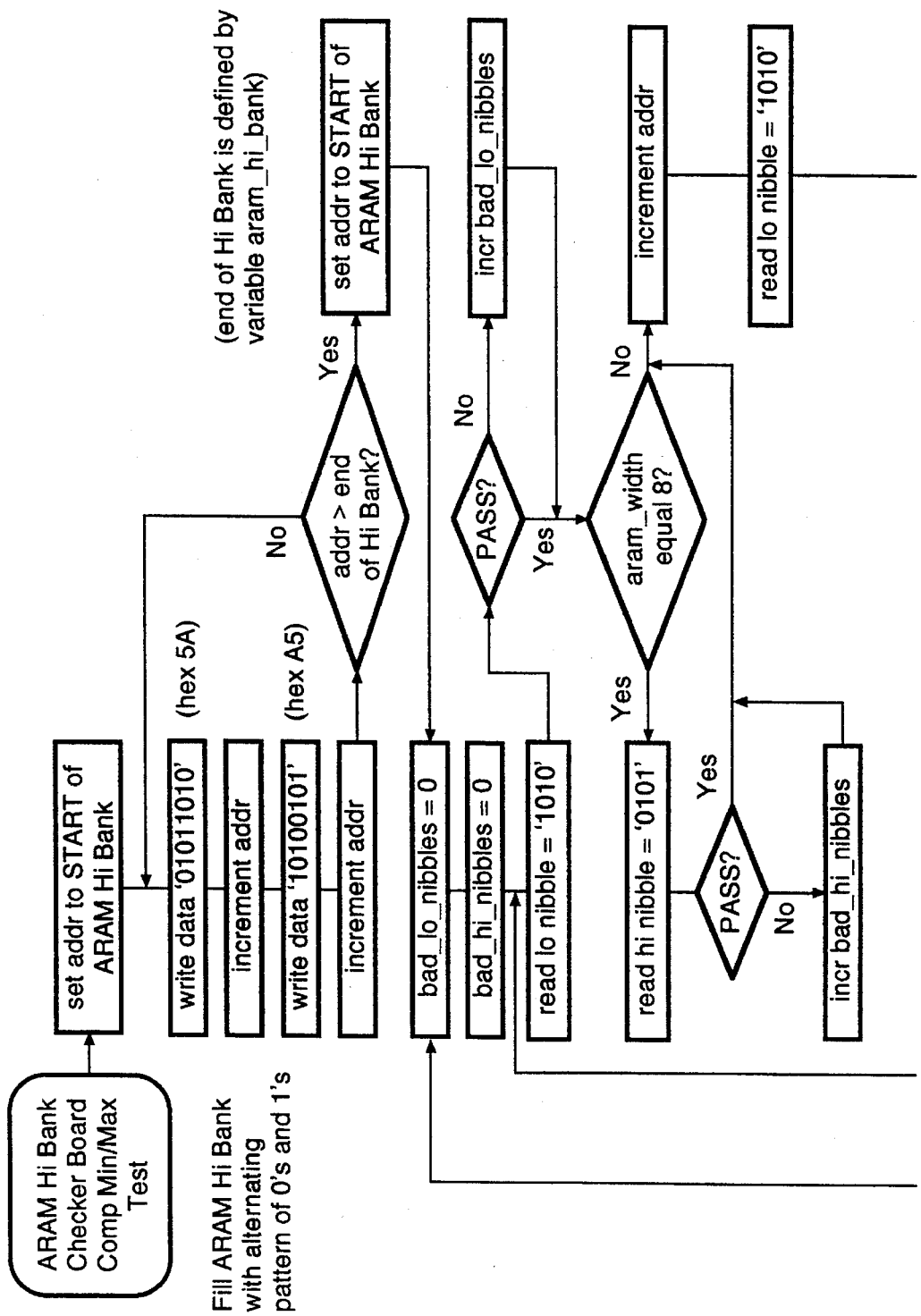
Figures 2, 13:
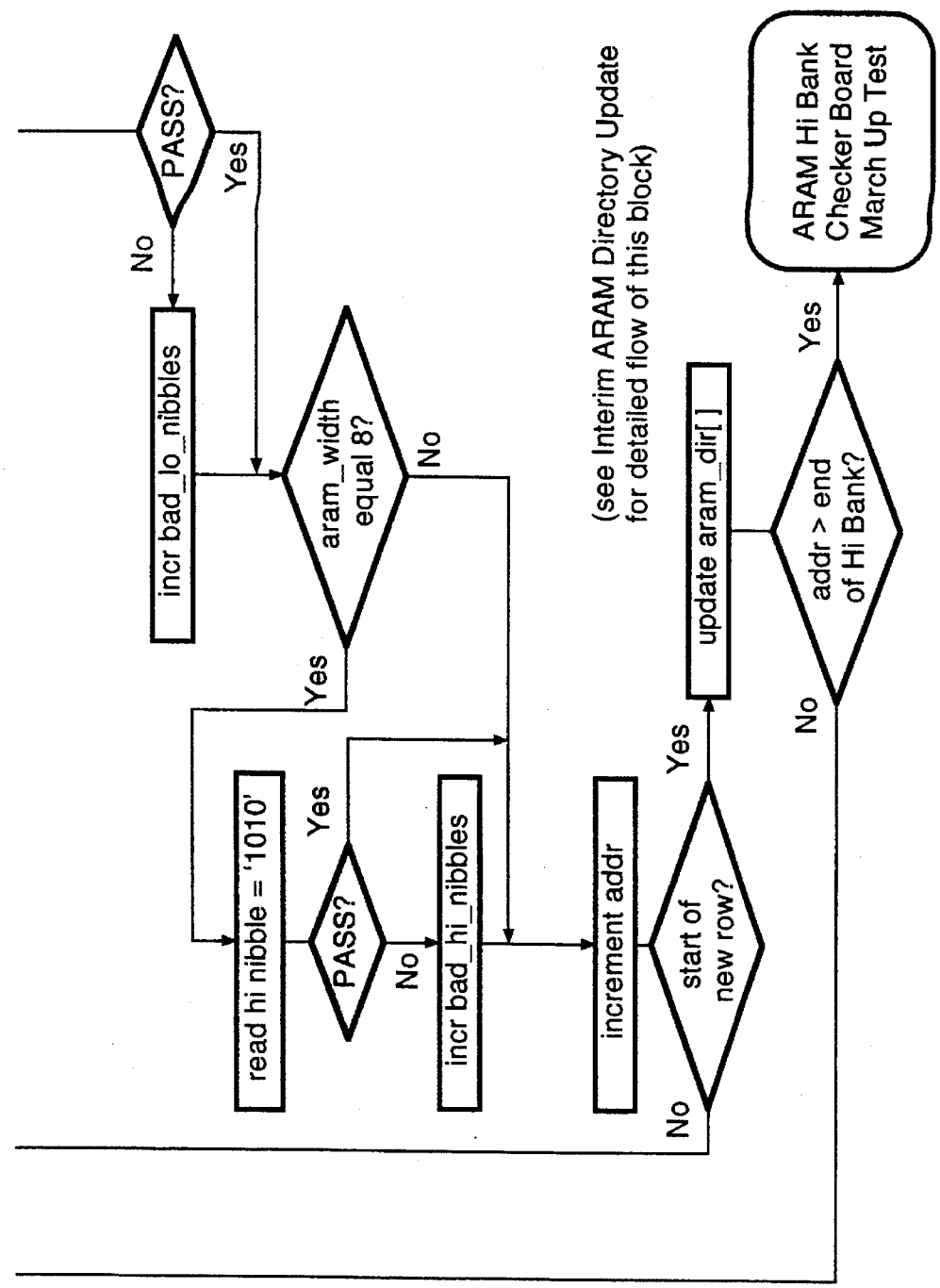
Figures 1, 14:
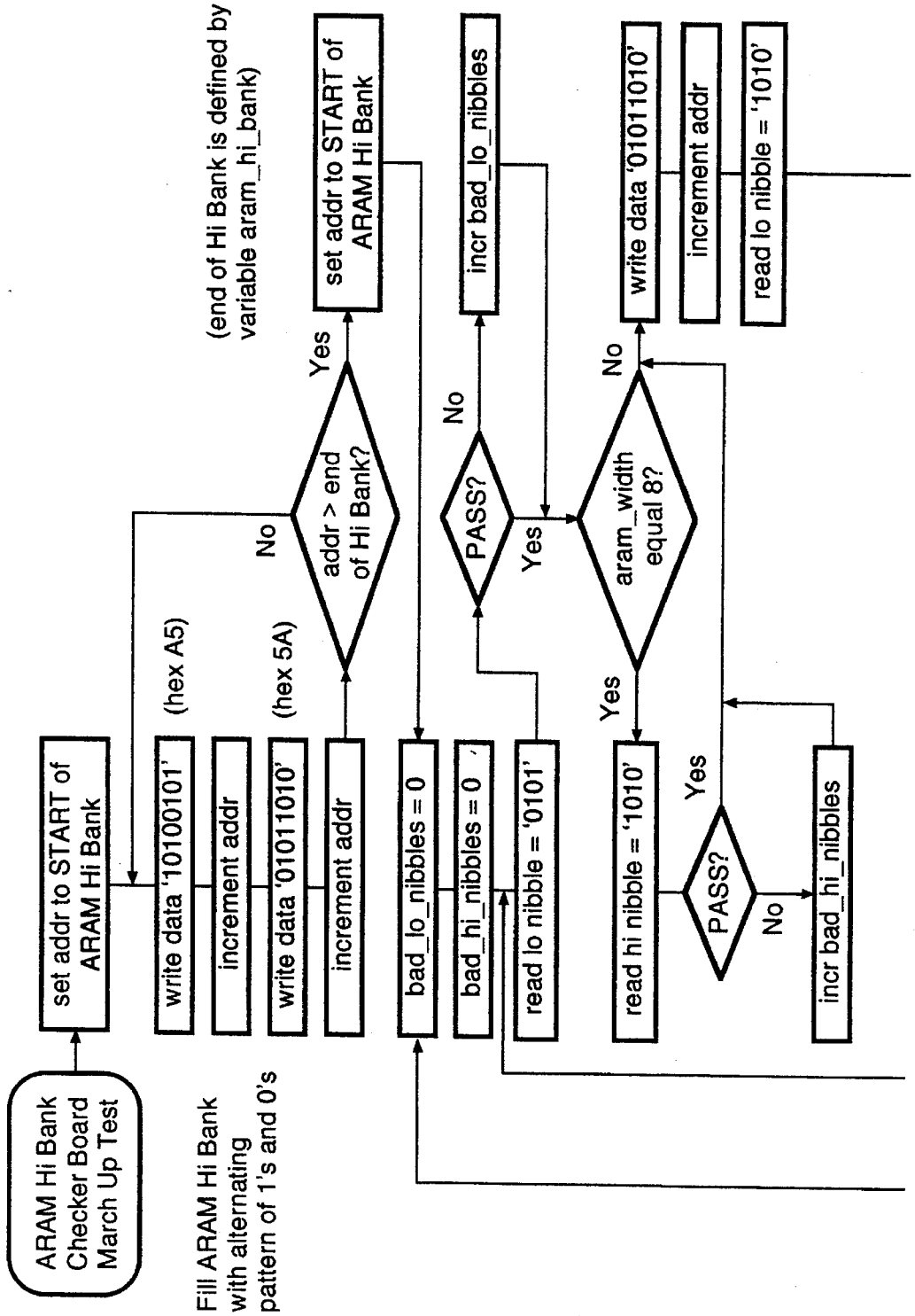
Figures 2, 14:
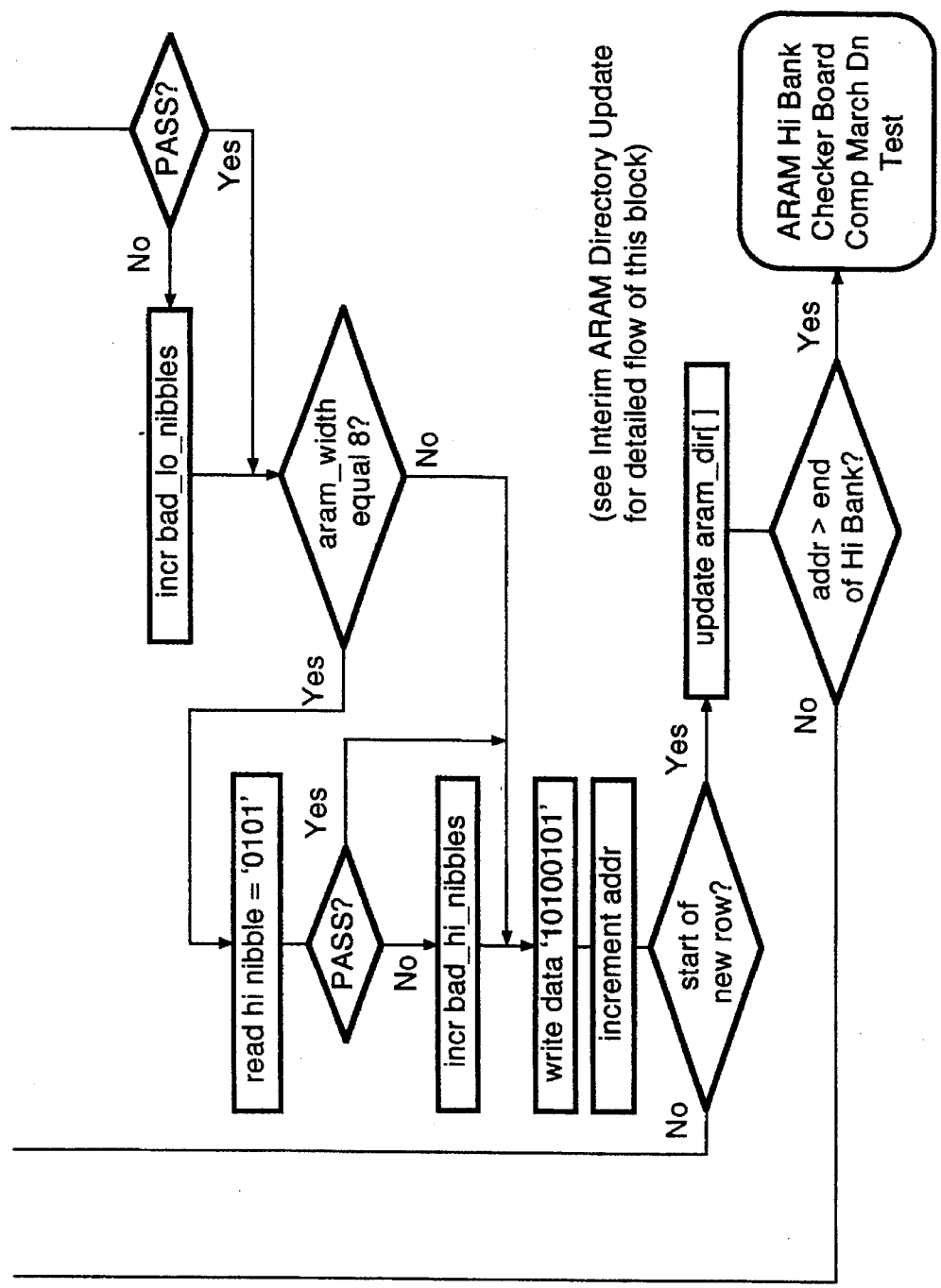
Figures 1, 15:
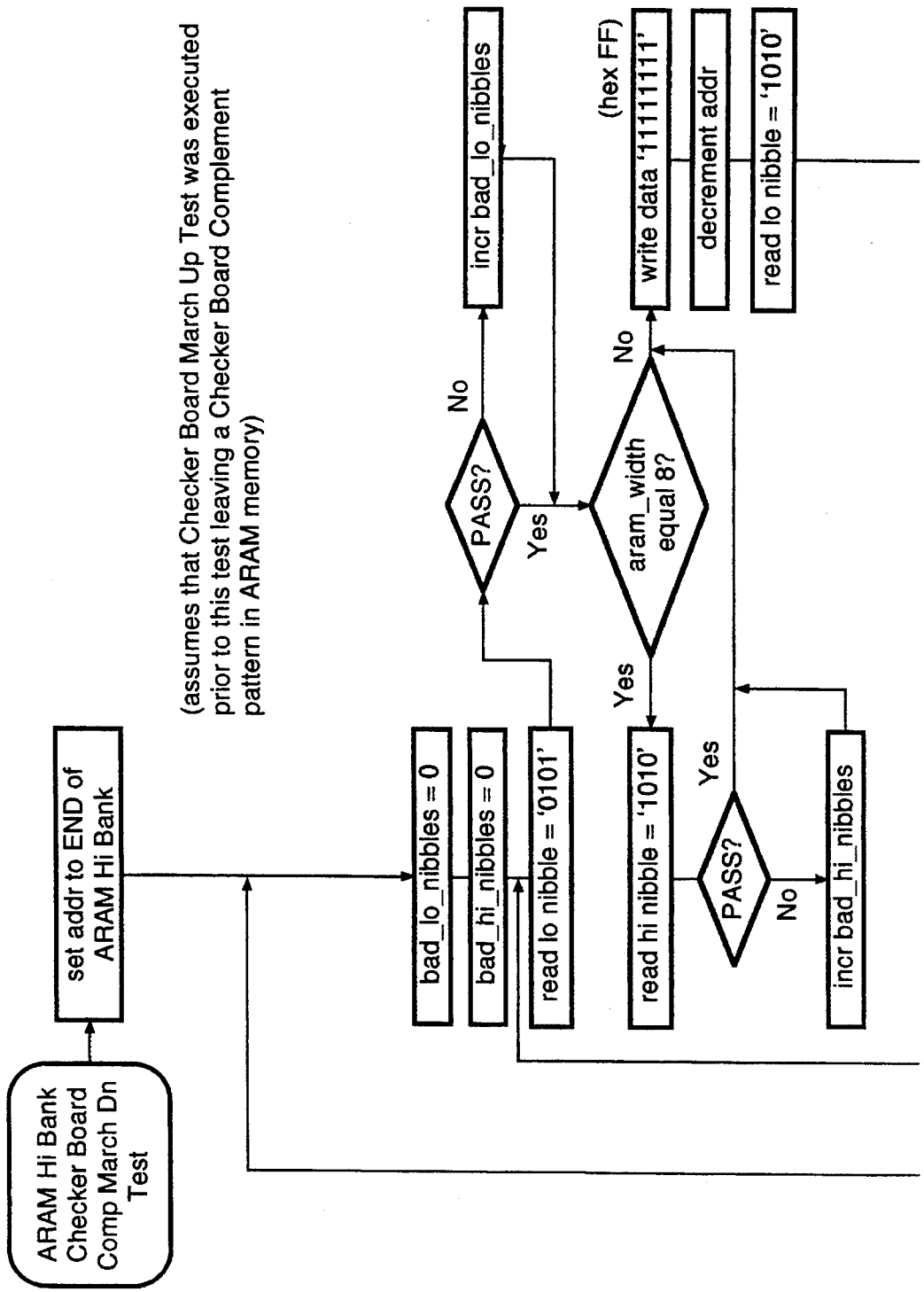
Figures 2, 15:
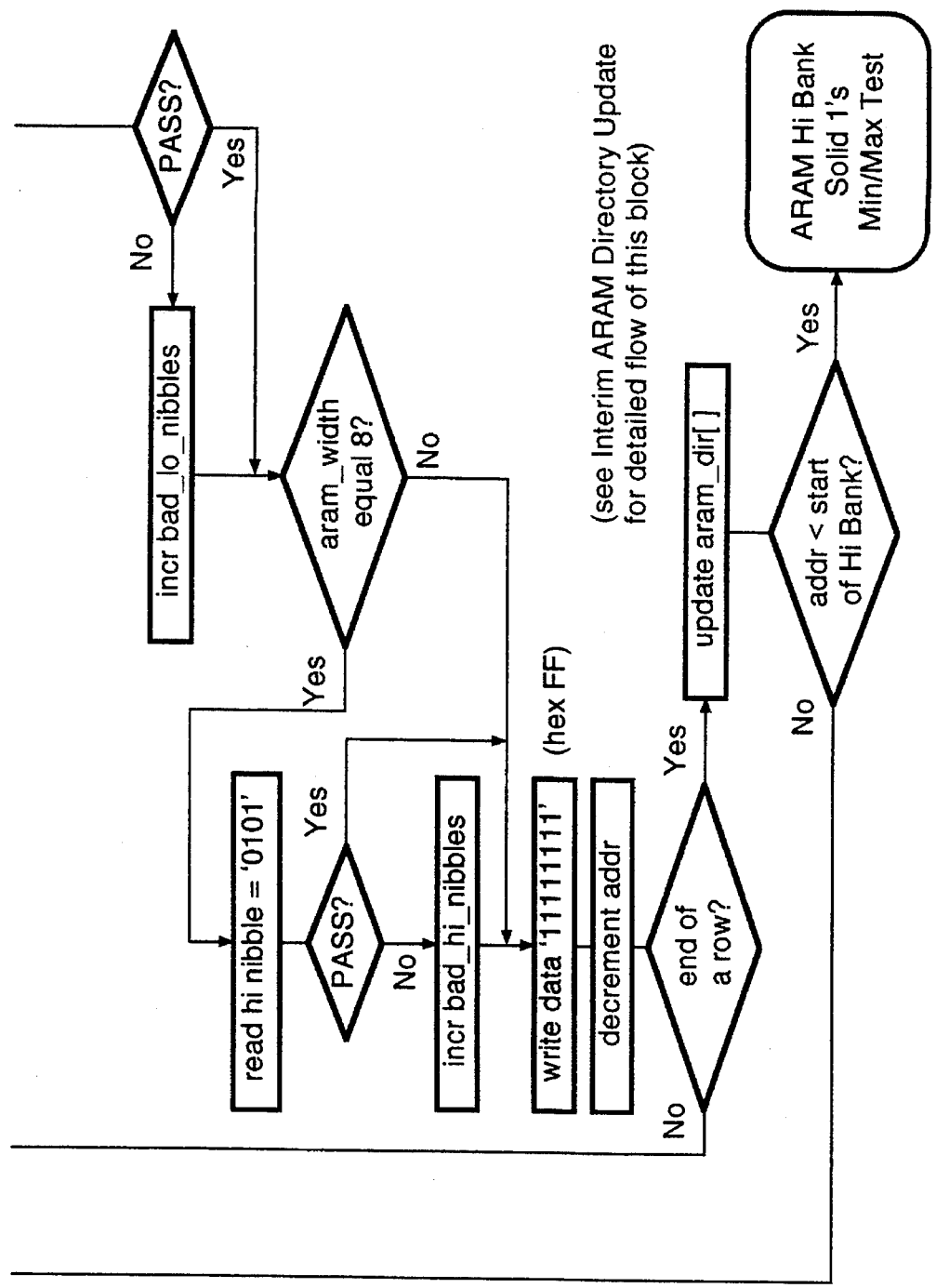
Figure 16:
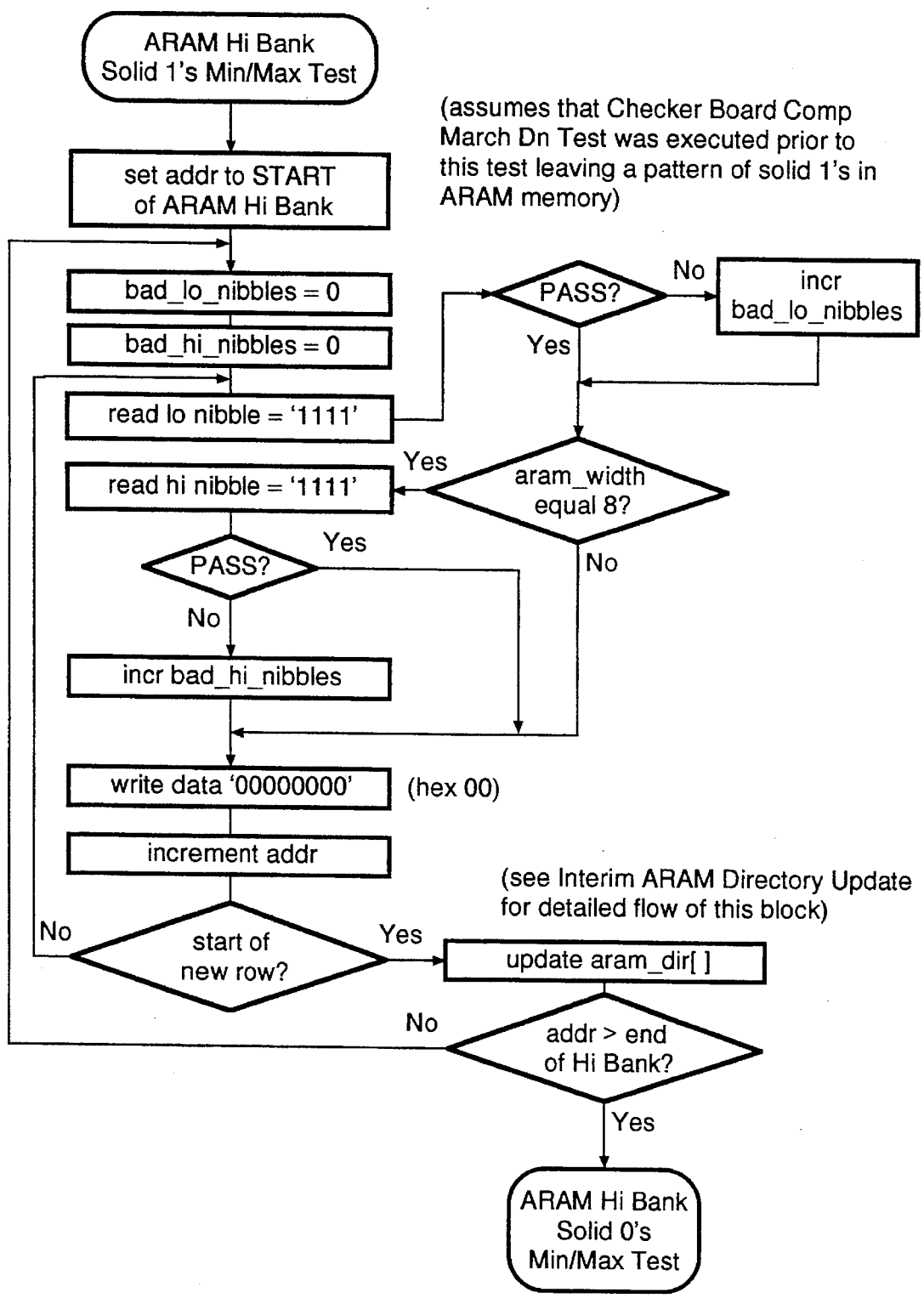
Figure 17:
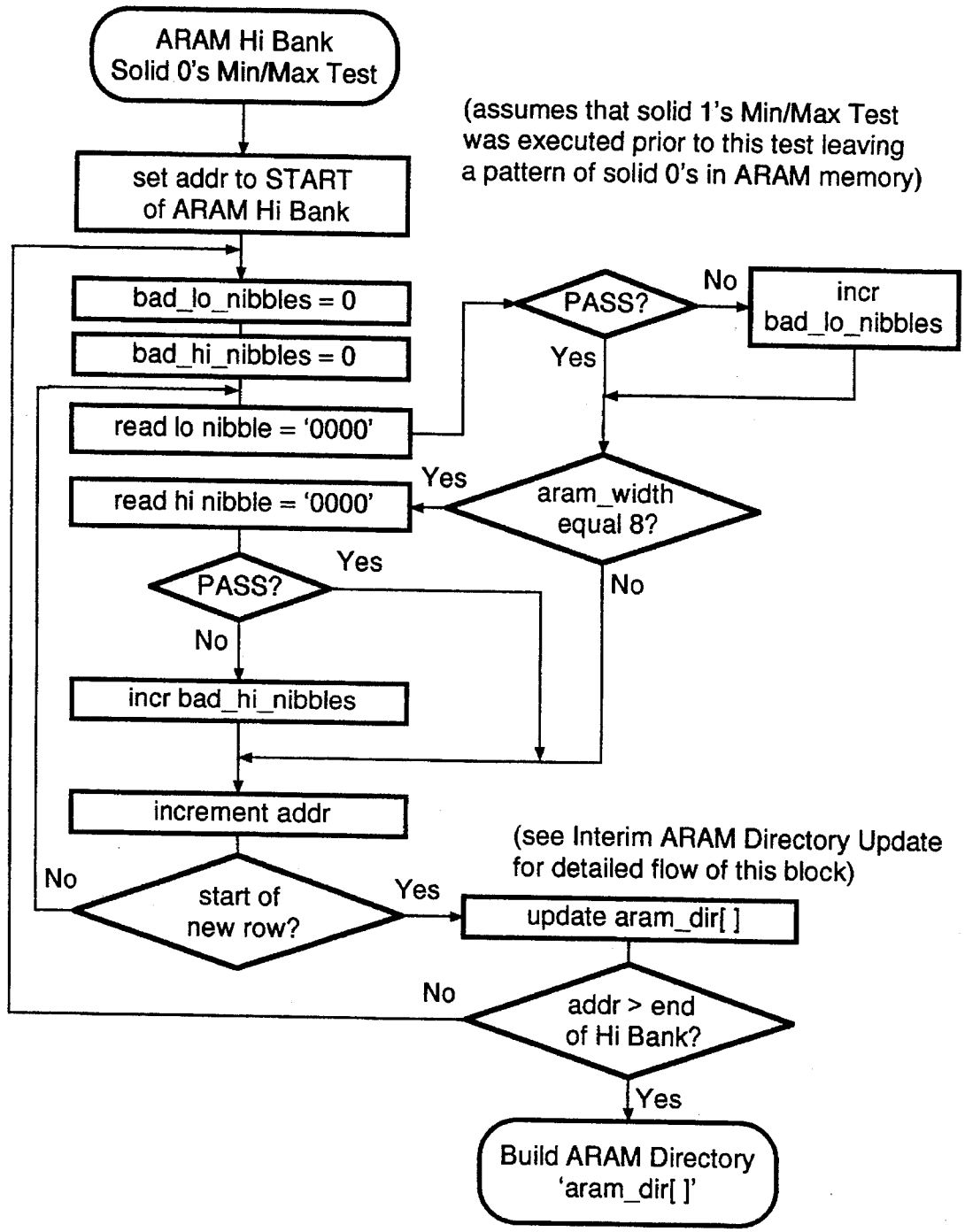

Step 10 tests the ARAM lo bank memory for all 0's within each row. The procedure for step 10 is generally shown in FIG. 11A, and a pictorial illustration is generally shown in FIG. 11B. At the end of step 9, each of the rows within the ARAM lo bank should contain all 0's. Step 10 reads the value in each of the rows within the ARAM lo bank and checks to make sure that each row contains all 0's. At the end of step 10, the interim ARAM directory is updated with the test results. At this point, the ARAM lo bank memory has been completely tested for faulty memory cell locations.

After the ARAM lo bank memory has been tested and mapped for faulty memory cell locations, the memory manager then initiates the same testing and mapping procedures upon the hi bank memory. Steps 11 through 16 generally describe the tests performed by the memory manager when mapping out faulty memory locations within the ARAM hi bank memory. A more detailed description of the procedures for executing steps 11–16 is provided in FIGS. 12–17, respectively. Note that steps 11–16 are substantially the same as steps 5–10, with the difference being that the ARAM hi bank memory is tested rather than the ARAM lo bank. Also note that if the result of step 2 indicates that there is no ARAM hi bank memory present, the memory manager will skip steps 11–16, and proceed directly to step 17.

Figure 25:
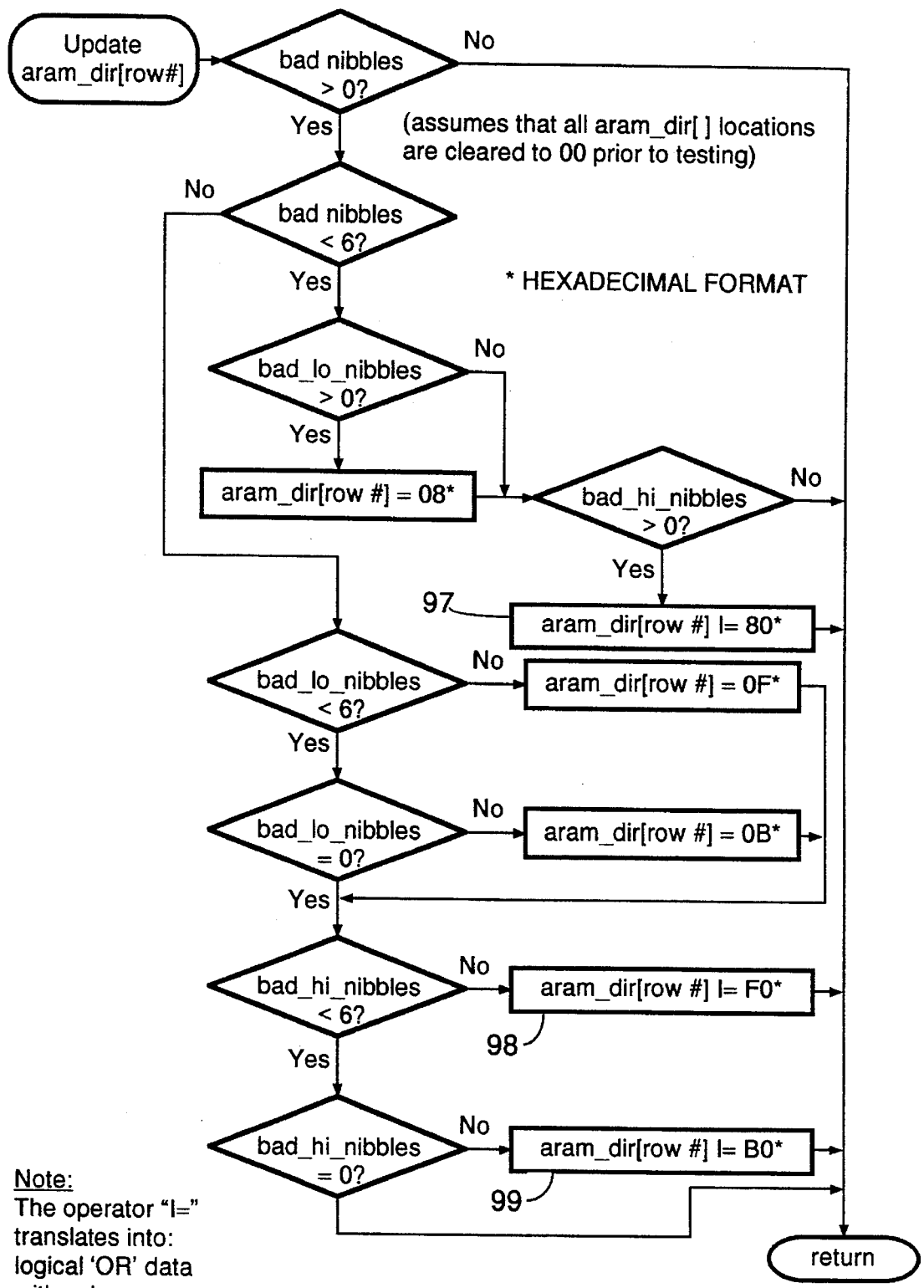
FIG. 25 illustrates a method of the present invention for updating an interim ARAM_DIRECTORY table during functional testing of the ARAM memory array for faulty memory cell locations.

The procedure for updating the interim ARAM_DIRECTORY is generally shown in FIG. 25. Note that some numerical values within FIG. 25 are in hexadecimal format, while other numerical values are in decimal format. The numerals which are written in hexadecimal format are indicated by the symbol "*". Also note that the operator "|=" translates into a logical "OR" operation, meaning that the data to the left of the "|=" operator is logical "Ored" with the value (in hexadecimal) on the right side of the operator. This logical OR operator is used in steps 97, 98 and 99 of FIG. 25.

After the above described testing is completed, the ARAM_DIRECTORY is scanned and the final ARAM Row Defective Map Table is built and stored in the same ARAM_DIRECTORY, replacing the interim results. During the scan, statistics are collected for each ARAM and used to determine the overall memory quality of the ARAM memory array. The evaluation of the memory quality of the ARAM memory array is discussed in greater detail below.

Figures 1, 18:
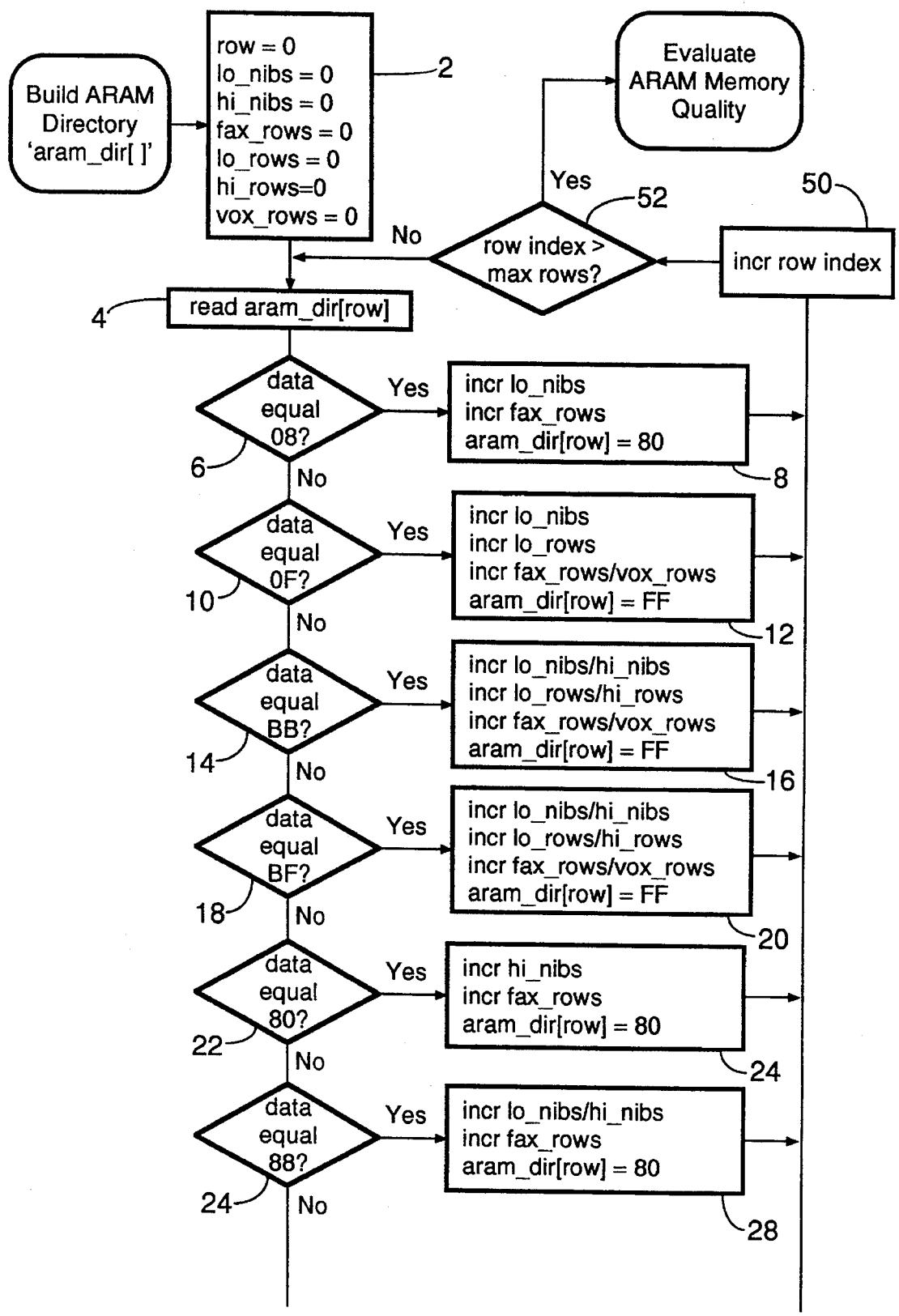
FIG. 18 illustrates a method of the present invention for building an ARAM_DIRECTORY table used for determining memory rows within the ARAM array which are either suitable for storage of fault non-tolerant data, or suitable for storage of fault tolerant data, or which are not suitable for storage of any data.

FIG. 18 illustrates the procedure of step 17 for building the final ARAM row defective map table. Note that the data values shown in FIG. 18 are given in hexadecimal format. As used in this application and in the appended claims, ARAM_DIRECTORY, ARAM_DIRECTORY table, ARAM row defective map table, and ARAM fault mapping and message directory all refer to the table which is built following the procedures shown in FIG. 18.

An example of the final ARAM_DIRECTORY table is shown in FIG. 19A. The table of FIG. 19A corresponds to an 8M×8 bit ARAM memory array, such as that shown in FIG. 1D. The memory array 110d of FIG. 1D comprises 8192 rows, with each row having 1024 8-bit unit partitions or words. The ARAM_DIRECTORY table of FIG. 19A contains an equal number of rows as contained in the ARAM memory array 110d. Thus, in the example shown in FIG. 19A, the ARAM_DIRECTORY table is shown to have 8192 rows, with each row containing 8 bits of data.

The ARAM_DIRECTORY table is not only used to map bad ARAM rows, but it is also used to record row ownership by voice and fax message numbers. Each entry or row within the ARAM_DIRECTORY table is 8-bits wide. FIG. 19B illustrates the status word bit definitions for each of the 8 bits within each row of the ARAM_DIRECTORY. Bit-7 of each row is used to indicate perfect/imperfect ARAM rows. A "0" indicates a perfect row, and a "1" indicates an imperfect row. Therefore, if the value 00 hex is stored within a row, that row is an unused perfect row which is suitable for storage of both facsimile data and voice data. On the other hand, if the value 80 hex is stored within a row, the row is an unused imperfect row which is suitable for storage of voice data only. Bit 6 of each row indicates the type of message occupying that row. A "0" indicates that a voice message is stored within the row, and a "1" indicates that a fax message is stored within the row. Bits 5–0 in each row are used for assigning a particular message number to the stored voice or fax message. Message numbers 1–63 are available for both voice and fax messages. Note that fax message number 1 will translate into message number 65 when bit-6 is set to a "1", indicating the presence of a fax message Therefore, fax messages are deliberately numbered 65 through 127 so that bit-6 is automatically set to a "1" when storing faxes. Similarly, voice messages are deliberately numbered 1–63 so that bit-6 is automatically set to a "0" when storing voice messages. A message number of 0 indicates a row that is not currently in use. Such a row may be used for new messages. A message number of 255 or FF hex is reserved to mark rows with severe defects which are not to be used for storage of voice or fax messages. Message number 64 is reserved, and is unused at the present time.

FIG. 19C illustrates a sample ARAM_DIRECTORY. As it can be seen, each of the rows contains a message number which indicates (1) the row quality (2) the type of message stored within that row (voice, fax, or unused), and (3) the message number associated with the message stored within that row.

Step 18 generally describes the test used for evaluating the memory quality of the ARAM memory array. The ARAM memory quality standards are shown below in Table IV.

TABLE IV

ARAM Memory Quality Standards

1) Seventy-four percent (74%) of the rows of any individual ARAM must be perfect.
2) Seventy percent (70%) of the combined rows of all ARAM's must be perfect.
3) Ninety-four percent (94%) of the combined rows of all ARAM's must be suitable for storage of voice data.

Figures 2, 21:
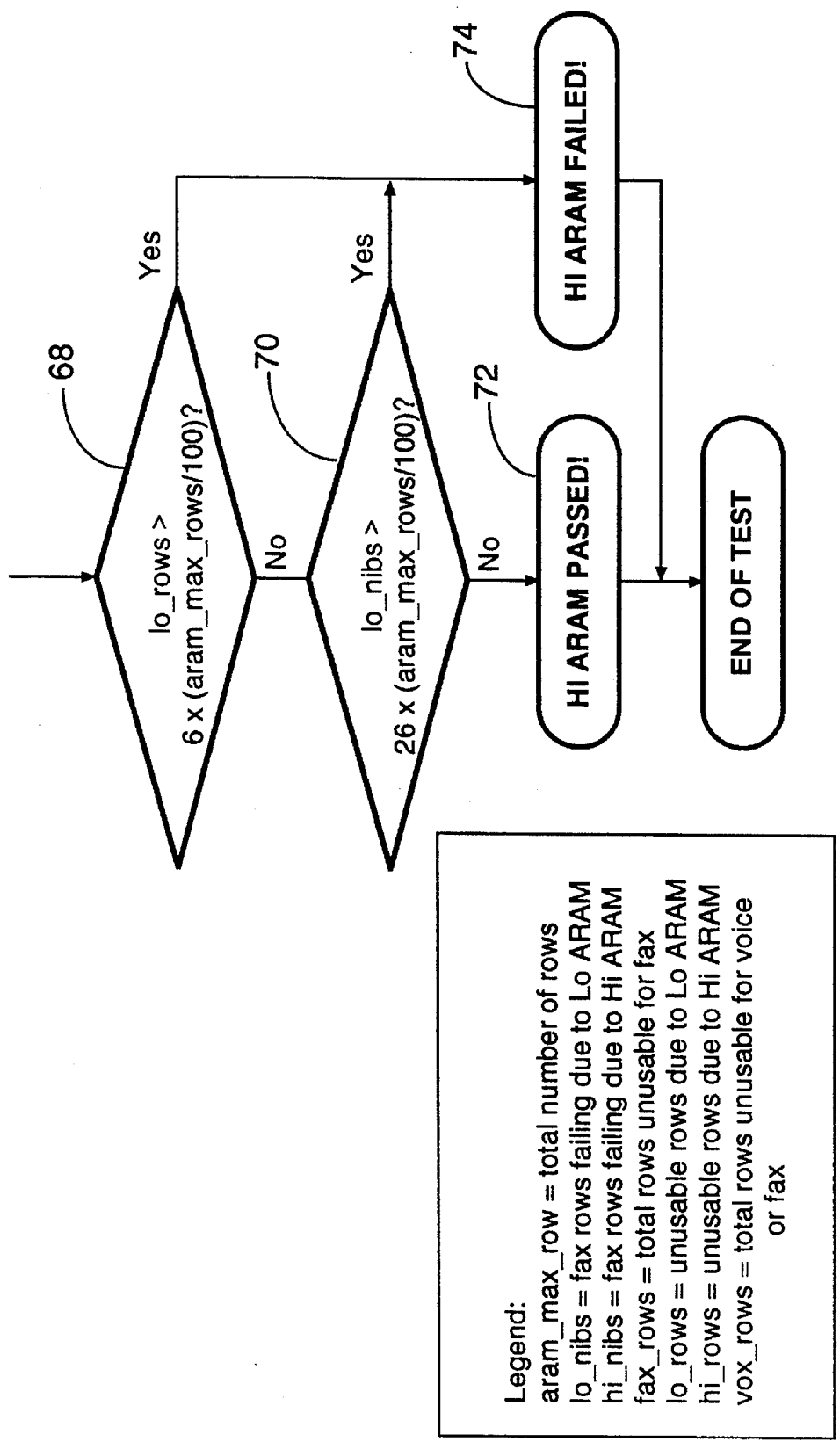
FIG. 21 illustrates a method of the present invention for evaluating the ARAM memory quality of each individual ARAM chip as well as the combined array of ARAM chips.

The procedure of step 18 is shown in greater detail in FIG. 21. If ARAM quality falls below the above standards, one or both ARAM's must be replaced. If, however, the ARAM quality falls within the above standards, the memory manager is now ready to begin the storage and retrieval of voice and fax messages.

In addition to the ARAM_DIRECTORY table, there are additional tables used by the memory manager during the creation of a new message and the play back or deletion of an existing message.

One of the additional tables is labeled the NEXT_ROW table. This table is filled each time a new message is created or an existing message is opened for playback. During message creation, a pointer is set to the first free row found in the ARAM_DIRECTORY table. The ARAM_DIRECTORY table is then scanned for additional free rows starting from the first free row and ending with the last row as defined by the variable ARAM_MAX_ROWS. The row offset required to set to each successive free row is stored in the next row table. Offsets of less than 128 are stored in a single 8-bit byte. Offsets equal to or greater than 128 require two 8-bit bytes to fully define them. These offsets are stored as two 8-bit bytes, with the first byte containing the hi order 7-bits of the offset (the 8th bit being used to flag a second byte offset), and the second byte containing the lo order 8-bits of the offset.

After writing voice or fax data into a particular row within the ARAM memory array, the NEXT_ROW table is used to compute the offset value required to step between the current row of the ARAM memory array and the next free row within the array where the writing will continue.

Figures 1, 22:
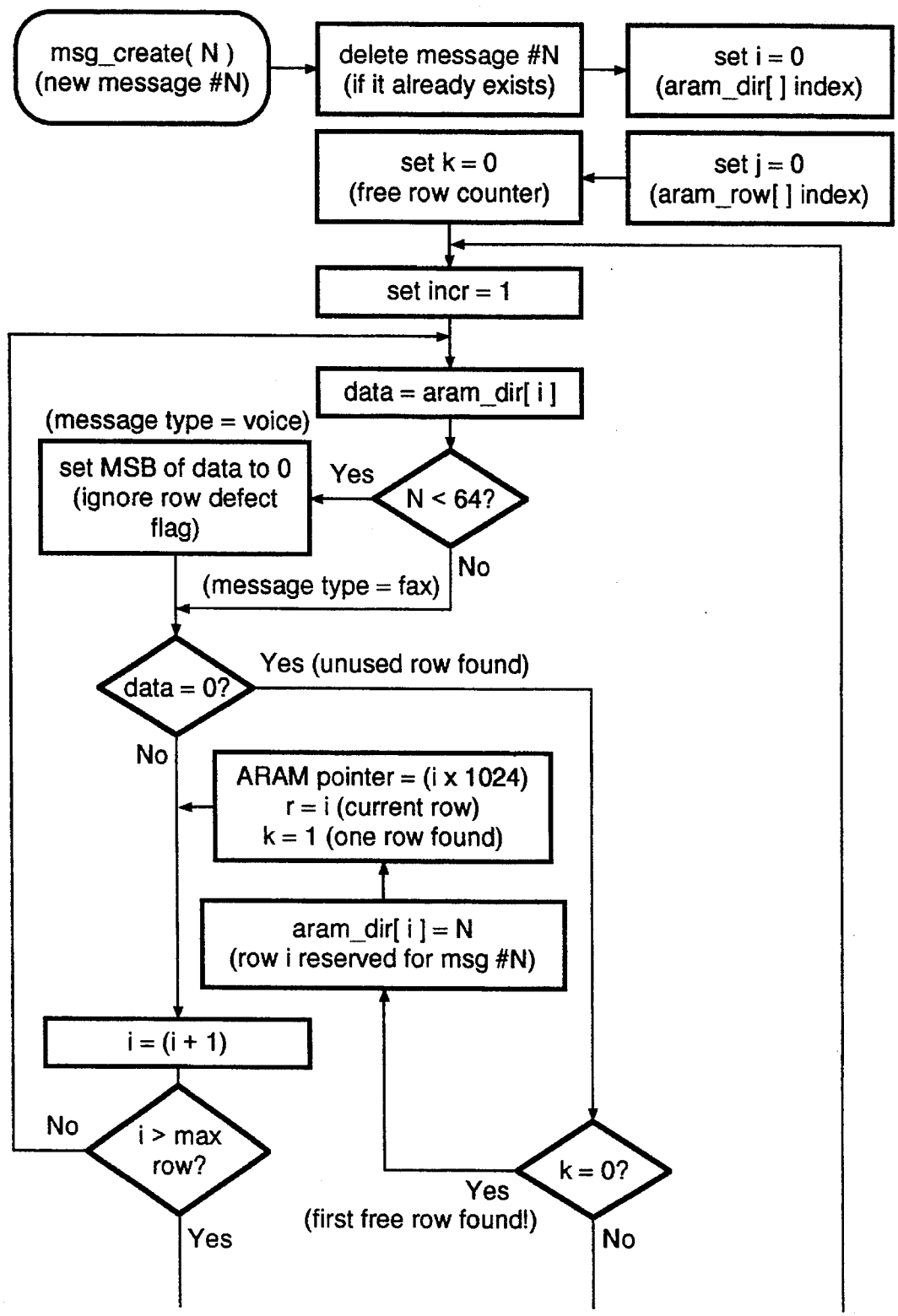
FIG. 22 illustrates a method of the present invention for creating a new fax or voice message whereby data from the message is written into the ARAM memory array.
Figures 2, 22:
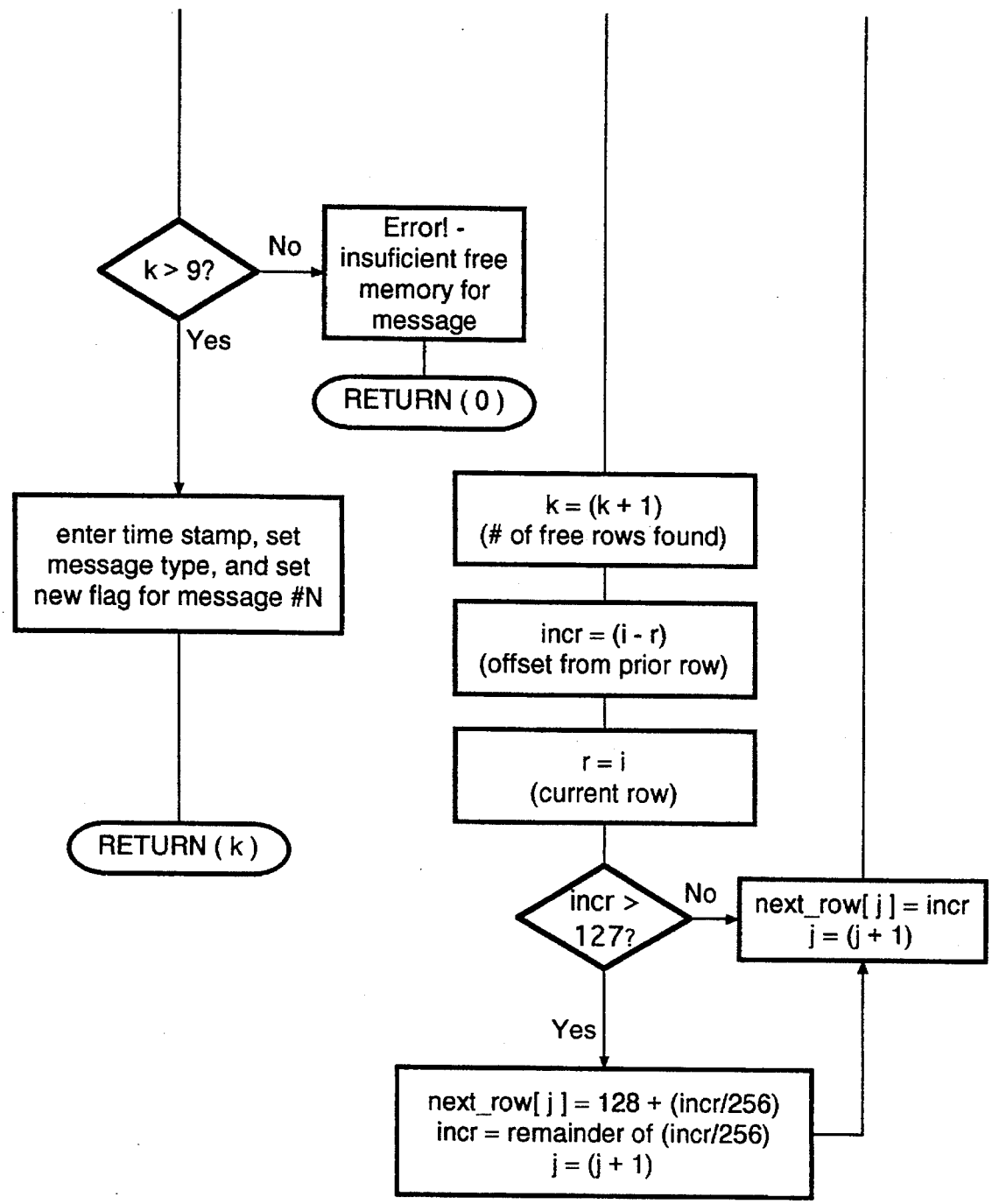

FIG. 22 illustrates the method of the present invention for creating a new fax or voice message. During this procedure, data within the ARAM_DIRECTORY table is used to build the appropriate NEXT_ROW table. If a voice message is to be stored, the memory manager searches the ARAM_DIRECTORY table for available perfect and imperfect rows, and enters into the NEXT_ROW table the corresponding offset values required to step between successive available rows. If a fax message is to be stored, however, the memory manager searches the ARAM_DIRECTORY table for available perfect rows only. The memory manager then enters the offset values required to step between successive, available perfect rows into the NEXT_ROW table.

Note that one difference between voice and fax message storage is that, when searching for available rows for storing fax messages, only perfect rows may be used, and these rows are found by looking for 0's in all 8-bit positions of each row within the ARAM_DIRECTORY table. Voice messages, however, can use perfect or partially defective (imperfect) rows, meaning that the 8th bit may be ignored and, thus, only the lower 7-bits need to be examined during the free row search.

FIG. 20A shows an example of an initialized NEXT_ROW table. The number of rows in the NEXT_ROW table is preferably equal to the ARAM_MAX_ROWS value. FIG. 20B shows the bit definitions for each of the 8 bits within each row of the NEXT_ROW table. As can be seen in FIG. 20B, bit-7 is used to indicate offset values equal to or greater than 128. Bits 6–0 are used to indicate the actual offset value between successive rows within the ARAM memory array.

FIG. 20C shows a sample NEXT_ROW table. The following example will help illustrate the technique for building a NEXT_ROW table such as the table shown in FIG. 20C.

Let us assume that a voice message is to be recorded. The first step in creating the new voice message is for the memory manager to scan through each row of the ARAM_DIRECTORY table, looking for the value 80 hexadecimal (which indicates an unused voice only row) or the value 00 hex (which indicates an unused perfect row). Note that if a fax message were to be recorded, then the memory manager would search only for the value 00 hex. Also note that in an alternate embodiment of the present invention, the memory management technique may be modified so that only perfect rows are used to store fax data (i.e. fault non-tolerant data), and only imperfect rows are used to store voice data (i.e. fault tolerant data), until all imperfect rows within the ARAM memory array are used. After that, perfect rows may then be used to store voice data.

Returning to our example, when the memory manager comes upon the first row having a value of either 80 hex or 00 hex, the address of that row (which corresponds to the address of the row within the ARAM memory array) is stored in an address pointer located within SRAM 114 (FIGS. 1A–1F). Starting from the row address contained within the pointer, the memory manager then scans the ARAM_DIRECTORY table, row-by-row (by increasing row addresses) until the memory manager encounters a next row which has a value of 80 or 00 hex. This newly encountered row corresponds to the next successive row within the memory array into which the voice data will be written. At this point, the memory manager determines the offset value required to step from the first available row (located at the address within the pointer) to this next successive, available row, and enters this offset value into the first row location of the NEXT_ROW table (row 0). As shown in the example of FIG. 20C, the first row offset value is a 01 hex. Thus, for example, if the first available row address (as indicated by the pointer) is row 20 of the ARAM memory array, the next available row for storing the voice message is row 21.

Next, starting from row 21, the memory manager searches the ARAM_DIRECTORY table for the next available row for storing the voice message, which in the example of FIG. 20C happens to be row 22, meaning that a 01 hexadecimal is placed into the second row (row 1) of the NEXT_ROW table.

The process of scanning the ARAM directory and recording the offset values required to step between successive available rows within the ARAM memory array continues until the last row within the ARAM_DIRECTORY table has been checked, and all the offset values have been entered into the NEXT_ROW table. This procedure takes place each time a new message is created, and is completed before the message is received by the computer system. Note that an offset value of 0 indicates that the end of the memory has been reached.

Once the entire NEXT_ROW table has been built, the system is ready to receive the voice message and store it into the ARAM memory array. The offset data within the NEXT_ROW table is used to continually increment the pointer to the next successive available row within the ARAM_DIRECTORY for storing the voice message. Thus, as shown in FIG. 20C, assuming that the initial address within the pointer is row 20, the first chunk of voice data will be written into row 20 of the ARAM memory array until that row is filled. Then the memory manager will increment the pointer by the value stored within row 0 of the NEXT_ROW table (which in this case is 01 hex), causing the pointer to now point to row 21 of the ARAM memory array. Using this technique, the next 6 rows which will be written to, according to the data within the table of FIG. 20C, will be rows 22, 25, 26, 27, 1067, and 1068, respectively.

Figures 1, 23:
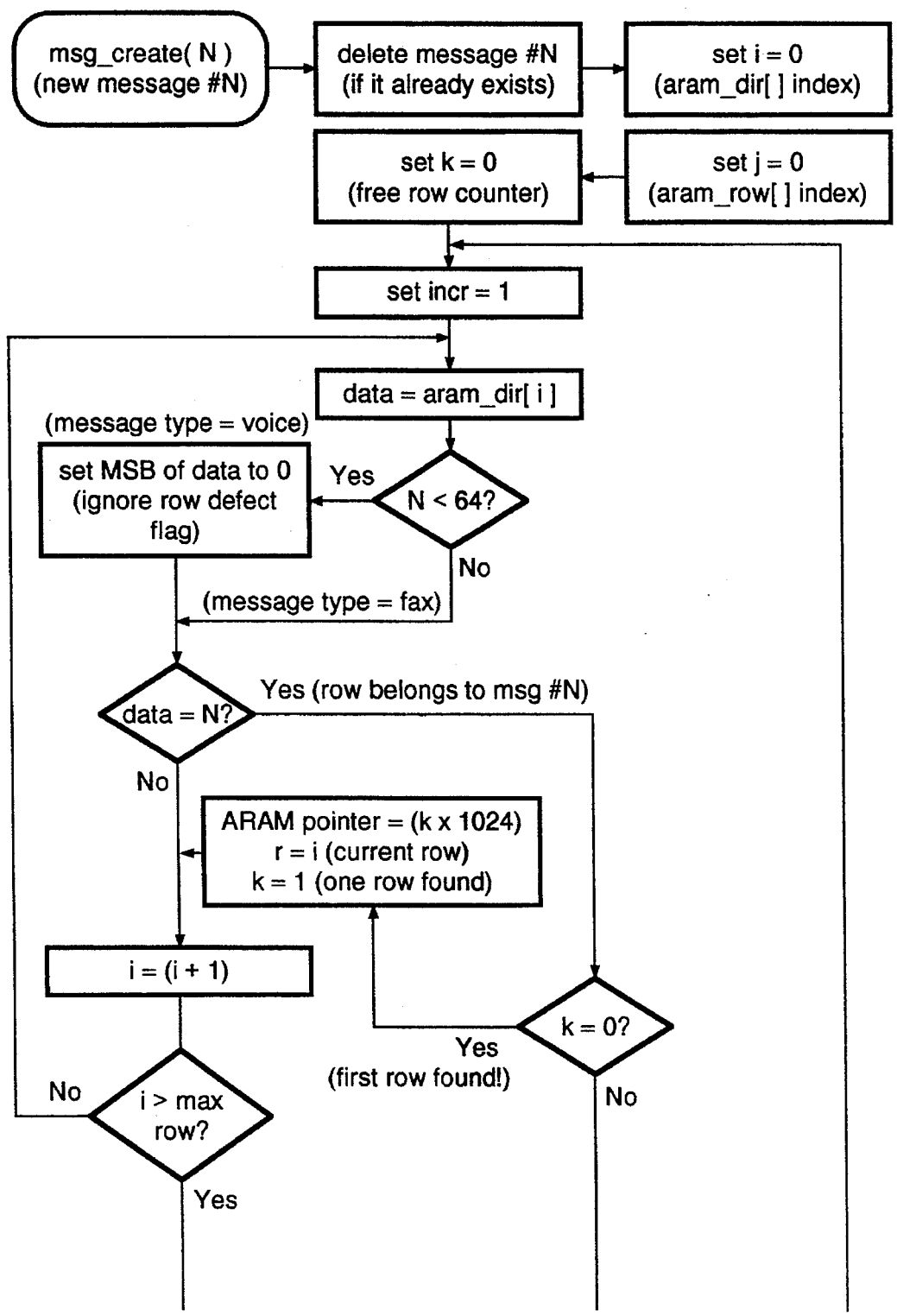
FIG. 23 illustrates a method of the present invention for opening a fax or voice message for play back, wherein data relating to that particular message is retrieved from the ARAM memory array.
Figures 2, 23:
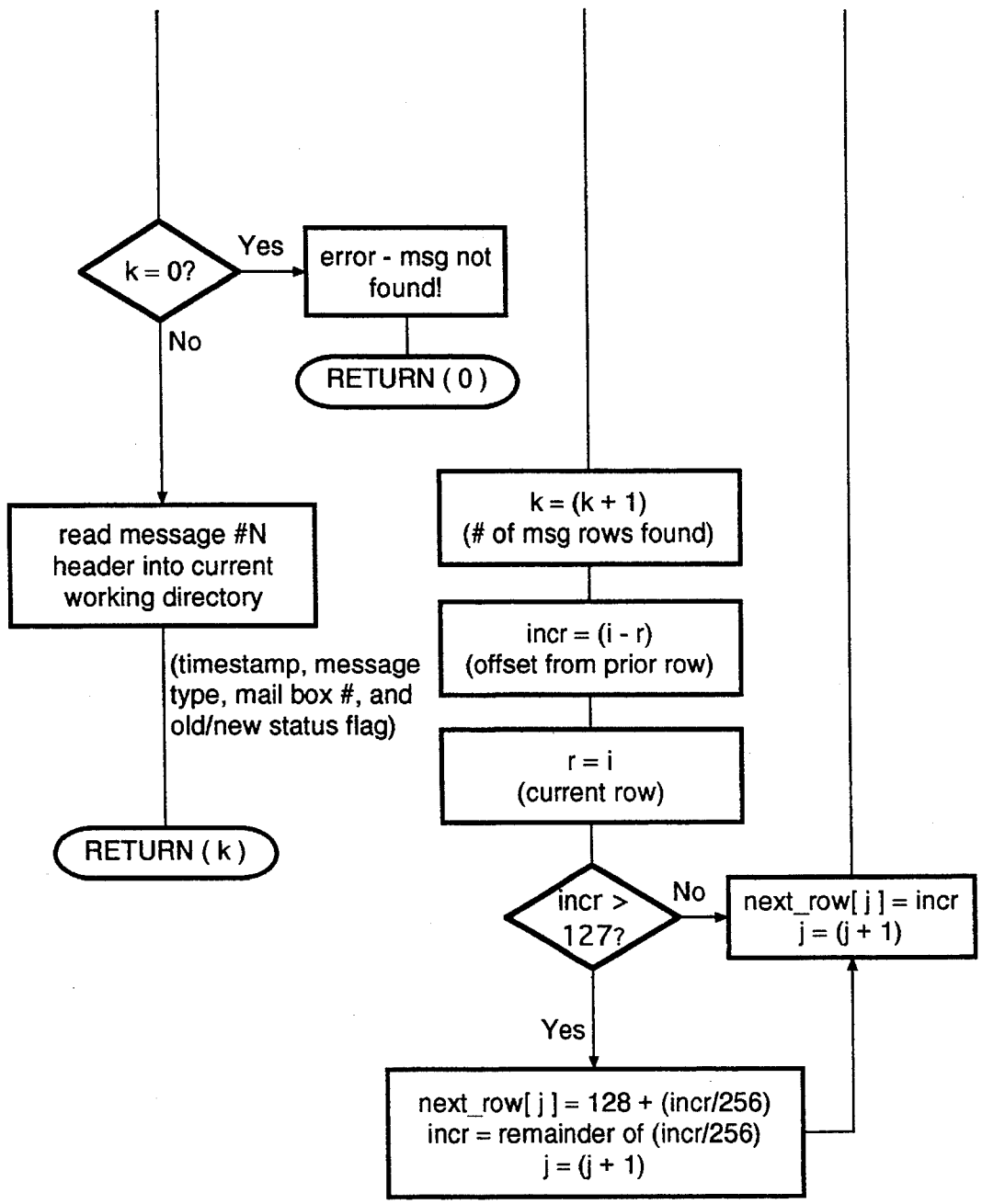

FIG. 23 illustrates a method for opening a message stored within the ARAM memory array for playback. Opening a message for playback uses the NEXT_ROW table in a similar fashion as that for creating a message, but instead of searching for free rows, a search is made for rows belonging to the message number being opened. By design, the message number is found in the same ARAM_DIRECTORY table used to find the available rows for message storage. Thus, when opening a message for playback, a search is made within the ARAM_DIRECTORY table for the first row which contains data belonging to the message. Recall that the message number and type (voice or fax) is contained within bits 7–0 of each row of the ARAM_DIRECTORY table. The search for rows belonging to the message continues from the first row of the ARAM_DIRECTORY table to the last row (as defined by the ARAM_MAX_ROWS value). The NEXT_ROW table is filled with the corresponding offset values as each row belonging to the message is found. Note that the NEXT_ROW table is created each time a message is opened for playback.

During the actual playback, the NEXT_ROW table is used to compute the offset required to step down to the next row of the message (within the ARAM memory array) after each current row of data has been used. An offset value of 0 indicates that the end of the message has been reached.

The memory management technique of using data from the NEXT_ROW table to update a pointer address is advantageous over conventional techniques of using multiple pointers to locate desired memory locations for several reasons. One reason is that, according to conventional techniques, to use pointers for address values up to 8192, two bytes must be used for each pointer, thereby taking up almost twice as much memory than is required by the present technique. In contrast, the present technique most often will use one byte to indicate the offset value between successive memory locations in the ARAM memory array. Thus, the technique of the present invention would typically use half as much memory as conventional techniques using multiple pointers. Additionally, the technique of the present invention is faster since only one byte needs to be read rather than two in order to determine each next memory location.

Figure 24:
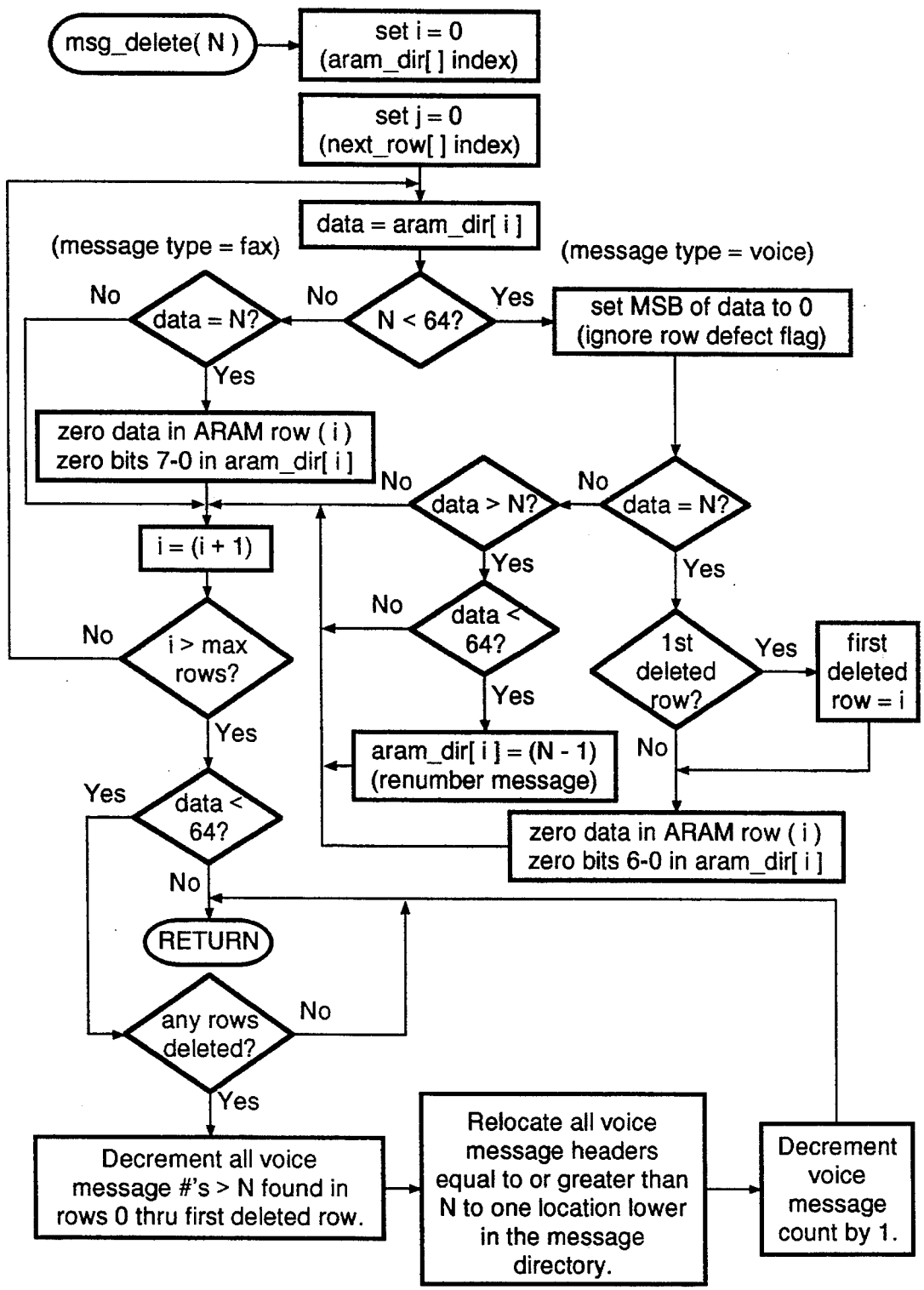
FIG. 24 illustrates a method of the present invention for deleting a voice or fax message stored within the ARAM memory array.

FIG. 24 illustrates a method for deleting a message stored within the ARAM memory array. Generally, the procedure of FIG. 24 describes the process whereby the memory manager searches the ARAM_DIRECTORY table for a particular message number to be deleted. When a row is found within the ARAM_DIRECTORY table which contains the message number to be deleted, bits 6–0 of that row are reset to 0, and the data within the corresponding row of the ARAM memory array is erased. The process continues from the first row within the ARAM_DIRECTORY table to the last row as defined by the value ARAM_MAX_ROWS.

FAX DATA STORAGE

Fax message data is stored in ARAM memory array with a header at the beginning of each fax file which provides the computer system with critical information about each fax. Although only perfect ARAM rows are used for fax data, there is a remote chance that some rows may have marginal bits that were not found during initial testing and fault mapping. Because of this, the memory management technique of the present invention includes a method for creating a novel facsimile header format which makes it is less likely for the header information to be corrupted due to faulty memory cells within the ARAM memory array. The actual format used is described below. Note that because of the way the fax header is used, if it is found to be corrupted, the fax is lost. No attempt is made to read a fax with a corrupted header.

A typical fax header format contains the following information about each fax:

1) The resolution (standard for fine)
2) The total number of pages
3) An array holding pointers to the start of each fax page.

To make this header fault tolerant, the above three key information items are repeated three times. Thus, when a fax is opened, the three sets header data are read and compared to each other. If any two sets of data match, the data is assumed to be reliable, and one of the matched sets is used. In most cases all three sets of data will match, but if no matching data is found, the header is assumed to be corrupted and fax processing will terminate with an error.

Table V illustrates an example of the header format of the present invention, and illustrates where each set of header data is stored in the ARAM memory array. Note that the first byte of the first page of fax data is then stored at an offset of 1540 from the beginning of the fax file.

TABLE V

| Byte | Data |
|---|---|
| 0 | Resolution; copy A stored in bit-0, copy B stored in bit-1, and copy B stored in bit-2 |
| 1 | Copy A of fax page count |
| 2 | Copy B of fax page count |
| 3 | Copy C of fax page count |
| 4–515 | Copy A of page pointer array (only 128 page pointers are stored) |
| 516–1027 | Copy B of page pointer array (only 128 page pointers are stored) |
| 1028–1539 | Copy C of page pointer array (only 128 page pointers are stored) |

Although several preferred embodiments of this invention have been described in detail herein with reference to the accompanying drawings, it is to be understood that the invention is not limited to these precise embodiments, and that various changes and modifications may be effected therein by one skilled in the art without departing from the scope or spirit of the invention as defined in the appended claims.

It is claimed:

1. In a computer system comprising at least one bus, a plurality of memory arrays for building a plurality of memory mapping tables, a plurality of defective VLSI memory array chips each having a plurality of memory cell locations including a portion of defective memory cell locations, said plurality of memory cell locations being organized into a first plurality of N rows, wherein each row includes a plurality of m-bit units for storing data, each of said defective memory chips further being connected to said at least one bus, wherein said plurality of memory chips are partitionable into a high bank of chips and a low bank of chips, a method for managing the storage of fault non-tolerant and fault tolerant data within said plurality of defective memory chips comprising the steps of:

(a) mapping out and testing each of the plurality of chips for defective memory locations within each chip; and (b) building a first memory mapping table for indicating whether each row in each of said plurality of memory chips is suitable for storage of fault non-tolerant data, fault tolerant data, or neither fault non-tolerant nor fault tolerant data, wherein said first table comprises a second plurality of rows organized such that each row in said first table corresponds to a particular and different row within said plurality of memory chips.

2. The method of claim 1 further comprising the step of (c) building a second memory mapping table based upon data contained within said first table for indicating row offset values required to step between successive, available memory row locations within said plurality of memory chips which are suitable for storage of fault tolerant data, if fault tolerant data is to be stored, or which are suitable for storage of fault non-tolerant data, if fault non-tolerant data is to be stored.

3. The method of claim 2 wherein said first table building step includes the step of building said first table such that the number of said second plurality of rows equals the number of said first plurality of rows.

4. The method of claim 1 wherein said mapping step (a) comprises the steps of:

determining a data width m of the plurality of units;

determining a memory capacity of the high bank of said plurality of defective memory chips, if any;

determining a memory capacity of the low bank of said plurality of defective memory chips;

determining a total memory capacity of said plurality of memory chips; and determining a maximum number of rows N contained in each of said plurality of memory chips.

5. The method of claim 1 wherein said mapping step (a) includes the steps of:

identifying defective memory cell locations, if any, within each of the first plurality of rows of each of said plurality of memory chips; and determining, on the basis of said identifying step, whether each of said first plurality of rows is suitable for storage of fault non-tolerant data, fault tolerant data, or neither fault non-tolerant nor fault tolerant data.

6. The method of claim 5 wherein said mapping step (a) further includes the step of evaluating a memory quality of said plurality of memory chips, wherein said evaluating step includes the steps of:

(i) determining that at least a first predefined percentage of memory rows within each of said plurality of memory chips are available for storage of fault tolerant data;

(ii) determining that at least a second predefined percentage of memory rows within each of said plurality of memory chips are available for storage of fault non-tolerant data;

(iii) determining that at least a third predefined percentage of all combined memory rows within said plurality of memory chips are available for storage of fault non-tolerant data; and (iv) causing the memory quality evaluation to fail if at least one of steps (i), (ii), and (iii) is not satisfied.

7. The method of claim 5 wherein said first memory map building step comprises the step of marking each row in said second plurality of rows, on the basis of said determining step (ii), to indicate whether said corresponding row in said plurality of memory chips is suitable for storage of fault non-tolerant data, fault tolerant data, or neither fault non-tolerant nor fault tolerant data.

8. The method of claim 2 further comprising the steps of:

(i) locating, based upon data contained within said first table, an initial suitable memory row location within said plurality of memory chips for storing said fault tolerant data or fault non-tolerant data, and storing an address of said initial memory row location into a pointer register;

(ii) writing data to a current suitable memory row which is located at the address contained in said pointer register;

(iii) incrementing the address contained in the pointer register by an appropriate row offset value contained in said second memory mapping table in order to step from the current suitable memory row to a successive suitable memory row into which data is to be written; and (iv) repeating steps (ii) and (iii) until all desired data has been written into said suitable memory row locations within said plurality of memory chips.

9. The method of claim 1 wherein steps (a) and (b) take place only upon a power on reset signal being asserted by the computer system.

10. The method of claim 2 wherein step (c) takes place each time data is to be written to said plurality of memory chips.

11. The method of claim 2 wherein said second table building step (c) includes the step of determining whether fault non-tolerant data or fault tolerant data is to be written into said plurality of memory chips.

12. The method of claim 2 wherein said fault tolerant data includes digitized voice data, and said fault non-tolerant data includes facsimile data.

13. The method of claim 12 wherein said facsimile data includes data compressed according to a CCITT format.

14. In a computer system comprising at least one bus, a plurality of memory arrays for building a plurality of memory mapping tables, a plurality of defective VLSI memory array chips each having a plurality of memory cell locations including a portion of defective memory cell locations, each of said defective memory chips being connected to said at least one bus, wherein each of said plurality of memory cell locations are organized into a first plurality of rows, said system further comprising a first memory mapping table for indicating memory locations within said plurality of memory chips which contain data that is desired to be retrieved, wherein said first table comprises a second plurality of rows organized such that each row in said first table corresponds to a particular and different row within said plurality of memory chips, a method for managing the retrieval of fault non-tolerant and fault tolerant data within said plurality of defective memory chips comprising the steps of:

(a) building a second memory mapping table based upon data contained within the first table for indicating appropriate row offset values required to step between successive memory row locations within said plurality of memory chips which contain the data that is desired to be retrieved; and (b) using the data within said second table to retrieve the desired fault non-tolerant or fault tolerant data contained within the plurality of defective memory chips.

15. The method of claim 14 wherein said using step (b) comprises the steps of:

(i) locating, based upon data contained within said first table, an initial desired memory row location for retrieving said fault tolerant or fault non-tolerant data, and storing an address of said initial memory row location into a pointer register;

(ii) retrieving data from a current desired memory row which is located at the address contained in said pointer register;

(iii) incrementing the address contained in the pointer register by an appropriate row offset value contained in said second memory mapping table in order to step from the current desired memory row to a successive desired memory row from which data is to be retrieved; and (iv) repeating steps (ii) and (iii) until all desired data has been retrieved from said desired memory row locations.

16. The method of claim 14 wherein steps (a) and (b) take place each time data is to be retrieved from said plurality of memory chips.

17. The method of claim 14 wherein said fault tolerant data includes digitized voice data, and said fault non-tolerant data includes facsimile data.

18. The method of claim 17 wherein said facsimile data includes data compressed according to a CCITT format.

19. In a computer system comprising at least one bus, a plurality of defective VLSI memory array chips each having a plurality of memory cell locations including a portion of defective memory cell locations, said plurality of memory cell locations being organized into a plurality of N rows, each of said defective memory chips being connected to said at least one bus, a method for managing the storage of fault non-tolerant and fault tolerant data within said plurality of defective memory chips comprising the steps of:

(a) mapping out and testing each of the plurality of chips for defective memory locations within each chip;

(b) storing fault non-tolerant data in available memory row locations within said plurality of defective memory chips which are devoid of defective cells; and (c) storing fault tolerant data in available memory row locations within said plurality of defective memory chips which either are devoid of defective cells or which do not contain more than an acceptable percentage of defective cells in each row.

20. The method of claim 19 wherein said mapping step (a) includes the steps of:

identifying defective memory cell locations, if any, within each of the plurality of rows of each of said plurality of memory chips; and determining, on the basis of said identifying step, whether each of said plurality of rows is suitable for storage of fault non-tolerant data, fault tolerant data, or neither fault non-tolerant nor fault tolerant data.

21. The method of claim 19 wherein said mapping step (a) further includes the step of evaluating a memory quality of said plurality of memory chips, wherein said evaluating step includes the steps of:

(i) determining that at least a first predefined percentage of memory rows within each of said plurality of memory chips are available for storage of fault tolerant data;

(ii) determining that at least a second predefined percentage of memory rows within each of said plurality of memory chips are available for storage of fault non-tolerant data;

(iii) determining that at least a third predefined percentage of all combined memory rows within said plurality of memory chips are available for storage of fault non-tolerant data; and (iv) causing the memory quality evaluation to fail if at least one of steps (i), (ii), and (iii) is not satisfied.

22. In a computer system comprising at least one bus, a plurality of defective VLSI memory array chips each having defective memory cell locations, each of said defective memory chips being connected to said at least one bus, wherein each of said memory chips includes a plurality of memory cells collectively organized into a first plurality of rows, a method for managing the storage and retrieval of facsimile header data sets within said plurality of defective memory chips, wherein one facsimile header data set is used to process a corresponding facsimile document, said method comprising the steps of:

(a) duplicating said one facsimile header data set at least once to thereby form a plurality of substantially similar facsimile header data sets, including an original facsimile header data set and at least one duplicate facsimile header data set; and (b) storing each of said substantially similar facsimile header data sets into said plurality of memory chips to thereby increase a likelihood that at least one of said substantially similar stored facsimile header data sets will not be corrupted due to storage of said facsimile header data sets into defective memory cell locations within said plurality of memory chips.

23. The method of claim 22 further comprising the steps of:

retrieving each of said substantially similar facsimile header data sets from said plurality of memory chips;

comparing each of said substantially similar facsimile header data sets to one another in order to locate a match between at least two of said substantially similar facsimile header data sets;

if a match between at least two of said substantially similar facsimile header data sets has been located, using one of said matched facsimile header data sets for processing of said corresponding facsimile document; and if a match between at least two of said substantially similar facsimile header data sets has not been located, terminating the processing of said corresponding facsimile document.

24. The method of claim 22 wherein said voice data includes digitized voice data, and said facsimile data includes facsimile data.

25. The method of claim 24 wherein said facsimile data includes data compressed according to a CCITT format.

26. In a computer system comprising at least one bus, a plurality of defective VLSI memory array chips each having defective memory cell locations, each of said defective memory chips being connected to said at least one bus, wherein a plurality of substantially similar facsimile header data sets, including an original facsimile header data set and at least one duplicate facsimile header data set are stored within said plurality of memory chips, a method for using at least one of said substantially similar facsimile header data sets to process a corresponding set of facsimile data, said method comprising the steps of:

(a) retrieving each of said substantially similar facsimile header data sets from said plurality of memory chips;

(b) comparing each of said substantially similar facsimile header data sets to one another in order to locate a match between at least two of said substantially similar facsimile header data sets;

(c) if a match between at least two of said substantially similar facsimile header data sets has been located, using one of said matched facsimile header data sets for processing of said corresponding set of facsimile data; and (d) if a match between at least two of said substantially similar facsimile header data sets has not been located, terminating the processing of said corresponding set of facsimile data.

27. The method of claim 26 wherein said facsimile data includes data compressed according to a CCITT format.

* * * * *